United States Patent
Okamoto

(10) Patent No.: US 11,217,173 B2
(45) Date of Patent: Jan. 4, 2022

(54) DISPLAY CONTROLLER, DISPLAY SYSTEM, AND ELECTRONIC DEVICE

(71) Applicant: Semiconductor Energy Laboratory Co., Ltd., Kanagawa-ken (JP)

(72) Inventor: Yuki Okamoto, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/690,814

(22) Filed: Nov. 21, 2019

(65) Prior Publication Data

US 2020/0090593 A1 Mar. 19, 2020

Related U.S. Application Data

(63) Continuation of application No. 15/885,078, filed on Jan. 31, 2018, now Pat. No. 10,490,130.

(30) Foreign Application Priority Data

Feb. 10, 2017 (JP) .............................. JP2017-022685
Apr. 4, 2017 (JP) .............................. JP2017-074759

(51) Int. Cl.
*G09G 3/3258* (2016.01)
*G09G 3/3233* (2016.01)
(Continued)

(52) U.S. Cl.
CPC ......... *G09G 3/3258* (2013.01); *G02F 1/1368* (2013.01); *G02F 1/13439* (2013.01);
(Continued)

(58) Field of Classification Search
CPC .. G09G 3/3258; G09G 3/3225; G09G 3/2092; G09G 3/3233; G09G 3/3648;
(Continued)

(56) References Cited

U.S. PATENT DOCUMENTS 6,556,260 B1 4/2003 Itou et al.
6,714,268 B2 3/2004 Wang et al.
(Continued)

FOREIGN PATENT DOCUMENTS

JP 2001-066593 A 3/2001
JP 2002-196702 A 7/2002
(Continued)

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
(Continued)

*Primary Examiner* — Premal R Patel
(74) *Attorney, Agent, or Firm* — Husch Blackwell LLP

(57) ABSTRACT

A display system includes a host device, a display controller, and a display panel. The display panel includes a pixel array including a plurality of subpixels each including a light-emitting display element and a reflective display element. The host device sends image data DT0 to the display controller. The display controller has the following functions: color classification of the image data DT0; generation of attribute data based on the classification result; generation of image data DT1 from the image data DT0; generation of two kinds of image data DT2_e and DT2_r through image processing of the image data DT1 in accordance with the attribute data; generation of image data DT3_e from the image data DT2_e; and generation of image data DT3_r from the image data DT2_r. The image data DT3_e is displayed by the light-emitting display element, and the image data DT3_r is displayed by the reflective display element.

6 Claims, 44 Drawing Sheets

(51) Int. Cl.
| | |
|---|---|
| *G09G 3/36* | (2006.01) |
| *G09G 3/20* | (2006.01) |
| *H01L 21/02* | (2006.01) |
| *G02F 1/1362* | (2006.01) |
| *G02F 1/1335* | (2006.01) |
| *G02F 1/1343* | (2006.01) |
| *G02F 1/1368* | (2006.01) |
| *H01L 27/32* | (2006.01) |
| *G06F 3/041* | (2006.01) |
| *G09G 3/3225* | (2016.01) |
| *H01L 29/786* | (2006.01) |
| *H01L 27/12* | (2006.01) |

(52) U.S. Cl.
CPC .. *G02F 1/133553* (2013.01); *G02F 1/136286* (2013.01); *G06F 3/0412* (2013.01); *G09G 3/2003* (2013.01); *G09G 3/2092* (2013.01); *G09G 3/3225* (2013.01); *G09G 3/3233* (2013.01); *G09G 3/3648* (2013.01); *H01L 21/02164* (2013.01); *H01L 21/02266* (2013.01); *H01L 27/3232* (2013.01); *G09G 2300/023* (2013.01); *G09G 2300/046* (2013.01); *G09G 2300/0426* (2013.01); *G09G 2300/0452* (2013.01); *G09G 2310/08* (2013.01); *G09G 2320/0673* (2013.01); *G09G 2330/021* (2013.01); *H01L 27/12* (2013.01); *H01L 27/1225* (2013.01); *H01L 29/7869* (2013.01); *H01L 29/78648* (2013.01); *H01L 29/78696* (2013.01)

(58) Field of Classification Search
CPC .......... G09G 3/2003; G09G 2300/046; G09G 2330/021; G09G 2300/023; G09G 2300/0426; G09G 2320/0673; G09G 2300/0452; G09G 2310/08; G06F 3/0412; G06F 3/046; G06F 3/0446; G06F 3/0421; H01L 21/02266; H01L 21/02164; H01L 27/3232; H01L 27/12; H01L 29/7869; H01L 29/78648; H01L 27/1225; H01L 29/78696; G02F 1/136286; G02F 1/133553; G02F 1/13439; G02F 1/1368

See application file for complete search history.

(56) References Cited

U.S. PATENT DOCUMENTS

| | | | |
|---|---|---|---|
| 6,912,021 B2 | 6/2005 | Kimura | |
| 7,038,641 B2 | 5/2006 | Hirota et al. | |
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2 | 7/2007 | Fujii et al. | |
| 7,304,696 B2 | 12/2007 | Yamagishi | |
| 7,385,654 B2 | 6/2008 | Mitsui et al. | |
| 7,688,290 B2 | 3/2010 | Yamazaki et al. | |
| 8,040,456 B2 | 10/2011 | Yamazaki et al. | |
| 8,159,449 B2 | 4/2012 | Kimura et al. | |
| 8,547,503 B2 | 10/2013 | Kubota et al. | |
| 8,724,407 B2 | 5/2014 | Kobayashi et al. | |
| 8,743,028 B2 | 6/2014 | Yamazaki et al. | |
| 8,836,906 B2 | 9/2014 | Kurokawa et al. | |
| 8,854,286 B2 | 10/2014 | Yamazaki et al. | |
| 8,890,781 B2 | 11/2014 | Yamazaki et al. | |
| 8,958,252 B2 | 2/2015 | Kobayashi et al. | |
| 9,006,755 B2 | 4/2015 | Seo et al. | |
| 9,165,502 B2 | 10/2015 | Yamazaki et al. | |
| 9,189,997 B2 | 11/2015 | Kimura et al. | |
| 9,368,082 B2 | 6/2016 | Yamazaki et al. | |
| 2003/0102801 A1 | 6/2003 | Senbonmatsu | |
| 2003/0201960 A1 | 10/2003 | Fujieda | |
| 2005/0099426 A1 | 5/2005 | Primerano et al. | |
| 2006/0072047 A1 | 4/2006 | Sekiguchi | |
| 2007/0075935 A1 | 4/2007 | Mesmer et al. | |
| 2008/0180618 A1 | 7/2008 | Fujieda | |
| 2009/0167673 A1 | 7/2009 | Kerofsky | |
| 2010/0118220 A1 | 5/2010 | Jang et al. | |
| 2010/0171905 A1 | 7/2010 | Huang et al. | |
| 2011/0157216 A1* | 6/2011 | Yamazaki | G09G 3/3648 345/596 |
| 2011/0221723 A1 | 9/2011 | Kurokawa et al. | |
| 2011/0255046 A1 | 10/2011 | Kurokawa et al. | |
| 2012/0208637 A1 | 8/2012 | Hirakata | |
| 2012/0274679 A1 | 11/2012 | Tamaki | |
| 2013/0075722 A1 | 3/2013 | Yamazaki et al. | |
| 2014/0146033 A1 | 5/2014 | Koyama et al. | |
| 2014/0247650 A1 | 9/2014 | Kobayashi et al. | |
| 2015/0179139 A1 | 6/2015 | Watanabe et al. | |
| 2015/0317014 A1 | 11/2015 | Miyake et al. | |
| 2015/0364115 A1 | 12/2015 | Yaras | |
| 2016/0012783 A1 | 1/2016 | Kimura et al. | |
| 2016/0041428 A1 | 2/2016 | Hirakata et al. | |
| 2016/0041429 A1 | 2/2016 | Wang et al. | |
| 2016/0042696 A1 | 2/2016 | Hirakata et al. | |
| 2016/0042702 A1 | 2/2016 | Hirakata et al. | |
| 2016/0117967 A1 | 4/2016 | Buckley et al. | |
| 2017/0357641 A1 | 12/2017 | Okamoto | |
| 2018/0033382 A1 | 2/2018 | Tomizawa | |
| 2018/0061330 A1 | 3/2018 | Jeon | |

FOREIGN PATENT DOCUMENTS

| | | |
|---|---|---|
| JP | 2003-157026 A | 5/2003 |
| JP | 2004-296162 A | 10/2004 |
| JP | 2007-232882 A | 9/2007 |
| JP | 2012-256405 A | 12/2012 |
| JP | 2013-221965 A | 10/2013 |
| JP | 2015-158640 A | 9/2015 |
| WO | WO-2004/053819 | 6/2004 |
| WO | WO-2007/041150 | 4/2007 |
| WO | WO 2012/128189 A1 | 9/2012 |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

Minoura.K et al., "P-149: Super Reflective Color LCDs Being Able to Display Moving Images without Polarizers", SID Digest '06 : SID International Symposium Digest of Technical Papers, Jun. 6, 2006, vol. 37, No. 1, pp. 769-772.

Shieh.H, "Transflective display by Hybrid OLED and LCD", LEOS 2005 (IEEE Lasers and Electro-Optics Society Annual Meeting) , Oct. 22, 2005, pp. 650-651, IEEE.

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

DISPLAY CONTROLLER, DISPLAY SYSTEM, AND ELECTRONIC DEVICE

This application is a continuation of copending U.S. application Ser. No. 15/885,078, filed on Jan. 31, 2018 which is incorporated herein by reference.

BACKGROUND OF THE INVENTION

1. Field of the Invention

One embodiment of the present invention belongs to the technical field of a display device, and relates to a pixel array, a driver circuit, and a control circuit of a display device, and an operation method of a display device, for example. Note that the technical field shown here is an example, and a technical field to which one embodiment of the present invention can be applied is not limited to the above.

2. Description of the Related Art

Portable electronic devices such as a smartphone, a smartwatch, a tablet terminal, an e-book reader, and a laptop personal computer (PC) are widely used. Since portable electronic devices are used in various environments, display devices mounted thereon need to perform display suitable for a usage environment and consume less power. As a display device meeting such needs, a hybrid (composite) display device in which a liquid crystal element and a light-emitting element are provided in one subpixel has been disclosed (for example, see Patent Documents 1 to 3).

A transistor including a metal oxide in a channel formation region (hereinafter, such a transistor may be referred to as a metal oxide semiconductor transistor or an OS transistor) is known. For example, Non-Patent Documents 1 and 2 each disclose a hybrid display device in which an OS transistor is provided in a subpixel.

REFERENCES

Patent Documents

[Patent Document 1] Japanese Published Patent Application No. 2003-157026
[Patent Document 2] PCT International Publication No. WO2004/053819
[Patent Document 3] PCT International Publication No. WO2007/041150

Non-Patent Documents

[Non-Patent Document 1] K. Kusunoki et al., "Transmissive OLED and Reflective LC Hybrid (TR-Hybrid) Display", SID Symposium Digest of Technical Papers, 2016, vol. 47, pp. 57-60
[Non-Patent Document 2] T. Sakuishi et al., "Transmissive OLED and Reflective LC Hybrid (TR-Hybrid) Display with High Visibility and Low Power Consumption", SID Symposium Digest of Technical Papers, 2016, vol. 47, pp. 735-738

SUMMARY OF THE INVENTION

Objects of one embodiment of the present invention are to improve visibility, to reduce power consumption, to reduce the load of image data transmission, and to reduce malfunction.

Note that the description of a plurality of objects does not preclude the existence of each object. One embodiment of the present invention does not necessarily achieve all the objects listed above. Objects other than those listed above are apparent from the description of the specification, drawings, and claims (hereinafter collectively referred to as "this specification and the like"), and such objects could be an object of one embodiment of the present invention.

(1) One embodiment of the present invention is a display system including a host device, a display controller, and a display panel. The host device sends first image data to the display controller. The first image data is image data for one pixel. The display controller classifies the color of the first image data, generates attribute data on the basis of the classification result, processes the first image data to generate second image data, processes the second image data in accordance with the attribute data to generate third image data, processes the third image data to generate fourth image data, and sends the fourth image data to the display panel.

(2) In the embodiment (1), processing of the second image data includes processing of multiplying a pixel value of the second image data by a gain value according to the attribute data.

(3) In the embodiment (1) or (2), processing of the third image data includes gamma correction.

(4) One embodiment of the present invention is a display system including a host device, a display controller, and a display panel. The display panel includes a pixel array. The pixel array includes a plurality of subpixels. The subpixel includes a light-emitting display element and a reflective display element. The host device sends first image data to the display controller. The first image data is image data for one pixel. The display controller classifies the color of the first image data, generates attribute data on the basis of the classification result, processes the first image data to generate second image data, processes the second image data in accordance with the attribute data to generate third image data and fourth image data, processes the third image data to generate fifth image data, processes the fourth image data to generate sixth image data, and sends the fifth image data and the sixth image data to the display panel. The fifth image data is displayed by the light-emitting display element. The sixth image data is displayed by the reflective display element.

(5) In the embodiment (4), processing of the second image data includes processing of multiplying a pixel value of the second image data by a gain value according to the attribute data.

(6) In the embodiment (4) or (5), processing of the third image data includes gamma correction, and processing of the fourth image data includes gamma correction.

(7) One embodiment of the present invention is a display system including a display controller and a display panel. The display panel includes a pixel array and a peripheral circuit. The pixel array includes a pixel. The pixel includes a plurality of first subpixels and a plurality of second subpixels. The first subpixel includes a reflective display element, and the second subpixel includes a light-emitting display element. The display controller processes first data sent from the outside to generate second data and third data, processes the second data to generate fourth data, processes the third data to generate fifth data, and sends the fourth data and the fifth data to the display panel. The peripheral circuit writes the fourth data and the fifth data to the pixel. The fourth data is displayed by the plurality of first subpixels, and the fifth data is displayed by the plurality of second subpixels. The display controller determines whether the first data is color data. When the first data is the color data, the display controller makes black display data as the second data, and makes a copy of the first data as the third data.

(8) In the embodiment (7), the display controller determines whether the first data is color data; when the first data is not the color data, the display controller converts the first data into grayscale data as the second data and makes black display data as the third data.

(9) In the embodiment (7), the display controller determines whether the first data is color data; when the first data is not the color data, the display controller makes a copy of the first data as the second data and makes black display data as the third data.

(10) In any one of the embodiments (4) to (9), the reflective display element is a reflective liquid crystal element.

(11) In any one of the embodiments (4) to (10), the light-emitting display element is an electroluminescent element.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of the semiconductor device. Moreover, a storage device, a display device, a light-emitting device, a lighting device, an electronic device, and the like themselves might be semiconductor devices, or might each include a semiconductor device.

In this specification and the like, a description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

Note that a transistor includes three terminals: a gate, a source, and a drain. The gate is a control terminal for controlling the on/off state of the transistor. Two terminals functioning as a source and a drain are input/output terminals of the transistor. Functions of the input/output terminals of the transistor depend on the type (n-channel type or p-channel type) and the levels of potentials applied to the terminals, and one of the two terminals serves as a source and the other serves as a drain. Therefore, the terms "source" and "drain" can be interchanged in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit configuration, a device structure, and the like. Furthermore, a terminal, a wiring, or the like can be referred to as a node. In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" provided in an integrated manner.

A voltage usually refers to a potential difference between a given potential and a reference potential (e.g., a ground potential (GND) or a source potential). Thus, a voltage can be referred to as a potential. Note that a potential has a relative value; therefore, GND does not necessarily mean 0 V.

In this specification and the like, the terms "film" and "layer" can be interchanged with each other depending on the case or circumstances. For example, the term "conductive layer" can be changed into the term "conductive film" in some cases. For example, the term "insulating film" can be changed into the term "insulating layer" in some cases.

In this specification and the like, ordinal numbers such as "first", "second", and "third" are used to show the order in some cases. Alternatively, ordinal numbers are used to avoid confusion among components in some cases, and do not limit the number or order of the components. For example, it is possible to replace the term "first" with the term "second" or "third" in describing one embodiment of the present invention.

One embodiment of the present invention enables an improvement in visibility, a reduction in power consumption, a reduction in the load of image data transmission, and a reduction in malfunction.

The description of a plurality of effects does not preclude the existence of other effects. One embodiment of the present invention does not necessarily achieve all the effects listed above. In one embodiment of the present invention, an object other than the above objects, an effect other than the above effects, and a novel feature will be apparent from the description of the specification and the drawings.

DETAILED DESCRIPTION OF THE INVENTION

Figure 1:
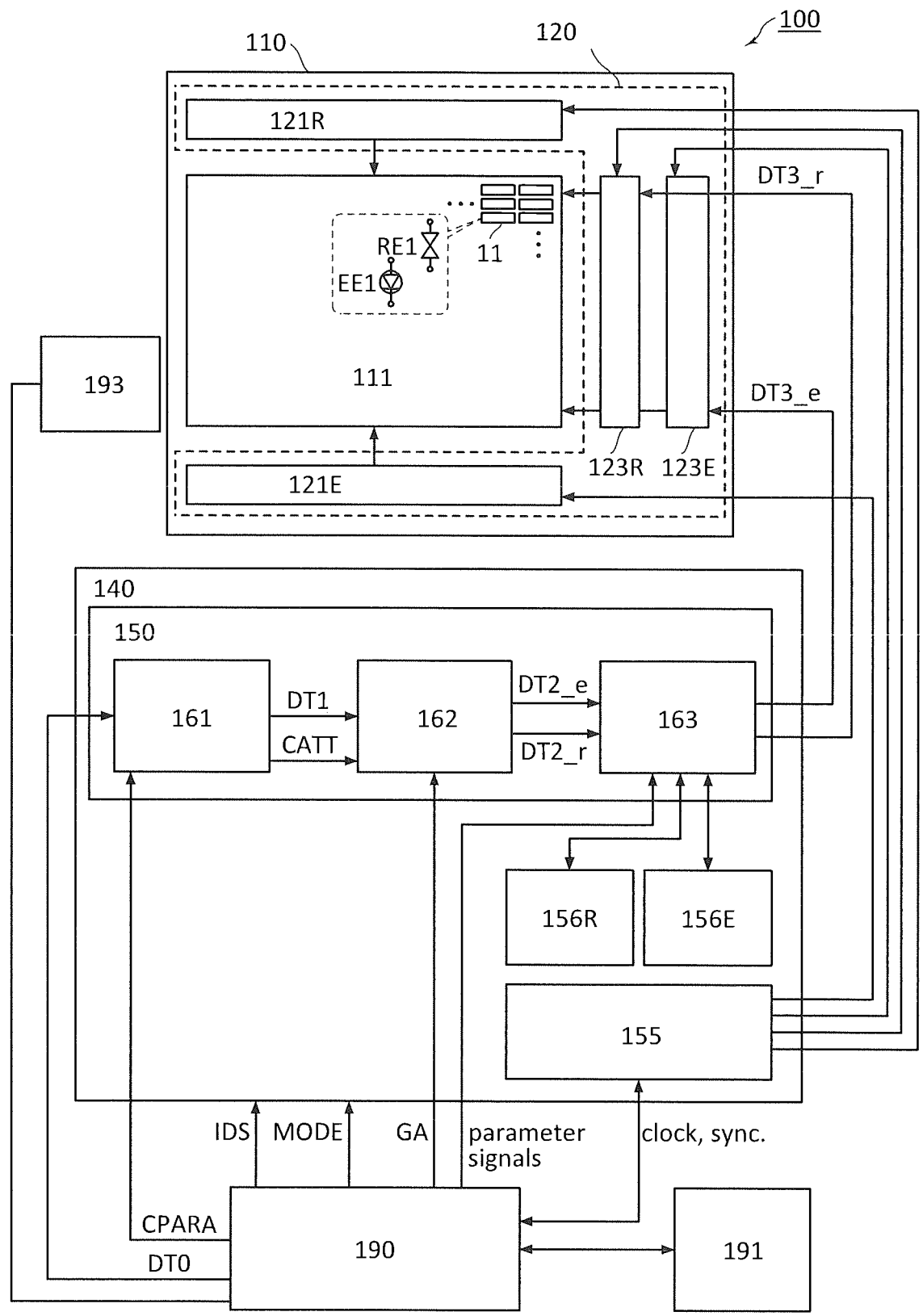
FIG. 1 is a functional block diagram illustrating a configuration example of an ER display system.

Embodiments of the present invention will be described below. Note that one embodiment of the present invention is not limited to the following description, and it will be easily understood by those skilled in the art that various changes and modifications can be made without departing from the spirit and scope of the present invention. Therefore, one embodiment of the present invention should not be construed as being limited to the description in the following embodiments.

Any of the embodiments described below can be combined as appropriate. In the case where some structural examples (including a manufacturing method example, an operating method example, and the like) are given in one embodiment, any of the structural examples can be combined with each other as appropriate or combined with one or more structural examples described in the other embodiments as appropriate.

The same components or components having similar functions, components formed using the same material, components formed at the same time, or the like in the drawings are denoted by the same reference numerals in some cases, and the description thereof is not repeated in some cases.

When a plurality of components denoted by the same reference numerals need to be distinguished from each other, "_1", "_2", "[n]", "[m, n]", or the like is sometimes added to the reference numerals.

In this specification, a power supply potential VDD may be abbreviated to "potential VDD", "VDD", or the like. The same applies to other components (e.g., a signal, a voltage, a circuit, an element, an electrode, and a wiring).

Embodiment 1

In this embodiment, a display system is described. In this specification and the like, a composite display panel including a light-emitting display panel and a reflective display panel is referred to as an ER panel or an ER display panel. A display system including an ER panel is referred to as an ER display system.

<<ER Display System 100>>

FIG. 1 is a functional block diagram illustrating a configuration example of an ER display system. An ER display system 100 in FIG. 1 includes an ER panel 110, a display controller 140, an application processor 190, a memory device 191, and a sensor portion 193.

The ER panel 110 includes a pixel array 111 and a peripheral circuit 120. Since the peripheral circuit 120 is mounted on the ER panel 110, the ER panel 110 can also be referred to as an ER display module.

The pixel array 111 includes a plurality of subpixels 11. The subpixel 11 includes a reflective display element and a light-emitting display element. Here, the reflective display element is a liquid crystal (LC) element RE1 and the light-emitting display element is an electroluminescent (EL) element EE1. The peripheral circuit 120 includes gate drivers 121E and 121R and source drivers 123E and 123R.

There is no particular limitation on the light-emitting display element and the reflective display element of the ER panel. For example, as the light-emitting display element, a light-emitting diode, a light-emitting transistor, or a light-emitting element with a quantum dot or a quantum rod can be used as well as the EL element. For example, as the reflective display element, a display element using electrophoresis, a display element using particle movement, or a display element using particle rotation can be used as well as the reflective LC element.

The LC element can employ any of a variety of modes. For example, an LC element employing a vertical alignment (VA) mode, a twisted nematic (TN) mode, an in-plane switching (IPS) mode, a VA-IPS mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a guest-host mode, or the like can be used.

Examples of the vertical alignment mode include a multi-domain vertical alignment (MVA) mode, a patterned vertical alignment (PVA) mode, and an advanced super view (ASV) mode.

To allow the LC element RE1 to display an image even in a dark environment, the ER display system 100 may include a lighting device for illuminating the pixel array 111. For example, the lighting device is an edge-light front light with a light source of an LED.

The display controller 140 is a controller for driving the ER panel 110. The display controller 140 includes an image processing portion 150, a timing controller 155, and memory devices 156E and 156R. The image processing portion 150 includes an attribute adding circuit 161, a filter circuit 162, and a data processing circuit 163. The image processing portion 150 further includes a register (not illustrated). The register stores, for example, a parameter used by the image processing portion 150 for image data processing.

The memory device 191 stores data such as image data necessary for processing by the application processor 190.

The image processing portion 150 processes received image data and generates image data to be displayed by the reflective display element and image data to be displayed by the light-emitting display element. For convenience, the image data for the reflective display element is referred to as LC image data, and the image data for the light-emitting display element is referred to as EL image data.

The image processing portion 150 transmits the LC image data to the source driver 123R and transmits the EL image data to the source driver 123E. The memory device 156E is used as a frame memory for the EL image data, and the memory device 156R is used as a frame memory for the LC image data.

The application processor 190 sends a variety of signals to the display controller 140. The signals to be sent include, for example, a clock signal, a synchronization signal, a command signal (e.g., IDS and MODE), and a parameter signal (e.g., CPARA and GA).

The signal MODE is a signal for setting a display mode of the ER panel 110. The ER panel 110 has three main display modes. In a first display mode, only the reflective display element displays an image. In a second display mode, only the light-emitting display element displays an image. In a third display mode, both the reflective display element and the light-emitting display element display an image. For convenience, the first, second, and third display modes are referred to as an RLCD mode, an ELD mode, and a hybrid mode, respectively.

The hybrid mode is of two types. One is a mode in which the reflective display element and the light-emitting display element display common image data. The other is a mode in which the reflective display element and the light-emitting display element display different image data. For convenience, the former hybrid mode is referred to as an HY mode, and the latter is referred to as a TXT (text) mode.

The signal IDS is a command signal for executing idling stop (IDS) driving with the ER panel 110. In the IDS driving, the display panel is driven at a lower refresh rate than in normal driving. The details of the IDS driving are described later.

For example, the application processor 190 generates a command signal and a parameter signal on the basis of data obtained by the sensor portion 193, an interrupt signal due to operation by a user, an attribute of image data (moving image/still image or color image/grayscale image), or the like.

For example, the sensor portion 193 has a function of detecting illuminance and a function of detecting RGB components of light.

The timing controller 155 generates a timing signal on the basis of a signal sent from the application processor 190. The timing signal is a signal for setting an operation timing of the peripheral circuit 120, and is, for example, a clock signal, a start pulse signal, or a pulse-width control signal.

A parameter used for image data processing by the image processing portion 150 is set by the parameter signal. The set parameter is stored in the register of the image processing portion 150. The image processing portion 150 processes image data DT0 with the use of the parameter, and generates image data $DT3\_e$ and $DT3\_r$. The image data $DT3\_e$ is the EL image data and sent to the source driver 123E. The image data $DT3\_r$ is the LC image data and sent to the source driver 123R.

Note that FIG. 1 is a functional block diagram, and the configuration of the display controller 140 is not limited to that in FIG. 1. For example, the processing by the image processing portion 150 may be executed by one processing circuit (e.g., an FPGA). Alternatively, processing by the filter circuit 162 and the data processing circuit 163 may be executed by one processing circuit (e.g., an FPGA).

<<ER Panel 110>>

The ER panel 110 is described with reference to FIGS. 2A and 2B and FIGS. 3A to 3C.

<Pixel Array 111 and Subpixel 11>

Figure 2A:
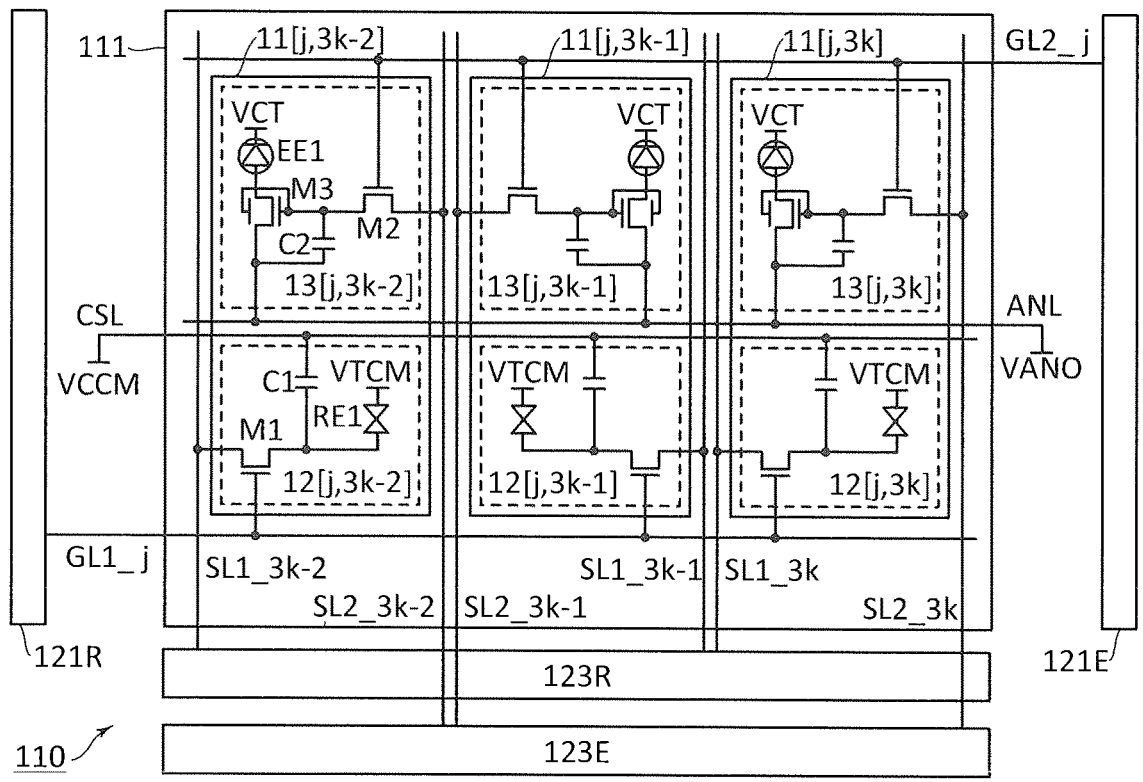
FIG. 2A is a circuit diagram illustrating a configuration example of a pixel array and subpixels.

FIG. 2A is a circuit diagram illustrating a configuration example of the pixel array 111 and that of the subpixel 11. The pixel array 111 includes gate lines GL1 and GL2, source lines SL1 and SL2, and wirings CSL and ANL.

The gate driver 121R drives the gate line GL1 and the gate driver 121E drives the gate line GL2. The source driver 123R inputs an LC data signal to the source line SL1 and the source driver 123E inputs an EL data signal to the source line SL2.

FIG. 2A illustrates three subpixels 11 arranged in one row and three columns as an example. In this specification and the like, a gate line $GL1\_j$ (j is an integer greater than or equal to 1) is the gate line GL1 on the j-th row, a source line $SL2\_3k$ (k is an integer greater than or equal to 1) is the source line SL2 on the 3k-th column, and a subpixel 11[j, 3k] is the subpixel 11 on the j-th row and the 3k-th column. In this specification and the like, an expression "a gate line $GL1\_1$" or the like is used to identify one of the plurality of gate lines GL1. The expression "the gate line GL1" denotes an arbitrary gate line GL1. The same applies to other elements.

The subpixel 11 includes subpixels 12 and 13. The subpixel 12 is electrically connected to the gate line GL1, the source line SL1, and the wiring CSL. The subpixel 13 is electrically connected to the gate line GL2, the source line SL2, and the wiring ANL.

The subpixel 12 is a subpixel for displaying the LC image data, and includes a transistor M1, a capacitor C1, and the LC element RE1. A voltage VCCM is input to the wiring CSL. The wiring CSL is shared by a plurality of subpixels 12, and is electrically connected to the capacitor C1 in each of the subpixels 12.

The LC element RE1 includes a pair of electrodes (a pixel electrode and a common electrode) and an LC layer placed between the pair of electrodes. The pixel electrode of the LC element RE1 is electrically connected to the transistor M1. A voltage VTCM is input to the common electrode of the LC element RE1. The voltage VTCM and the voltage VCCM may have the same value or different values.

The subpixel 13 is a subpixel for displaying the EL image data, and includes transistors M2 and M3, a capacitor C2, and the EL element EE1. A voltage VANO is input to the wiring ANL. The wiring ANL is shared by a plurality of subpixels 13, and is electrically connected to the capacitor C2 in each of the subpixels 13.

The transistor M2 is referred to as a selecting transistor, and the transistor M3 is referred to as a driving transistor. The capacitor C2 is provided to hold a gate voltage of the transistor M3. The transistor M3 has a back gate. The current driving capability of the transistor M3 is increased by electrical connection between the back gate and a gate of the transistor M3.

The EL element EE1 includes a pair of electrodes (an anode electrode and a cathode electrode) and an EL layer placed between the pair of electrodes. In the example of FIG. 2A, a pixel electrode of the EL element EE1 is the anode electrode and a common electrode thereof is the cathode electrode. The pixel electrode of the EL element EE1 is electrically connected to the transistor M3, and a voltage VCT is input to the common electrode of the EL element EE1. In the example of FIG. 2A, the voltage VANO is higher than the voltage VCT.

The EL layer of the EL element EE1 includes at least a light-emitting layer. Moreover, another functional layer such as a layer containing an electron-transport material (electron-transport layer) or a layer containing a hole-transport material (hole-transport layer) can be provided in the EL layer as appropriate. The EL element is referred to as an organic EL element when containing an organic light-emitting material, and is referred to as an inorganic EL element when containing an inorganic light-emitting material.

Figure 2B:
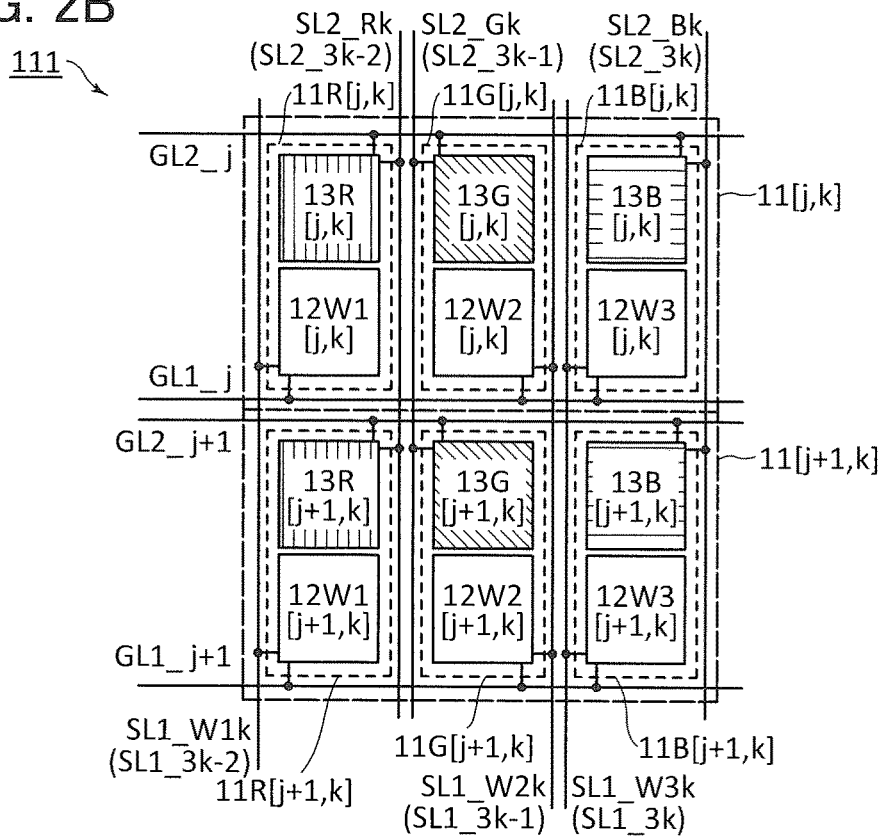
FIG. 2B illustrates a configuration example of a pixel.

A configuration example of a pixel is described with reference to FIG. 2B. In the example of FIG. 2B, three subpixels 11 for displaying red (R), green (G), and blue (B) constitute a pixel.

A subpixel 11R includes a subpixel 12W1 and a subpixel 13R. A subpixel 11G includes a subpixel 12W2 and a subpixel 13G. A subpixel 11B includes a subpixel 12W3 and a subpixel 13B. The subpixels 12W1, 12W2, and 12W3 are subpixels for displaying white (W) for grayscale display.

In this specification and the like, to distinguish the components according to the display color, an identification sign such as "R" or "_R" is added to reference numerals. For example, the subpixel 11R represents a red subpixel 11. A source line SL2_Gk represents the k-th source line SL2 to which a data signal for green is input.

<<Display Principle>>

Figure 3A:
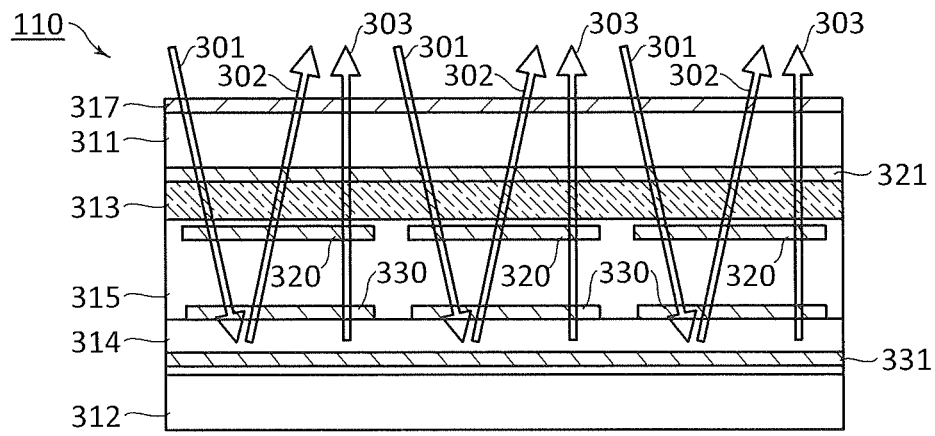
FIGS. 3A and 3C are cross-sectional views each illustrating display principles of an ER panel.

The display principle of the ER panel 110 is described with reference to FIG. 3A. FIG. 3A is a schematic cross-sectional view of the ER panel 110.

The ER panel 110 includes substrates 311 and 312. An LC layer 313, an EL element layer 314, and a transistor layer 315 are provided between the substrate 311 and the substrate 312. The EL elements EE1 of the subpixels 13R, 13G, and 13B are formed by side-by-side patterning, so that they emit light of display colors (RGB).

In the transistor layer 315, various elements included in the pixel array 111 and an external connection terminal are provided. Examples of the elements provided in the transistor layer 315 are a transistor, a capacitor, a rectifier element, and a resistor. In some cases, various elements included in some or all circuits in the peripheral circuit 120 are provided in the transistor layer 315.

There is no particular limitation on device structures of various elements such as transistors and capacitors provided in the transistor layer 315. Device structures are selected to be suited for the pixel array 111 and the peripheral circuit 120. Examples of the device structure of a transistor are a top-gate structure, a bottom-gate structure, a dual-gate structure provided with both a gate (front gate) and a bottom gate, and a multi-gate structure including a plurality of gate electrodes for one semiconductor layer. A semiconductor used for the active layer of the transistor is roughly divided into a single crystal semiconductor and a non-single-crystal semiconductor. Examples of the non-single-crystal semiconductor include a polycrystalline semiconductor, a microcrystalline semiconductor, and an amorphous semiconductor. Examples of semiconductor materials include a semiconductor containing one or more kinds of Group 14 elements such as Si, Ge, and C (e.g., silicon, silicon germanium, and silicon carbide) and a metal oxide (also referred to as an oxide semiconductor).

Examples of a metal oxide that can be used for the active layer of the transistor include a Zn oxide, a Zn—Sn oxide, a Ga—Sn oxide, an In—Ga oxide, an In—Zn oxide, and an In-M-Zn oxide (M is Ti, Ga, Y, Zr, La, Ce, Nd, Sn, or Hf). In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

The transistor layer 315 includes pixel electrodes 320 and 330. The pixel electrode 320, a transmissive electrode that transmits light 301 to 303, is the pixel electrode of the LC element RE1. The pixel electrode 330, a transmissive electrode that transmits the light 301 to 303, is the pixel electrode of the EL element EE1.

The light 301 is environmental light. The light 302 is light reflected by the LC element RE1. The light 303 is light emitted by the EL element EE1.

A surface of the substrate 311 on which the light 301 is incident is provided with an optical film 317. The optical film 317 is, for example, a polarizing film (typically a circularly polarizing film), a retardation film, a prism sheet, an anti-reflection film, or an anti-glare film. The optical film 317 may be a stack of a plurality of optical films. The kind of the optical film 317 is selected as appropriate. For example, when the LC element RE1 is a guest-host mode LC element, a circularly polarizing film is unnecessary.

A surface of the substrate 311 facing the LC layer 313 is provided with a common electrode 321. The common electrode 321, a transmissive electrode, is the common electrode of the LC element RE1.

The EL element EE1 includes the pixel electrode 330, a common electrode 331, and the EL layer. The EL layer and the common electrode 331 are provided in the EL element layer 314. The common electrode 331 is a reflective electrode. The LC element RE1 includes the LC layer 313, the pixel electrode 320, and the common electrodes 321 and 331. The common electrode 321 is a transmissive electrode, and provided for the surface facing the LC layer 313. The luminance of the light 303 is controlled by a current flowing in the EL layer. The current is controlled by a potential difference between the pixel electrode 330 and the common electrode 331. The light 303 is reflected by the common electrode 331, and is transmitted through the pixel electrodes 330 and 320, the LC layer 313, the common electrode 321, the substrate 311, and the optical film 317.

The pixel electrode 320 and the common electrode 321 form the pair of electrodes for applying an electric field to the LC layer 313. The luminance of the light 302 is controlled by the electric field. Since the transmissive electrodes form the pair of electrodes, a reflective electrode is provided to extract the light 302. The common electrode 331 of the EL element EE1 is used as the reflective electrode. With such a structure, the LC element RE1 serves as the reflective display element.

The light 301 is transmitted through the optical film 317, the substrate 311, the common electrode 321, the LC layer 313, and the pixel electrodes 320 and 330, and is reflected by the common electrode 331. The light 303 reflected by the common electrode 331 is transmitted through the pixel electrodes 330 and 320, the LC layer 313, the common electrode 321, the substrate 311, and the optical film 317.

<<ER Panel 114>>

When the reflective display element in the ER panel has a reflective pixel electrode, the pixel electrode can reflect environmental light. An example of such a structure is illustrated in FIG. 3C. An ER panel 114 is a modification example of the ER panel 110, and includes a reflective pixel electrode 332 in place of the transmissive pixel electrode 330. To extract the light 303 from the EL element EE1, the pixel electrode 332 includes at least one opening 332a.

<<Display Mode>>

Figure 3B:
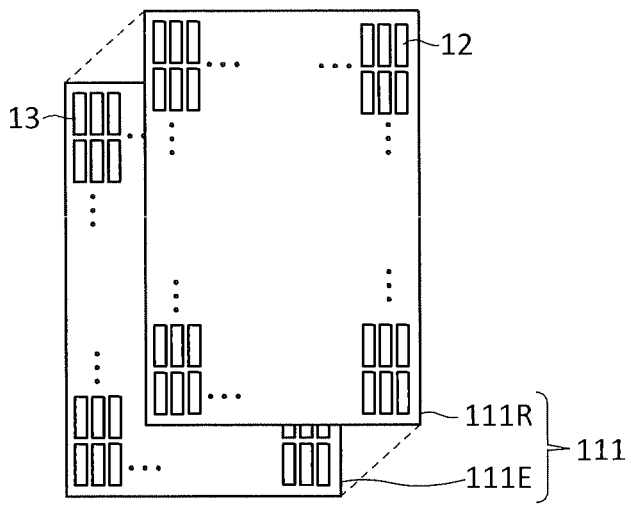
FIG. 3B is a schematic diagram illustrating a structural example of a pixel array.
Figure 3C:
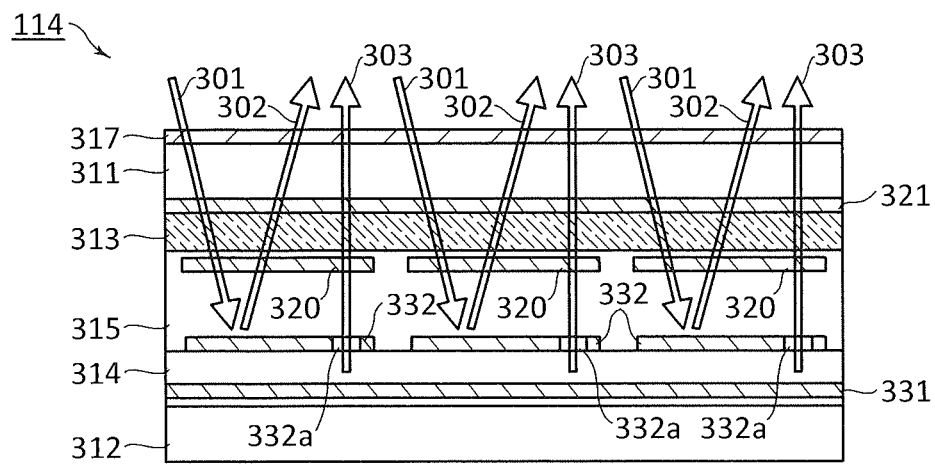

According to the display principle in FIG. 3A, the pixel array 111 combines a pixel array 111R including the sub-pixels 12W1, 12W2, and 12W3 and a pixel array 111E including the subpixels 13R, 13G, and 13B (see FIG. 3B). The pixel array 111E is capable of color display. The pixel array 111R is unable to perform color display but performs grayscale display.

The pixel array 111R performs image display with the reflective display element, thereby suitably displaying a grayscale still image and having low power consumption. In contrast, the pixel array 111E performs image display with the light-emitting display element, thereby having a high contrast ratio and high color reproducibility and suitably displaying a color image.

The pixel array 111R performs only black-and-white display, and thus only the black-and-white display is available in the RLCD mode of the ER display system 100. Color display is available in the hybrid mode and the ELD mode.

An image exhibited by the ER display system 100 to a user is an image in which an image displayed by the pixel array 111E and an image displayed by the pixel array 111R are combined. In this embodiment, a performance difference between the pixel arrays 111E and 111R is effectively utilized, whereby the performance of the ER display system 100 is enhanced.

<<Image Processing Portion 150>>

The attribute adding circuit 161 gives a color attribute for each pixel of image data of one frame sent from the application processor 190. The filter circuit 162 performs image processing in accordance with the color attribute and usage environment (typically the illuminance and RGB components of external light), and generates two kinds of image data (EL image data and LC image data) from the image data of one frame. On the EL image data and the LC image data, the data processing circuit 163 performs image processing corresponding to the characteristics of the ER panel 110.

The ER display system 100 requires the two kinds of image data, i.e., the LC image data and the EL image data; here, the display controller 140 can generate the two kinds of image data from one kind of image data, which avoids a doubling of the image data amount sent from the application processor 190 to the display controller 140. Accordingly, the load borne by the application processor 190 in image data transmission is reduced, which leads to stable operation of the ER display system 100.

<Attribute Adding Circuit 161>

Figure 4:
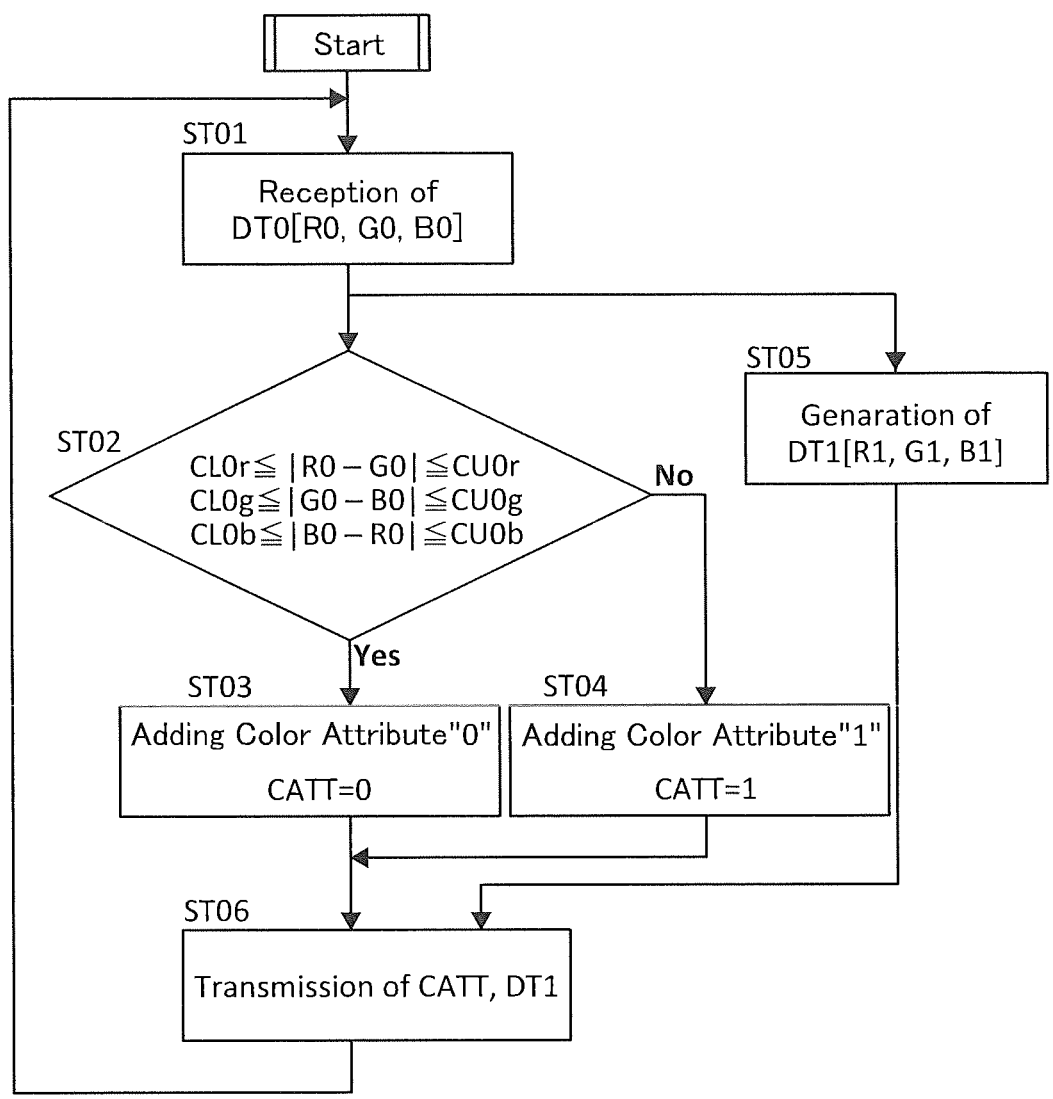
FIG. 4 is a flow chart showing an operation example of a circuit.

An operation example of the attribute adding circuit 161 is described with reference to FIG. 4. FIG. 4 is a flow chart showing the operation example of the attribute adding circuit 161.

(Reception of Image Data DT0: Step ST01)

The attribute adding circuit 161 receives image data DT0[R0, G0, B0] generated by the application processor 190. The image data DT0 is image data for one pixel. Here, R0, G0, and B0 are pixel values of R, G, and B, respectively.

(Adding Color Attribute: Steps ST02-ST04)

The attribute adding circuit 161 generates image data DT1 from the image data DT0, classifies the color of the image data DT0, and gives a color attribute to the image data DT1 on the basis of the classification result. Parameters for the color classification are set by the signal CPARA. In the example of FIG. 4, two color attributes are prepared to classify the color of image data DT0 as a specific color or a color similar to the specific color or as another color.

The attribute adding circuit 161 analyzes the pixel values of R, G, and B of the image data DT0 using the parameters (step ST02), and generates attribute data CATT in accordance with the analysis result (steps ST03 and ST04). The attribute data CATT indicates a color attribute and has one bit here.

In the step ST02, the attribute adding circuit 161 performs comparison operations of formulae (a-1) to (a-3) shown below. In the formulae, CL0r, CL0g, CL0b, and the like correspond to the parameters set by the signal CPARA. Here, CL0r, CL0g, and CL0b may have the same value or different values; CU0r, CU0g, and CU0b may have the same value or different values.

$$CL0r \le |R0-G0| \le CU0r \quad (a\text{-}1)$$

$$CL0g \le |G0-B0| \le CU0g \quad (a\text{-}2)$$

$$CL0b \le |B0-R0| \le CU0b \quad (a\text{-}3)$$

In the case where all the comparison operations of the formulae (a-1) to (a-3) are true, the step ST03 is executed; in the other cases, the step ST04 is executed. That is, when differences between the pixel values of R, G, and B are within predetermined ranges, the color attribute is "0" (CATT=0); when any of the differences are out of the predetermined range, the color attribute is "1" (CATT=1).

(Generation of Image Data DT1: Step ST05)

The attribute adding circuit 161 copies the image data DT0[R0, G0, B0] and generates image data DT1[R1, G1, B1]. The image data DT1 may be different from the image data DT0. For example, saturating addition of R0 and a constant may be performed to generate R1. In a similar manner, G1 and B1 are generated. The constant for the saturating addition is set by the signal CPARA. The constant may be a negative number or a positive number.

(Transmission of Data: Step ST06)

The attribute adding circuit 161 sends the attribute data CATT and the image data DT1 to the filter circuit 162. To process the image data of one frame, the steps ST01 to ST06 are repeated a predetermined number of times.

<Filter Circuit 162>

Figure 5:
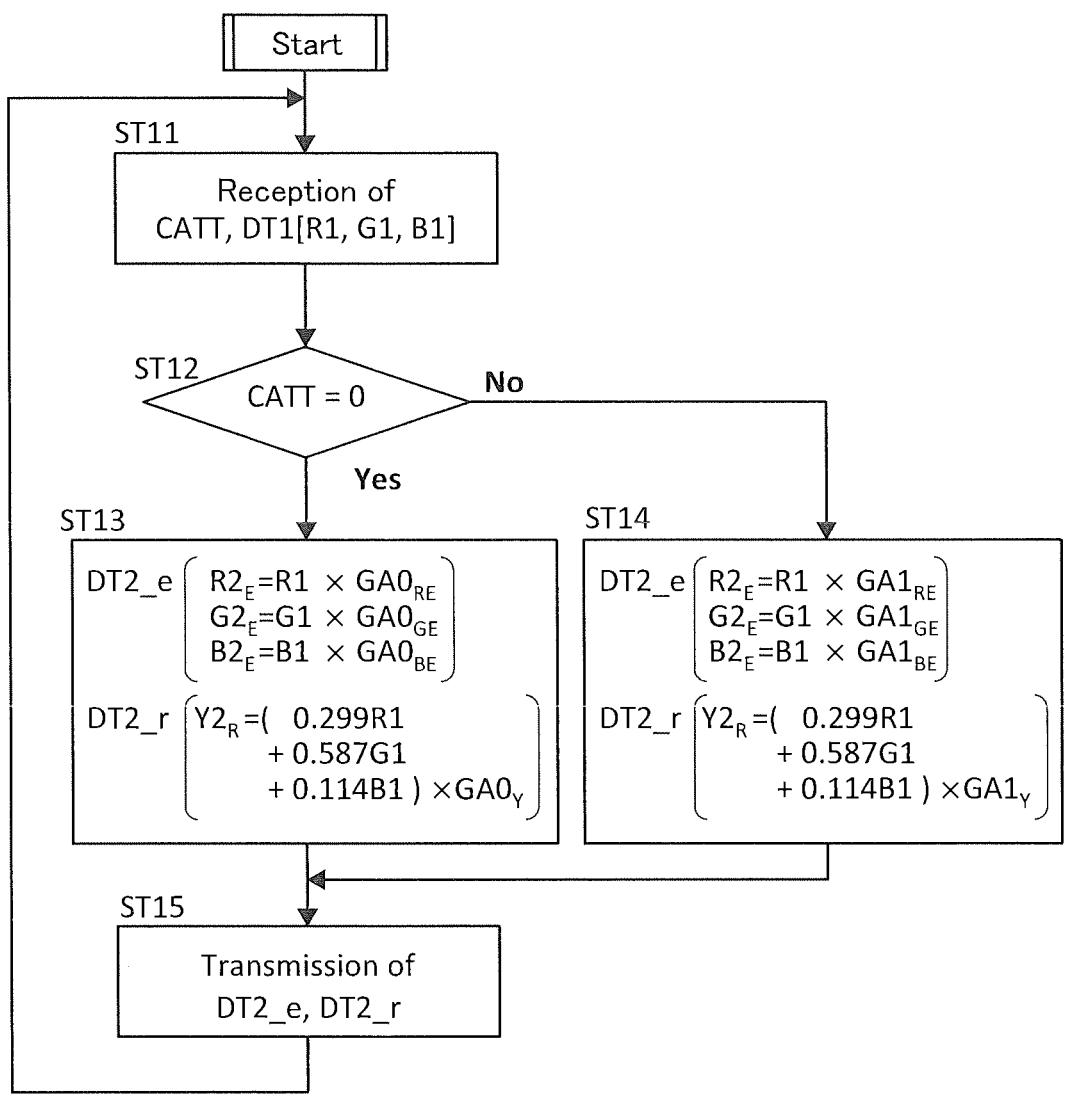
FIG. 5 is a flow chart showing an operation example of a filter circuit.

An operation example of the filter circuit 162 is described with reference to FIG. 5. FIG. 5 is a flow chart showing the operation example of the filter circuit 162.

(Reception of Data: Step ST11)

The filter circuit 162 receives the attribute data CATT and the image data DT1[R1, G1, B1] generated by the attribute adding circuit 161.

(Generation of Image Data DT2_e and DT2_r: Steps ST12-ST14)

The filter circuit 162 identifies the color attribute (step ST12) and performs dimming and toning on the image data DT1 in accordance with the identification result to generate the image data DT2_e and DT2_r (steps ST13 and ST14).

The image data DT2_e is the EL image data for one pixel and has pixel values of R, G, and B ($R2_E$, $G2_E$, and $B2_E$). The image data DT2_r is the LC image data for one pixel. The image data DT2_r has only an 8-bit pixel value $Y2_R$. Here, the image data DT2_r does not have an attribute of color phase or saturation, but only has an attribute of luminance.

In the example of FIG. 5, the pixel values R1, G1, and B1 are multiplied by the corresponding gain values to obtain the image data DT2_e[$R2_E$, $G2_E$, $B2_E$]. As toning for generating the image data DT2_r, grayscale conversion is performed. A luminance value obtained by the grayscale conversion of the image data DT1 is multiplied by a gain value to obtain the pixel value $Y2_R$.

In the case of CATT=0, the filter circuit 162 executes formulae (a-11) to (a-14) shown below to calculate the pixel values $R2_E$, $G2_E$, $B2_E$, and $Y2_R$. Here, $GA0_{RE}$, $GA0_{BE}$, $GA0_{GE}$, and $GA0_Y$ are gain values.

$$R2_E = R1 \times GA0_{BE} \quad \text{(a-11)}$$

$$G2_E = G1 \times GA0_{GE} \quad \text{(a-12)}$$

$$B2_E = B1 \times GA0_{BE} \quad \text{(a-13)}$$

$$Y2_R = (0.299R1 + 0.587G1 + 0.114B1)GA0_Y \quad \text{(a-14)}$$

In the case of CATT=1, the filter circuit 162 executes formulae (a-15) to (a-18) shown below to calculate the pixel values $R2_E$, $G2_E$, $B2_E$, and $Y2_R$. Here, $GA1_{RE}$, $GA1_{BE}$, $GA1_{GE}$, and $GA1_Y$ are gain values.

$$R2_E = R1 \times GA1_{RE} \quad \text{(a-15)}$$

$$G2_E = G1 \times GA1_{GE} \quad \text{(a-16)}$$

$$B2_E = B1 \times GA1_{BE} \quad \text{(a-17)}$$

$$Y2_R = (0.299R1 + 0.587G1 + 0.114B1)GA1_Y \quad \text{(a-18)}$$

For the formulae (a-14) and (a-18), a grayscale conversion equation defined by the ITU-R BT.601 standard is used; however, it is possible to use a grayscale conversion equation other than this equation instead.

The gain values used by the filter circuit 162 are set by the signal GA. The application processor 190 generates the signal GA on the basis of data on the usage environment (e.g., the illuminance and RGB components of environmental light) detected by the sensor portion 193. Furthermore, the application processor sets gain values in accordance with the display mode. Thus, the filter circuit 162 can perform dimming and toning in accordance with the usage environment and display mode.

(Transmission of Data: Step ST15)

The filter circuit 162 sends the image data DT2_e and DT2_r to the data processing circuit 163. When the data processing circuit 163 uses the attribute data CATT, the attribute data CATT is also sent to the data processing circuit 163.

The filter circuit 162 repeats the steps ST11-ST15 a predetermined number of times, whereby the image data DT2_e and DT2_r are generated for each pixel of the one-frame image data.

In the filter circuit 162, the EL image data of one frame is generated by performing dimming and toning for each pixel in accordance with the usage environment and color attribute. The LC image data of one frame is generated by performing grayscale conversion or black image conversion for each pixel in accordance with the attribute data CATT.

<Data Processing Circuit 163>

The data processing circuit 163 processes the image data DT2_e[$R2_E$, $G2_E$, $B2_E$] and DT2_r[$Y2_R$] to generate image data DT3_e[$R3_E$, $G3_E$, $B3_E$] and DT3_r[$Y3_R$]. Typical processing by the data processing circuit 163 is gamma correction. Gamma correction is processing for optimizing the luminance of image data in accordance with the gamma characteristics of a display panel. The data processing circuit 163 performs gamma correction on the image data DT2_e and the image data DT2_r with different gamma values.

Processing for compensating for variations of electrical characteristics of the transistors M3 in the subpixels 13 may be performed on the image data DT2_e.

The data processing circuit 163 sends the image data DT3_e and the image data DT3_r to the source driver 123E and the source driver 123R.

The source driver 123E processes the image data DT3_e [$R3_E$, $G3_E$, $B3_E$] to generate gray-level signals to be written in source lines SL2_R, SL2_G, and SL2_B. The source driver 123R processes the image data DT3_r[$Y3_R$] to generate gray-level signals to be written in source lines SL1_W1, SL1_W2, and SL1_W3. Gray-level signals having the same gray level are input to the source lines SL1_W1, SL1_W2, and SL1_W3; however, the polarity of the gray-level signal for the source line SL_W2 may be different from those of the gray-level signals for the source lines SL1_W1 and SL1_W3 depending on the driving method of the pixel array 111R (e.g., gate line inversion driving, source line inversion driving, frame inversion driving, or dot inversion driving).

<<Display Controller 141>>

Figure 6:
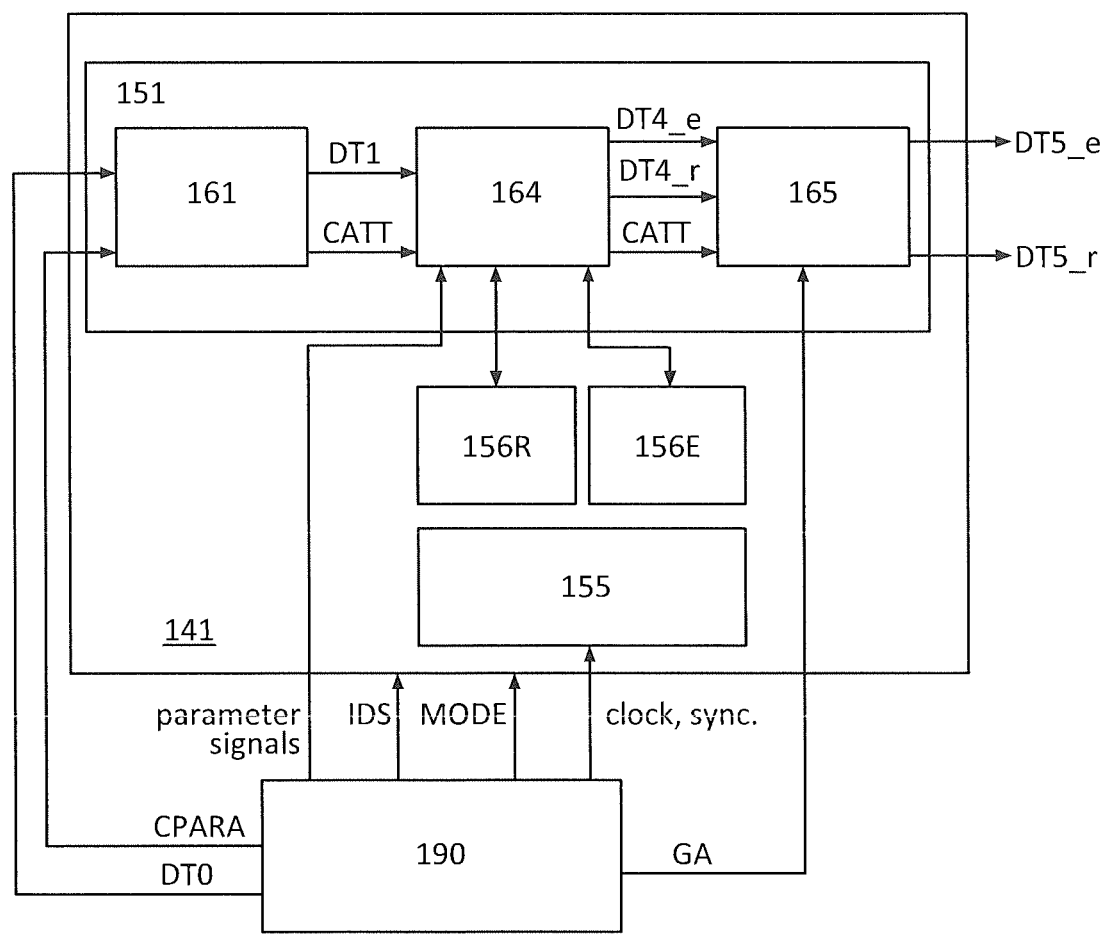
FIG. 6 is a functional block diagram illustrating a configuration example of a display controller.

FIG. 6 illustrates another configuration example of the display controller. A display controller 141 illustrated in FIG. 6 includes an image processing portion 151. The image processing portion 151 includes the attribute adding circuit 161, a data processing circuit 164, and a filter circuit 165. The image processing portion 151 is different from the image processing portion 150 in order of image processing.

The attribute adding circuit 161 sends the image data DT1[R1, G1, B1] and the attribute data CATT to the data processing circuit 164.

The data processing circuit 164 processes the image data DT1 to generate image data DT4_e[$R4_E$, $G4_E$, $B4_E$] and DT4_r[$R4_R$, $G4_R$, $B4_R$]. The image processing by the data processing circuit 164 is processing such as gamma correction in accordance with the characteristics of the ER panel 110, as in the data processing circuit 163. The data processing circuit 164 sends the image data DT4_e[R4$_E$, G4$_E$, B4$_E$] and DT4_r[R4$_R$, G4$_R$, B4$_R$] and the attribute data CATT to the filter circuit 165.

The filter circuit 165 performs dimming and toning on the image data DT4_e[R4$_E$, G4$_E$, B4$_E$] in accordance with the attribute data CATT to generate image data DT5_e[R5$_E$, G5$_E$, B5$_E$]. Specifically, the pixel values R4$_E$, G4$_E$, and B4$_E$ are multiplied by the corresponding gain values according to the attribute data CATT to calculate the pixel values R5$_E$, G5$_E$, and B5$_E$.

The filter circuit 165 performs grayscale conversion on the image data DT4_r[R4$_R$, G4$_R$, B4$_R$] in accordance with the attribute data CATT, calculates a luminance value, multiplies the luminance value by a gain value according to the attribute data CATT, and generates image data DT5_r [Y5$_R$]. The image data DT5_e and DT5_r are sent to the source drivers 123E and 123R, respectively.

<<Display Mode>>

<TXT Mode>

The TXT mode is described with reference to FIG. 7 and FIG. 8. Here, image data has an 8-bit pixel value.

(Operation Example of Image Processing Portion 150)

Figure 7:
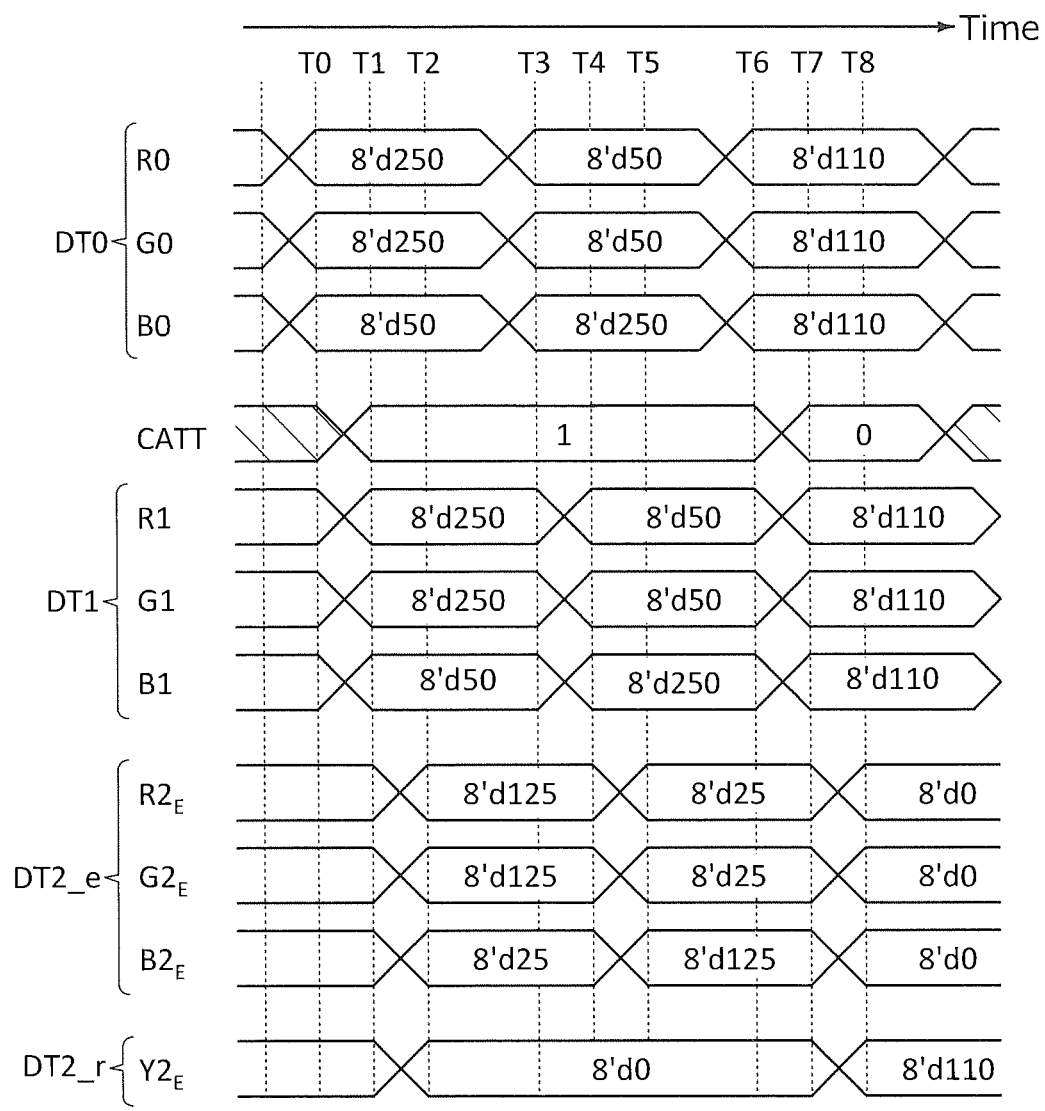
FIG. 7 is a timing chart showing an operation example of an image processing portion in a TXT mode.
Figure 8:
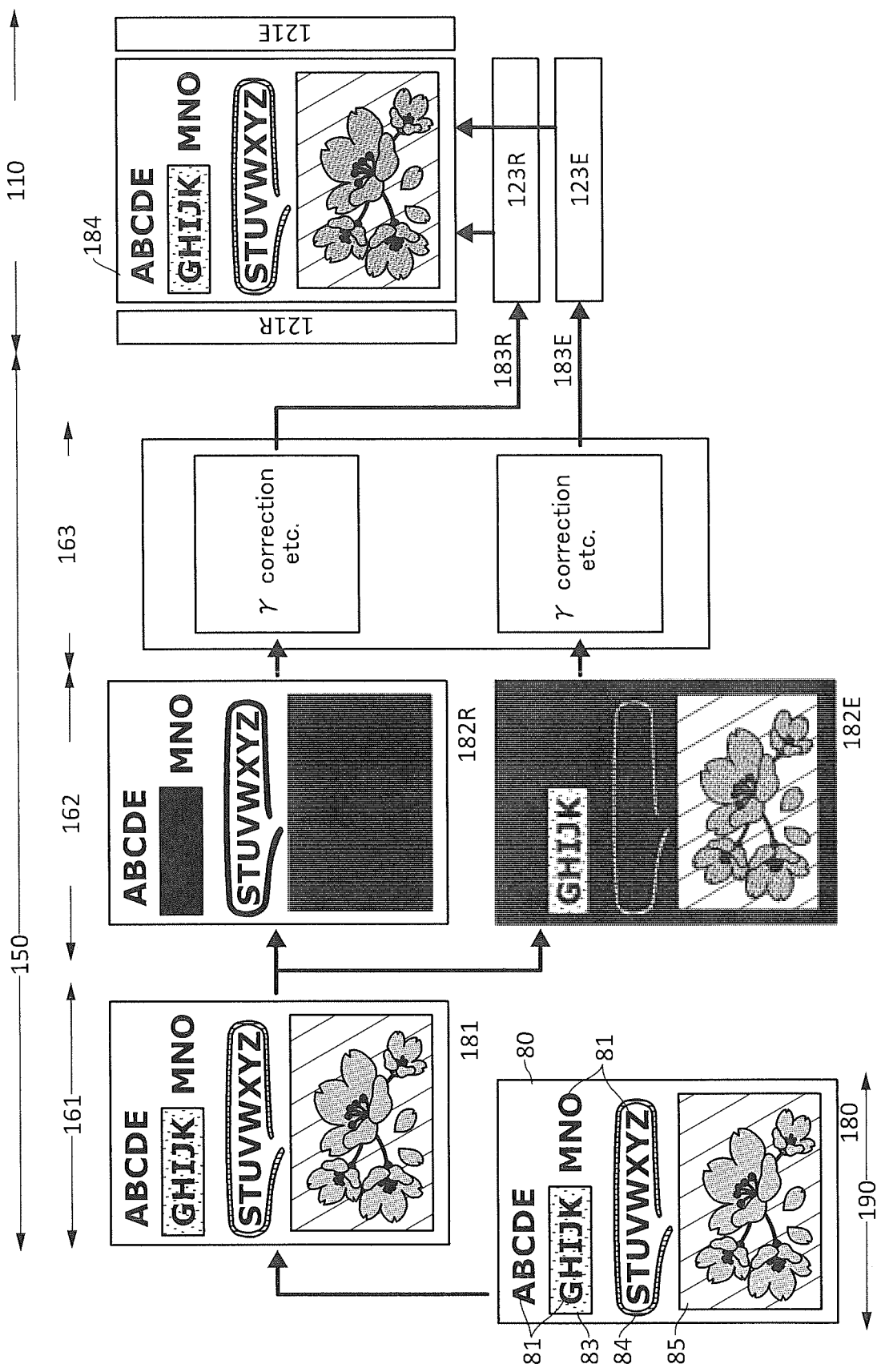
FIG. 8 illustrates image processing in a TXT mode.

FIG. 7 is a timing chart showing an operation example of the image processing portion 150 in the TXT mode. In FIG. 7, T0, T1, and the like denote times.

The parameters used by the attribute adding circuit 161 are set by the signal CPARA as follows. In sum, only when the pixel values R0, G0, and B0 of the image data DT0 are all equal to each other, the color attribute CATT is set to "0".

$CL0r=CL0g=CL0b=0$ $CU0r=CU0g=CU0b=0$

The gain values used by the filter circuit 162 is set by the signal GA as follows. In sum, the image data DT1 with a color attribute of "0" is displayed only with light reflected by the LC element RE1, while the image data DT1 with a color attribute of "1" is displayed only with light emitted by the EL element EE1.

$GA0_{RE}=GA0_{BE}=GA0_{GE}=0$ $GA0_Y=1$ $GA1_{RE}=GA1_{BE}=GA1_{GE}=0.5$ $GA1_Y=0$

At the time T0, the attribute adding circuit 161 receives image data DT0[8'd250, 8'd250, 8'd50]. In a period from the time T0 to the time T1, the attribute adding circuit 161 executes the steps ST02-ST05.

$|R0-G0|=|250-250|=0$ $|G0-B0|=|250-50|=200$ $||B0-R0|=|50-250|=200$

Since the step ST02 is false, the attribute data CATT is set to "1".

In the example of FIG. 7, the attribute adding circuit 161 copies the image data DT0 to generate the image data DT1. At the time T1, the attribute adding circuit 161 sends the image data DT1[8'd250, 8'd250, 8'd50] and the attribute data CATT[1] to the filter circuit 162.

At the time T2, the filter circuit 162 generates the image data DT2_e and DT2_r. Since the attribute data CATT is "1", the filter circuit 162 executes the step ST14. The following operations are performed to generate the image data DT2_e[8'd125, 8'd125, 8'd25] and DT2_r[8'd0].

$R2_E=R1\times 0.5=125$ $G2_E=G1\times 0.5=125$ $B2_E=B1\times 0.5=25$ $Y2_R=0$

At a time T3, the attribute adding circuit 161 receives the image data DT0[8'd50, 8'd50, 8'd250]. In a period from the time T3 to a time T4, the attribute adding circuit 161 executes the steps ST02-ST05.

$|R0-G0|=|50-50|=0$ $|G0-B0|=|50-250|=200$ $|B0-R0|=|250-50|=200$

Since the step ST02 is false, the attribute data CATT is set to "1".

At the time T4, the attribute adding circuit 161 sends the image data DT1[8'd50, 8'd50, 8'd250] and the attribute data CATT[1] to the filter circuit 162.

At a time T5, the filter circuit 162 executes the step ST14. The following operations are performed to generate image data DT2_e[8'd25, 8'd25, 8'd125] and DT2_r[8'd0].

$R2_E=R1\times 0.5=25$ $G2_E=G1\times 0.5=25$ $B2_E=B1\times 0.5=125$ $Y2_R=0$

At a time T6, the attribute adding circuit 161 receives the image data DT0[8'd110, 8'd110, 8'd110]. In a period from the time T6 to a time T7, the attribute adding circuit 161 executes the steps ST02-ST05.

$|R0-G0|=|110-110|=0$ $|G0-B0|=|110-110|=0$ $|B0-R0|=|110-110|=0$

Since the logic in the step ST02 is true, the attribute data CATT is set to "0".

At the time T7, the attribute adding circuit 161 sends the image data DT1[8'd110, 8'd110, 8'd110] and the attribute data CATT[0] to the filter circuit 162.

Since the attribute data CATT is "0", the filter circuit 162 executes the step ST13 at a time T8. The following operations are performed to generate the image data DT2_e[8'd0, 8'd0, 8'd0] and DT2_r[8'd110].

$R2_E=R1\times 0=0$ $G2_E=G1\times 0=0$ $B2_E=B1\times 0=0$ $Y2_R=(0.299R1+0.587G1+0.114B1)\times 1=110$ In the case of a color attribute of "1" in the TXT mode, it is only necessary for the subpixel 12 to display a black image, and thus the pixel value Y2$_R$ of the image data DT2_r is not limited to 0. That is, the gain value GA1$_Y$ may be larger than "0" so that the pixel value Y2$_R$ would be larger than 0.

A difference between an EL image and an LC image is described with reference to FIG. 8. An image 180 shown in FIG. 8 is an image of one frame generated by the application processor 190. The image 180 includes a background 80, a text 81, highlights 83 and 84, and a color picture 85. The color of the background 80 is white (R0=G0=B0=8′d255) and the color of the text 81 is black (R0=G0=B0=8′d0). The colors of the highlights 83 and 84 are yellow and red, respectively. For simplification, the color picture 85 does not include a grayscale image (R0=G0=B0).

An image 181 is generated by the attribute adding circuit 161, and is a copy of the image 180. The attribute adding circuit 161 classifies the colors of the image 180 and determines their color attributes. The color attributes of the background 80 and the text 81 are set to "0", and the color attributes of the highlights 83 and 84 and the color picture 85 are set to "1".

The filter circuit 162 performs filtering on the image 181 in accordance with the color attributes to generate images 182E and 182R. The image 182E is an EL image. For the image 182E, the color of a pixel with a color attribute of "0" is converted into black, and thus the background 80 and the text 81 are displayed as black images. The highlights 83 and 84 and the color picture 85 each of which has a color attribute of "1" are displayed as color images.

The image 182R is an LC image. For the image 182R, a region with a color attribute of "0" is displayed as a grayscale image; thus, the background 80 is displayed as a white image and the text 81 is displayed as a black image. A region with a color attribute of "1" is displayed as a black image; thus, the highlights 83 and 84 and the color picture 85 are displayed as black images.

The data processing circuit 163 processes the images 182E and 182R to generate images 183E and 183R. The ER panel 110 displays an image 184 that combines the image 183E and the image 183R.

The EL element EE1 is a display element with excellent color reproducibility. The highlights 83 and 84 and the color picture 85 are displayed only with light emission from the EL element EE1 while light reflected by the LC element RE1 does not contribute to the display; thus, the highlights 83 and 84 and the color picture 85 can be displayed on the ER panel 110 in the original colors of the image 180.

The gain values $GA1_{RE}$, $GA1_{GE}$, and $GA1_{BE}$ can be set in accordance with the illuminance of a usage environment, and thus the luminance of the EL element EE1 can be adjusted in response to a change in illuminance of the usage environment. For example, the luminance of the EL element EE1 is set low in a dark environment, which improves the visibility of a color image and reduces the power consumption of the ER panel 110.

When the background 80 is displayed only with light reflected by the LC element RE1, display of the background 80 might be dark in a usage environment with low illuminance. In addition, certain color temperatures of a usage environment (or certain RGB components of external light) might cause a large color shift of the background 80. Thus, it is preferable to change the gain values $GA0_{RE}$, $GA0_{GE}$, and $GA0_{BE}$ in accordance with the illuminance and color temperature of a usage environment so that the background 80 can be displayed with light reflected by the LC element RE1 and light emitted by the EL element EE1. As a result, the luminance of the background 80 can be increased. Furthermore, the color shift of the background 80 can be corrected.

<HY, RLCD, and ELD Modes>

The image processing portion 150 performs image processing in response to the signal MODE. Image processing as in the TXT mode is performed in the other display modes. The gain values used by the filter circuit are associated with the corresponding display modes and stored in the register in the image processing portion 150. The filter circuit 162 changes gain values to be used in response to the signal MODE.

In the RLCD mode, gain values used for generating the data DT2_e are set to 0 so that the subpixel 13 displays a black image. For example, $GA0_{RE}=GA0_{BE}=GA0_{GE}=0$ and $GA1_{RE}=GA1_{GE}=GA1_{BE}=0$.

In the ELD mode, gain values used for generating the data DT2_e are set to 0 so that the subpixel 12 displays a black image. For example, $GA0_Y=0$ and $GA1_Y=0$.

<<Color Attribute>>

In the above configuration examples, the number of color attributes is two; however, any number larger than or equal to two is available for the number of color attributes. Here, an example using four color attributes and 2-bit attribute data CATT is described.

<Operation Example of Attribute Adding Circuit 161>

Figure 9:
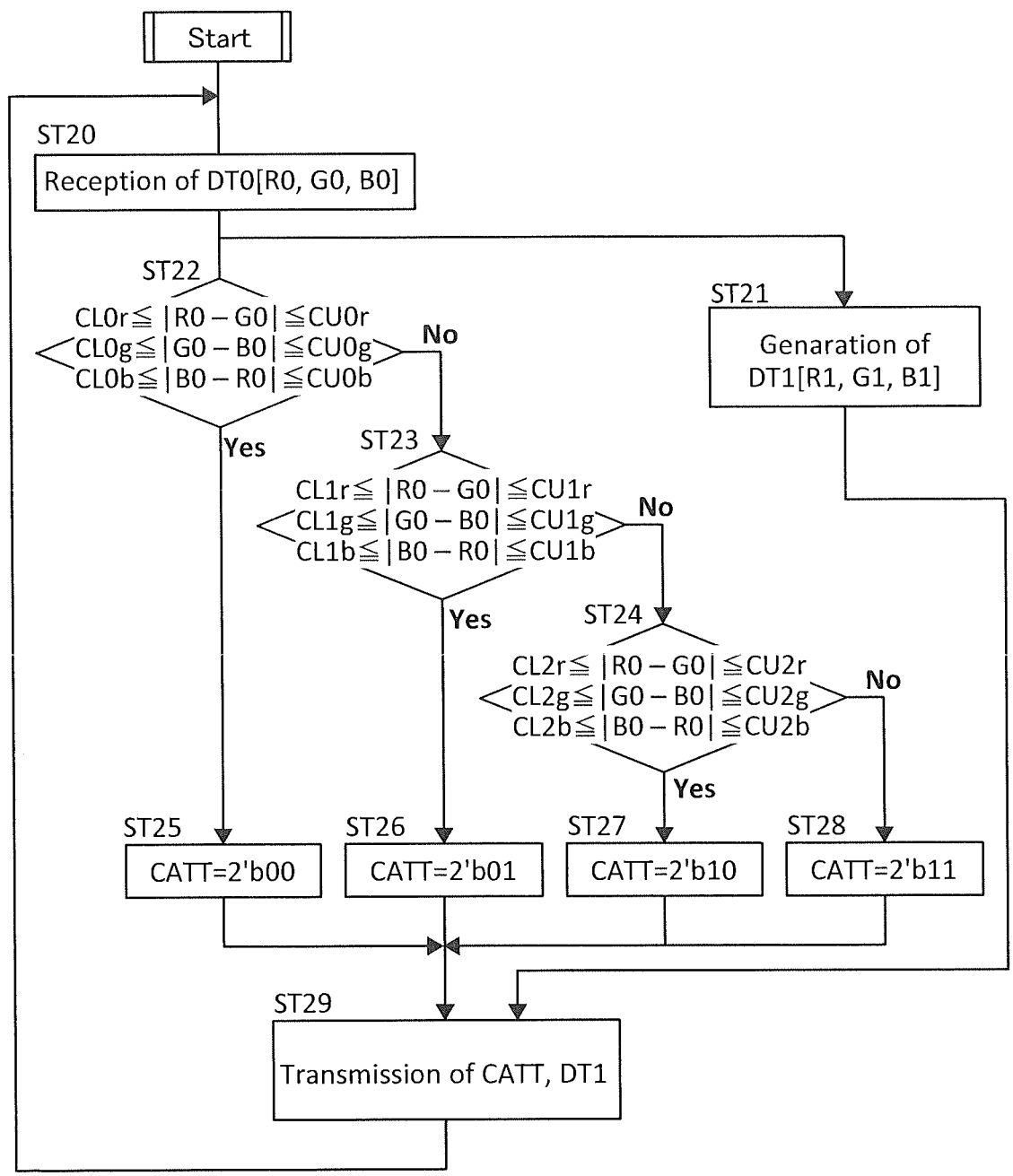
FIG. 9 is a flow chart showing an operation example of an attribute adding circuit.

FIG. 9 is a flow chart showing an operation example of the attribute adding circuit 161, which is different from that of FIG. 4 in process of determining the attribute data CATT.

(Reception of Image Data DT0: Step ST20)

The attribute adding circuit 161 receives the image data DT0[R0, G0, B0] generated by the application processor 190.

(Generation of Image Data DT1: Step ST21)

The step ST21 is similar to the step ST05. The attribute adding circuit 161 processes the image data DT0[R0, G0, B0] and generates the image data DT1[R1, G1, B1].

(Adding Color Attribute: Steps ST22-ST28)

Parameters for color classification are set by the signal CPARA. The parameters have a relation of the following formulae (b-1) to (b-3).

$$CL2r \leq CL1r \leq CL0r \leq CU0r \leq CU1r \leq CU2r \quad \text{(b-1)}$$

$$CL2g \leq CL1g \leq CL0g \leq CU0g \leq CU1g \leq CU2g \quad \text{(b-2)}$$

$$CL2b \leq CL1b \leq CL0b \leq CU0b \leq CU1b \leq CU2b \quad \text{(b-3)}$$

In the step ST22, the attribute adding circuit 161 performs comparison operations of formulae (b-4) to (b-6) shown below.

$$CL0r \leq |R0-G0| \leq CU0r \quad \text{(b-4)}$$

$$CL0g \leq |G0-B0| \leq CU0g \quad \text{(b-5)}$$

$$CL0b \leq |B0-R0| \leq CU0b \quad \text{(b-6)}$$

In the step ST23, the attribute adding circuit 161 performs comparison operations of formulae (b-7) to (b-9) shown below.

$$CL1r \leq |R0-G0| \leq CU1r \quad \text{(b-7)}$$

$$CL1g \leq |G0-B0| \leq CU1g \quad \text{(b-8)}$$

$$CL1b \leq |B0-R0| \leq CU1b \quad \text{(b-9)}$$

In the step ST24, the attribute adding circuit 161 performs comparison operations of formulae (b-10) to (b-12) shown below.

$$CL2r \leq |R0-G0| \leq CU2r \quad \text{(b-10)}$$

$$CL2g \leq |G0-B0| \leq CU2g \quad \text{(b-11)}$$

$$CL2b \leq |B0-R0| \leq CU2b \quad \text{(b-12)}$$

In the case where all the comparison operations of the formulae (b-4) to (b-6) are true, the step ST22 is true; in the other cases, the step ST22 is false. The same is applied to the steps ST23 and ST24.

When the step ST22 is true, the attribute data CATT is set to 2′b00. When the step ST23 is true, the attribute data CATT is set to 2′b01. When the step ST24 is true, the attribute data CATT is set to 2′b10. In the other cases, the attribute data CATT is set to 2b′11.

(Transmission of Data: Step ST29)

The attribute adding circuit 161 sends the attribute data CATT and the image data DT1 to the filter circuit 162. To process the image data of one frame, the steps ST20 to ST29 are repeated a predetermined number of times.

<Operation Example of Filter Circuit 162>

Figure 10:
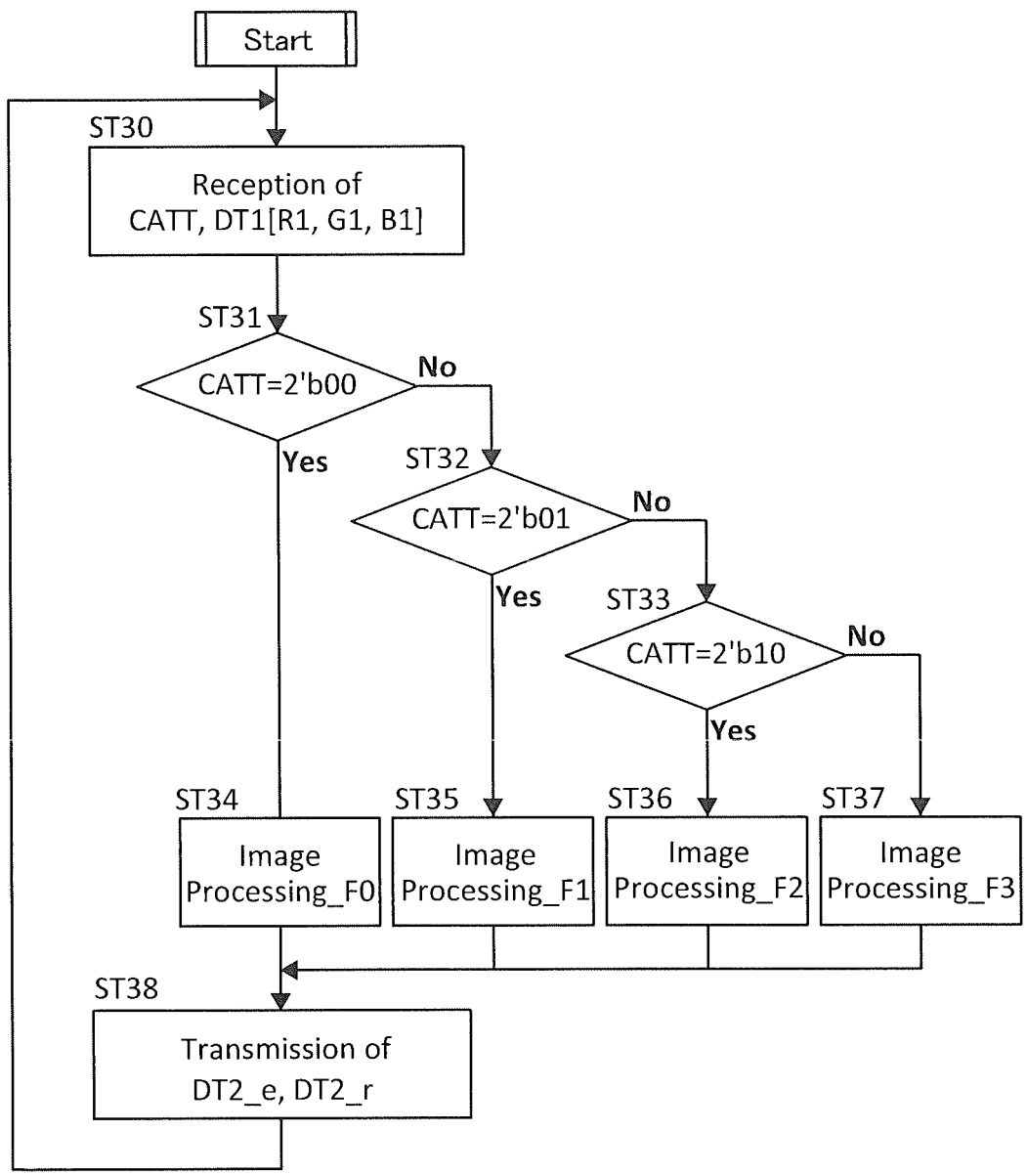
FIG. 10 is a flow chart showing an operation example of a filter circuit.

FIG. 10 is a flow chart showing an operation example of the filter circuit 162.

(Reception of Data: Step ST30)

The filter circuit 162 receives the attribute data CATT and the image data DT1[R1, G1, B1].

(Identification of Color Attribute: Steps ST31-ST33)

The filter circuit 162 analyzes the attribute data CATT and identifies the color attribute.

(Generation of Image Data DT2_e and DT2_r: Steps ST34-ST37)

The filter circuit 162 processes the image data DT1 on the basis of the identification result and generates the image data DT2_e and DT2_r. In the case where the attribute data CATT is 2′b00, image processing _F0 is performed. In the case where the attribute data CATT is 2′b01, image processing _F1 is performed. In the case where the attribute data CATT is 2′b10, image processing _F2 is performed. In the case where the attribute data CATT is 2′b11, image processing _F3 is performed.

Gain values for generating the image data DT2_e and DT2_r are set by the signal GA.

(Image Processing _F0: Step ST34)

In the step ST34, the filter circuit 162 executes formulae (b-21) to (b-24) shown below to calculate the pixel values $R2_E$, $G2_E$, $B2_E$, and $Y2_R$.

$$R2_E = R1 \times GA0_{RE} \tag{b-21}$$

$$G2_E = G1 \times GA0_{GE} \tag{b-22}$$

$$B2_E = B1 \times GA0_{BE} \tag{b-23}$$

$$Y2_R = (0.299R1 + 0.587G1 + 0.114B1)GA1_Y \tag{b-24}$$

(Image Processing _F1: Step ST35)

In the step ST35, the filter circuit 162 executes formulae (b-25) to (b-28) shown below to calculate the pixel values $R2_E$, $G2_E$, $B2_E$, and $Y2_R$.

$$R2_E = R1 \times GA1_{RE} \tag{b-25}$$

$$G2_E = G1 \times GA1_{GE} \tag{b-26}$$

$$B2_E = B1 \times GA1_{BE} \tag{b-27}$$

$$Y2_R = (0.299R1 + 0.587G1 + 0.114B1)GA1_Y \tag{b-28}$$

(Image Processing _F2: Step ST36)

In the step ST36, the filter circuit 162 executes formulae (b-29) to (b-32) shown below to calculate the pixel values $R2_E$, $G2_E$, $B2_E$, and $Y2_R$.

$$R2_E = R1 \times GA2_{RE} \tag{b-29}$$

$$G2_E = G1 \times GA2_{GE} \tag{b-30}$$

$$B2_E = B1 \times GA2_{BE} \tag{b-31}$$

$$Y2_R = (0.299R1 + 0.587G1 + 0.114B1)GA2_Y \tag{b-32}$$

(Image Processing _F3: Step ST37)

In the step ST37, the filter circuit 162 executes formulae (b-33) to (b-36) shown below to calculate the pixel values $R2_E$, $G2_E$, $B2_E$, and $Y2_R$.

$$R2_E = R1 \times GA3_{RE} \tag{b-33}$$

$$G2_E = G1 \times GA3_{GE} \tag{b-34}$$

$$B2_E = B1 \times GA3_{BE} \tag{b-35}$$

$$Y2_R = (0.299R1 + 0.587G1 + 0.114B1)GA3_Y \tag{b-36}$$

(Transmission of Data: Step ST38)

The filter circuit 162 sends the image data DT2_e and DT2_r to the data processing circuit 163. To process the image data of one frame, the steps ST30 to ST38 are repeated a predetermined number of times. When the data processing circuit 163 uses the attribute data CATT, the attribute data CATT is also sent to the data processing circuit 163.

When the display mode is the TXT mode, the gain values are set as follows, for example.

$$GA0_{RE} = GA0_{BE} = GA0_{GE} = 0$$

$$GA1_{RE} = GA1_{BE} = GA1_{GE} = 0.25$$

$$GA2_{RE} = GA2_{BE} = GA2_{GE} = 0.5$$

$$GA3_{RE} = GA3_{BE} = GA3_{GE} = 0.75$$

$$GA0_Y = 1$$

$$GA1_Y = GA2_Y = GA3_Y = 0$$

In this example, in the case where the attribute data CATT is 2′b00 or 2′b01, the image data DT2_e is black image data and the image data DT2_r is grayscale data. In the case where the color attribute is 2′b10 or 2′b11, the image data DT2_e is color image data and the image data DT2_r is black image data.

<<IDS Driving>>

In the case of displaying a still image, data is not changed every frame. Therefore, in the case of displaying a still image, the frequency of rewriting data of the subpixel 11, particularly the subpixel 12 can be lower than that in the case of normal driving. In view of this, to display still images, a driving method may be performed in which rewriting data of the subpixels 11 is temporarily stopped in a period longer than one frame period of normal driving. Here, such a driving method is referred to as idling stop (IDS) driving. The frequency of rewriting image data in IDS driving is lower than that in normal driving; thus, the power consumption of the ER display system 100 is lower than that in normal operation.

For example, the application processor 190 determines whether there is a change in image data between frames, generates a signal IDS on the basis of the determination result, and sends the signal to the display controller 140. The timing controller 155 generates a timing signal for the peripheral circuit 120 on the basis of the signal IDS. The signal IDS is a signal for switching between the IDS driving and the normal driving and setting refresh rates of the normal driving and the IDS driving. For example, the refresh rate in the normal driving is set to 60 Hz to 120 Hz, and the refresh rate in the IDS driving is set to lower than 60 Hz, for example, set to 1 Hz.

In another example, the refresh rate of the pixel array 111E in the IDS driving is the same as that in the normal driving, while the refresh rate of the pixel array 111R in the IDS driving is set by a signal ids.

The amount of charge leakage from the capacitor C1 is preferably reduced as much as possible so that the display quality in IDS driving is kept the same as in normal driving. This is because the charge leakage causes a change in voltage applied to the LC element RE1, thereby changing the transmittance of the subpixel 12. For this reason, the transistor M1 is preferably a transistor with a low off-state current. The same applies to the subpixel 13. Thus, each of the transistors M1 to M3 in the subpixel 11 is preferably an OS transistor with an extremely low off-state current. The reason why the off-state current of an OS transistor is much lower than that of a Si transistor is that the bandgap of a metal oxide (for example, 2.5 eV or more) is wider than that of Si.

The filter circuit 162 can perform dimming and toning on the EL image data in accordance with the illuminance and color temperature (RGB components) of environmental light. Accordingly, in various environments (even under moon light or direct midsummer sunlight), the display system can have high visibility and low power consumption.

<<ER Display System 101>>

Another configuration example of the ER display system is described below. In this example, the ER panel is a composite panel of a color reflective LC display panel and a color EL display panel.

Figure 11:
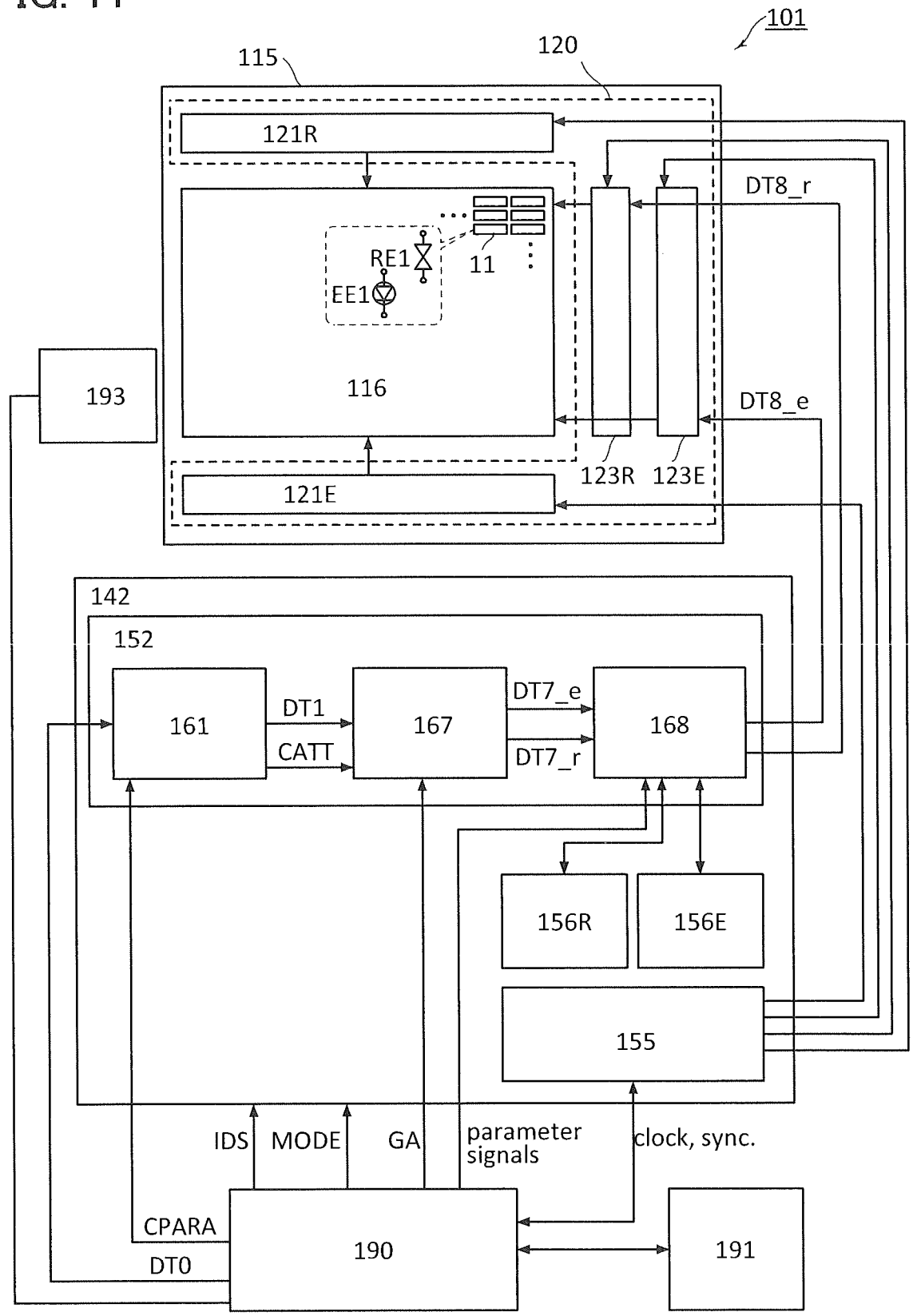
FIG. 11 is a functional block diagram illustrating a configuration example of an ER display system.

An ER display system 101 shown in FIG. 11 is a modification example of the ER display system 100, and includes an ER panel 115 in place of the ER panel 110, and a display controller 142 in place of the display controller 140.

Figure 12A:
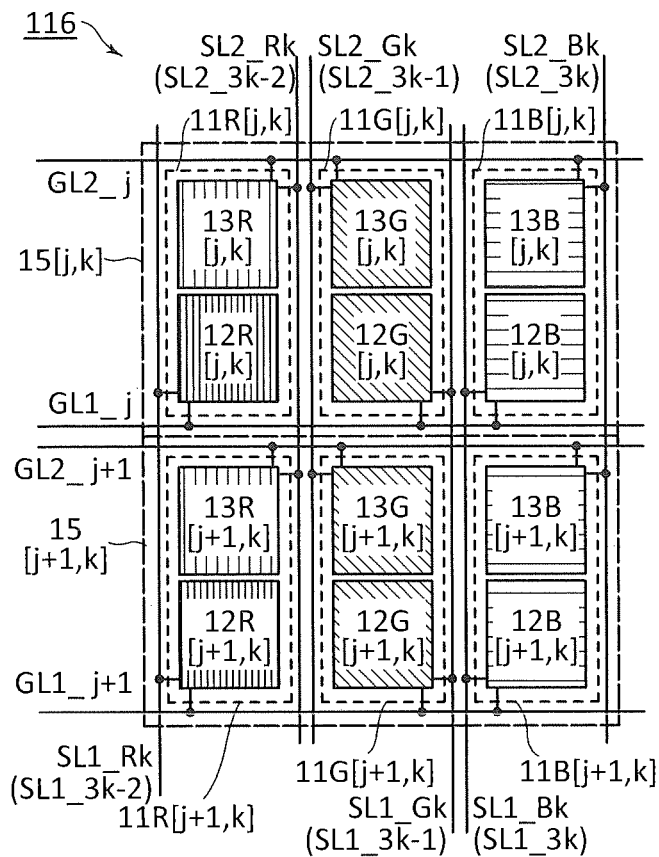
FIG. 12A illustrates a configuration example of a pixel.
Figure 12B:
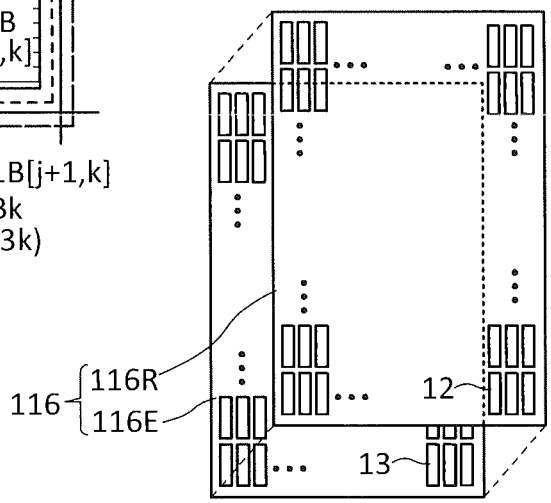
FIG. 12B is a schematic diagram illustrating a structural example of a pixel array.

The ER panel 115 includes a pixel array 116 and the peripheral circuit 120. The pixel array 116 includes the subpixel 11, like the pixel array 111. The circuit configuration of the pixel array 116 is similar to that of the pixel array 111 (see FIG. 2A). A pixel 15 in the pixel array 116 includes subpixels 12R, 12G, and 12B and the subpixels 13R, 13G, and 13B (see FIG. 12A). Like the pixel array 111, the pixel array 116 combines a pixel array 116R including the LC element RE1 and a pixel array 116E including the EL element EE1 (see FIG. 12B).

Figure 12C:
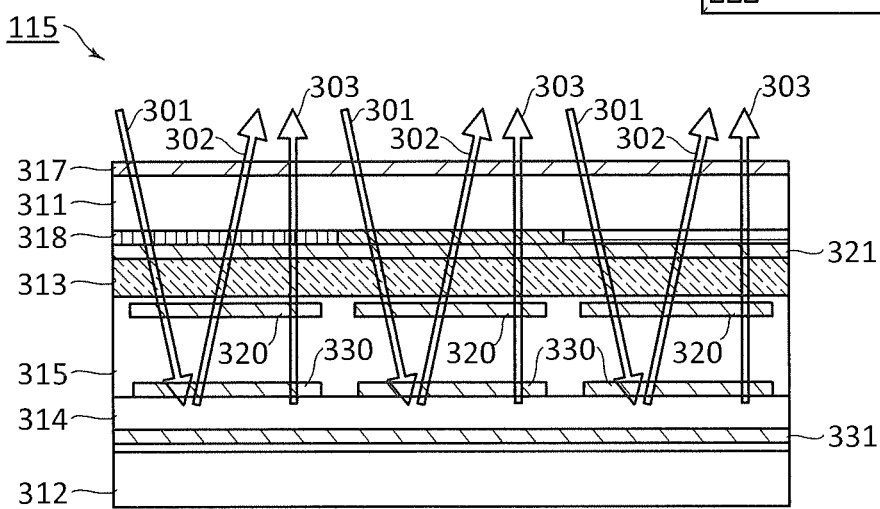
FIG. 12C is a cross-sectional view illustrating display principles of an ER panel.

FIG. 12C is a schematic cross-sectional view of the ER panel 115. In the ER panel 115, a color filter layer 318 is provided between the substrate 311 and the common electrode 321 to achieve color display by the pixel array 116R. Since the color filter layer 318 is provided, the EL elements EE1 in the subpixels 13R, 13G, and 13B may be light-emitting elements exhibiting white or light-emitting elements exhibiting display colors (RGB).

The ER panel 114 (FIG. 3C) to which the color filter layer 318 is added can be used to form the ER display system 101.

<<Display Controller 142>>

The display controller 142 is a modification example of the display controller 140, and includes an image processing portion 152 in place of the image processing portion 150. The image processing portion 152 includes the attribute adding circuit 161, a filter circuit 167, and a data processing circuit 168.

The attribute adding circuit 161 sends the image data DT1[R1, G1, B1] and the attribute data CATT to the filter circuit 167.

The filter circuit 167 performs dimming and toning on the image data DT1 in accordance with the attribute data CATT and generates image data $DT7\_e[R7_E, G7_E, B7_E]$ and $DT7\_r[R7_R, G7_R, B7_R]$.

The data processing circuit 168 processes the image data $DT7\_e$ and $DT7\_r$ to generate image data $DT8\_e[R8_E, G8_E, B8_E]$ and $DT8\_r[R8_R, G8_R, B8_R]$. The image data $DT8\_e$ and $DT8\_r$ are sent to the source drivers 123E and 123R, respectively.

<Operation Example of Filter Circuit 167>

Figure 13:
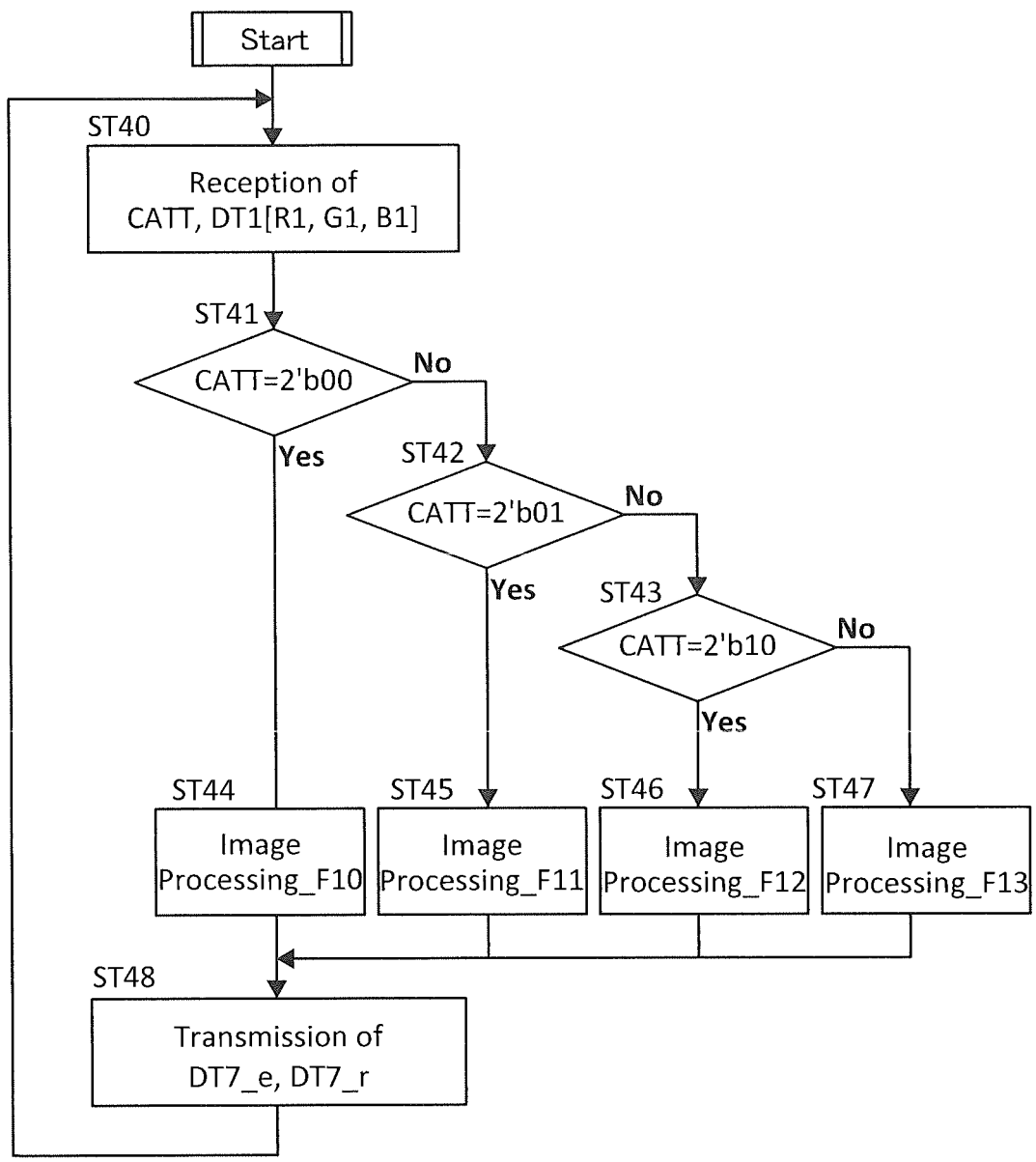
FIG. 13 is a flow chart showing an operation example of an attribute adding circuit.

An operation example of the filter circuit 167 is described with reference to FIG. 13. Here, the attribute data CATT has 2 bits.

(Reception of Data: Step ST40)

The filter circuit 167 receives the attribute data CATT and the image data DT1[R1, G1, B1].

(Identification of Color Attribute: Steps ST41-ST43)

The filter circuit 167 analyzes the attribute data CATT and identifies the color attribute.

(Generation of Image Data $DT7\_e$ and $DT7\_r$: Steps ST44-ST47)

The filter circuit 167 processes the image data DT1 on the basis of the identification result and generates the image data $DT7\_e$ and $DT7\_r$. In the case where the attribute data CATT is 2'b00, image processing _F10 is performed. In the case where the attribute data CATT is 2'b01, image processing _F11 is performed. In the case where the attribute data CATT is 2'b10, image processing _F12 is performed. In the case where the attribute data CATT is 2'b11, image processing _F13 is performed.

(Image Processing _F10: Step ST44)

In the step ST44, the filter circuit 167 executes formulae (c-1) to (c-6) shown below to calculate the pixel values $R7_E$, $G7_E$, $B7_E$, $R7_R$, $G7_R$, and $B7_R$.

$$R7_E = R1 \times GA0_{RE} \tag{c-1}$$

$$G7_E = G1 \times GA0_{GE} \tag{c-2}$$

$$B7_E = B1 \times GA0_{BE} \tag{c-3}$$

$$R7_R = R1 \times GA0_{RR} \tag{c-4}$$

$$G7_R = G1 \times GA0_{GR} \tag{c-5}$$

$$B7_R = B1 \times GA0_{BR} \tag{c-6}$$

(Image Processing _F11: Step ST45)

In the step ST45, the filter circuit 167 executes formulae (c-7) to (c-12) shown below to calculate the pixel values $R7_E$, $G7_E$, $B7_E$, $R7_R$, $G7_R$, and $B7_R$.

$$R7_E = R1 \times GA1_{RE} \tag{c-7}$$

$$G7_E = G1 \times GA1_{GE} \tag{c-8}$$

$$B7_E = B1 \times GA1_{BE} \tag{c-9}$$

$$R7_R = R1 \times GA1_{RR} \tag{c-10}$$

$$G7_R = G1 \times GA1_{GR} \tag{c-11}$$

$$B7_R = B1 \times GA1_{BR} \tag{c-12}$$

(Image Processing _F12: Step ST46)

in the step ST46, the filler circuit 167 executes formulae (c-13) to (c-18) shown below to calculate the pixel values $R7_E$, $G7_E$, $B7_E$, $R7_R$, $G7_R$, and $B7_R$.

$$R7_E = R1 \times GA2_{RE} \tag{c-13}$$

$$G7_E = G1 \times GA2_{GE} \tag{c-14}$$

$$B7_E = B1 \times GA2_{BE} \quad \text{(c-15)}$$

$$R7_R = R1 \times GA2_{RR} \quad \text{(c-16)}$$

$$G7_R = G1 \times GA2_{GR} \quad \text{(c-17)}$$

$$B7_R = B1 \times GA2_{BR} \quad \text{(c-18)}$$

(Image Processing _F13: Step ST47)

In the step ST47, the filter circuit 167 executes formulae (c-19) to (c-24) shown below to calculate the pixel values $R7_E$, $G7_E$, $B7_E$, $R7_R$, $G7_R$, and $B7_R$.

$$R7_E = R1 \times GA3_{RE} \quad \text{(c-19)}$$

$$G7_E = G1 \times GA3_{GE} \quad \text{(c-20)}$$

$$B7_E = B1 \times GA3_{BE} \quad \text{(c-21)}$$

$$R7_R = R1 \times GA3_{RR} \quad \text{(c-22)}$$

$$G7_R = G1 \times GA3_{GR} \quad \text{(c-23)}$$

$$B7_R = B1 \times GA3_{BR} \quad \text{(c-24)}$$

(Transmission of Data: Step ST48)

The filter circuit 167 sends the image data DT7_e and DT7_r to the data processing circuit 168. To process the image data of one frame, the steps ST40 to ST48 are repeated a predetermined number of times. When the data processing circuit 168 uses the attribute data CATT, the attribute data CATT is also sent to the data processing circuit 168.

The gain values for generating the image data DT7_e and DT7_r are set by the signal GA. For example, the values of $GA0_{RE}$, $GA0_{RR}$, and the like are associated with the corresponding display modes and stored in a register of the image processing portion 152. The filter circuit 167 changes the values of $GA0_{RE}$ and the like in response to the signal MODE.

For example, when the attribute data CATT is 2'b00 or 2'b01 in the TXT mode, gain values that make the image data DT7_r grayscale data are used. On the other hand, when the attribute data CATT is 2'b10 or 2'b11, gain values that make the image data DT7_r black image data are used.

Since the pixel array 116R can perform color display, the ER display system 101 can perform color display also in the RLCD mode. For example, the display mode is switched between the RLCD mode, the HY mode, and the ELD mode depending on the brightness of a usage environment, so that high-quality display and low power consumption can be obtained.

In a dark environment where light reflected by the LC element RE1 is invisible, the ELD mode is employed for image display.

As the illuminance of environmental light becomes higher, the visibility of light reflected by the LC element RE1 increases, but the visibility of light emitted by the EL element EE1 decreases. Thus, in an environment where light emitted by the EL element EE1 is invisible (e.g., outdoors in the sunny daytime), the RLCD mode is employed for image display because light emission from the EL element EE1 is unnecessary.

In an environment with low illuminance where light reflected by the LC element RE1 is visible but cannot provide high-quality display alone (e.g., indoors without illumination), the HY mode is employed for image display. In addition, in a bright environment where light emitted by the EL element EE1 is hard to see (e.g., indoors with a good level of illumination or outdoors in the cloudy daytime), the HY mode is employed for image display. Since the HY mode is available, the ER display system 101 can perform high-quality display in various environments.

On the LC image data and the EL image data, the filter circuit 167 can perform dimming and toning associated with the illuminance and RGB components of environmental light. Accordingly, the ER display system 101 can have low power consumption and perform high-quality color display in various environments (e.g., under moon light or direct midsummer sunlight).

<<Display System 105>>

Various display systems, not limited to the ER display system, can employ the display controller of this embodiment. The display controller of this embodiment can be used in a display system that includes an LC panel, an EL panel, a quantum dot (or quantum rod) panel, a micro LED panel, or the like as a display panel. A display system including an EL panel is described below.

Figure 14:
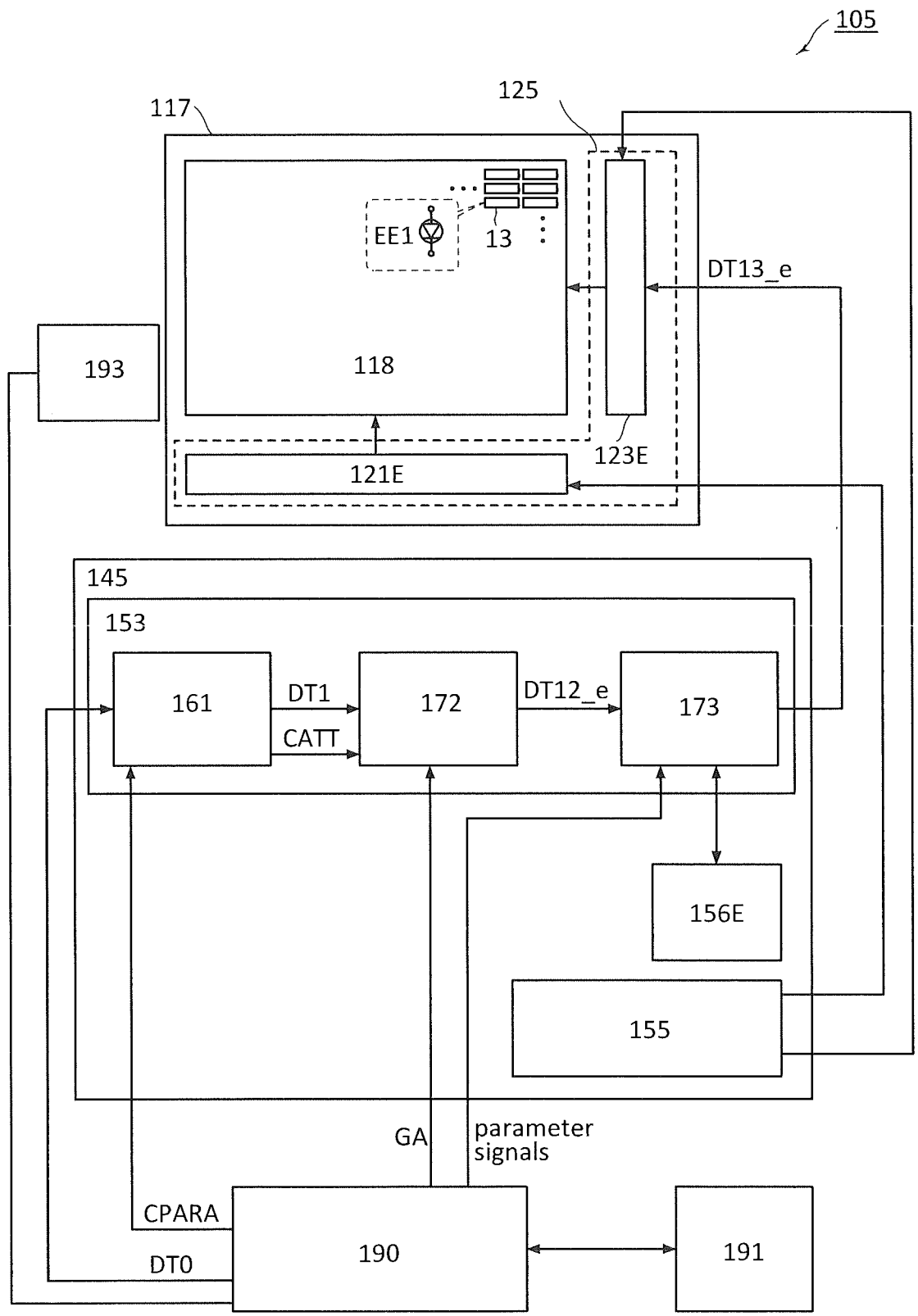
FIG. 14 is a functional block diagram illustrating a configuration example of a display system.

A display system 105 in FIG. 14 includes an EL panel 117, a display controller 145, the application processor 190, the memory device 191, and the sensor portion 193.

The EL panel 117 includes a pixel array 118 and a peripheral circuit 125. The peripheral circuit 125 includes the gate driver 121E and the source driver 123E. The pixel array 118 includes subpixels 13. One pixel includes the subpixels 13R, 13G, and 13B.

The display controller 145 includes an image processing portion 153, the timing controller 155, and the memory device 156E. The image processing portion 153 includes the attribute adding circuit 161, a filter circuit 172, and a data processing circuit 173.

The filter circuit 172 performs dimming and toning on the image data DT1 in accordance with the attribute data CATT and generates image data DT12_e[$R12_E$, $G12_E$, $B12_E$]. The data processing circuit 173 processes the image data DT12_e to generate image data DT13_e[$R13_E$, $G13_E$, $B13_E$]. The image data DT13_e is sent to the source driver 123E.

In the image processing portion 153, the data processing circuit 173 may process the image data DT1 first and the filter circuit 172 may process the image data processed by the data processing circuit 173.

<Operation Example of Filter Circuit 172>

An operation example of the filter circuit 172 is described below. Here, the attribute data CATT has 2 bits. The operation of the filter circuit 172 is similar to that of the filter circuit 167 (see FIG. 13).

(Reception of Data)

The filter circuit 172 receives the attribute data CATT and the image data DT1[R1, G1, B1].

(Identification of Color Attribute)

Then, the filter circuit 172 analyzes the attribute data CATT and identifies the color attribute.

(Generation of Image Data DT12_e)

The filter circuit 172 processes the image data DT1 on the basis of the identification result of the color attribute to generate the image data DT12_e. In the case where the attribute data CATT is 2'b00, image processing _F20 is performed. In the case where the attribute data CATT is 2'b01, image processing _F21 is performed. In the case where the attribute data CATT is 2'b10, image processing _F22 is performed. In the case where the attribute data CATT is 2'b11, image processing _F23 is performed. Gain values used for the image processing _F20 to _F23 are set by the signal GA.

(Image Processing _F20)

The filter circuit 172 executes formulae (d-1) to (d-3) shown below to calculate the pixel values $R12_E$, $G12_E$, and $B12_E$.

$$R12_E = R1 \times GA10_{RE} \qquad \text{(d-1)}$$

$$G12_E = G1 \times GA10_{GE} \qquad \text{(d-2)}$$

$$B12_E = B1 \times GA10_{BE} \qquad \text{(d-3)}$$

(Image Processing _F21)

The filter circuit 172 executes formulae (d-4) to (d-6) shown below to calculate the pixel values $R12_E$, $G12_E$, and $B12_E$.

$$R12_E = R1 \times GA11_{RE} \qquad \text{(d-4)}$$

$$G12_E = G1 \times GA11_{GE} \qquad \text{(d-5)}$$

$$B12_E = B1 \times GA11_{BE} \qquad \text{(d-6)}$$

(Image Processing _F22)

The filter circuit 172 executes formulae (d-7) to (d-9) shown below to calculate the pixel values $R12_E$, $G12_E$, and $B12_E$.

$$R12_E = R1 \times GA12_{RE} \qquad \text{(d-7)}$$

$$G12_E = G1 \times GA12_{GE} \qquad \text{(d-8)}$$

$$B12_E = B1 \times GA12_{BE} \qquad \text{(d-9)}$$

(Image Processing _F23)

The filter circuit 172 executes formulae (d-10) to (d-12) shown below to calculate the pixel values $R12_E$, $G12_E$, and $B12_E$.

$$R12_E = R1 \times GA13_{RE} \qquad \text{(d-10)}$$

$$G12_E = G1 \times GA13_{GE} \qquad \text{(d-11)}$$

$$B12_E = B1 \times GA13_{BE} \qquad \text{(d-12)}$$

(Transmission of Data)

The filter circuit 172 sends the image data DT12_e to the data processing circuit 173. When the data processing circuit 173 uses the attribute data CATT, the attribute data CATT is also sent to the data processing circuit 173. To process the image data of one frame, the above steps are repeated a predetermined number of times.

Embodiment 2

This embodiment will describe a display system including a hybrid display panel.

<ER Display System>

Figure 15:
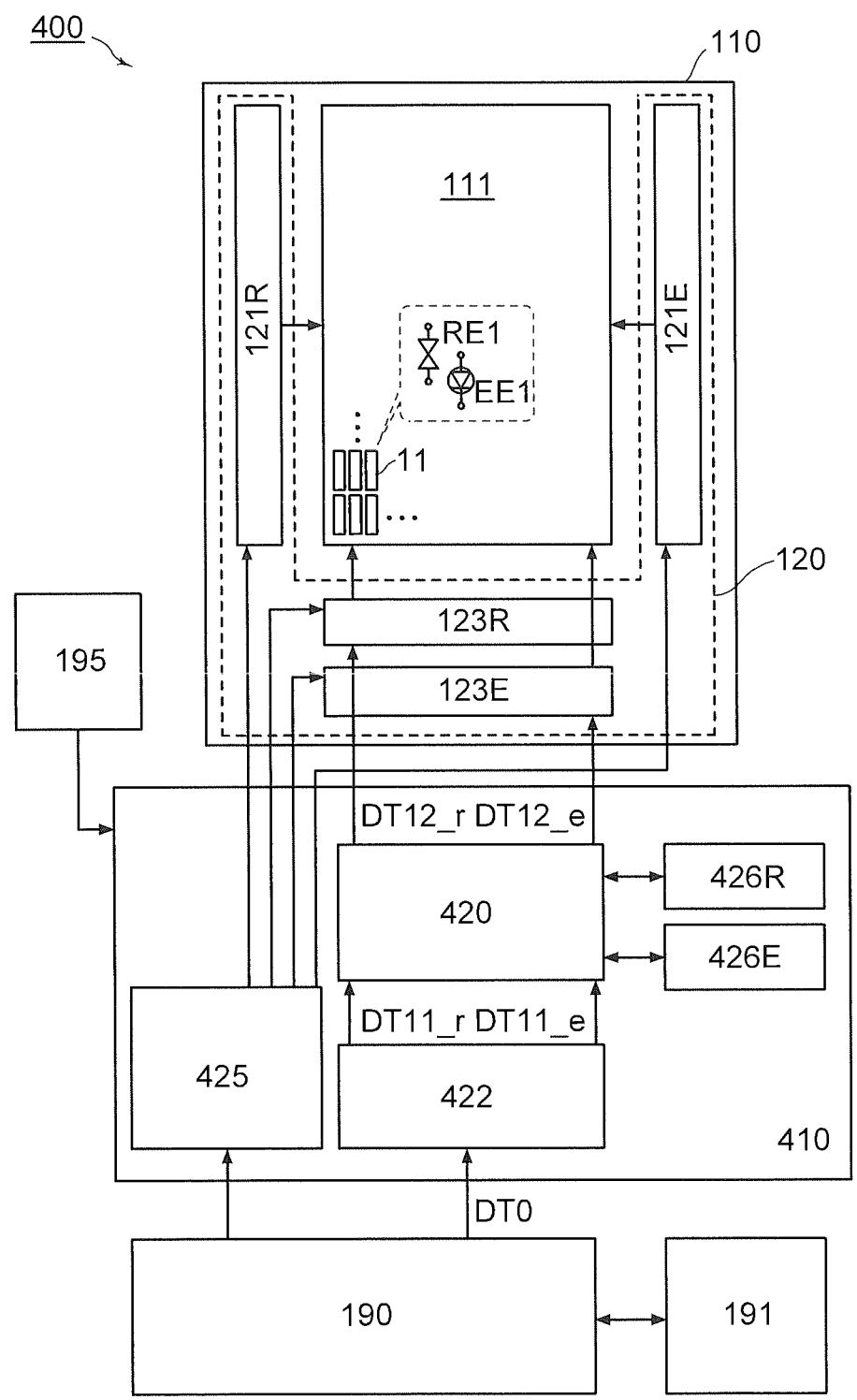
FIG. 15 is a functional block diagram illustrating a configuration example of a display system.

FIG. 15 is a block diagram illustrating a configuration example of an ER display system. An ER display system 400 in FIG. 15 includes the ER panel 110, a display controller 410, the application processor 190, the memory device 191, and an optical sensor 195.

The display controller 410 is a controller for driving the ER panel 110. The display controller 410 includes an image processing circuit 420, a filter circuit 422, a timing controller 425, and memory devices 426E and 426R.

A timing signal (e.g., a clock signal or a synchronization signal), a command signal, and the like are sent from the application processor 190 to the timing controller 425. The timing controller 425 generates a timing signal on the basis of a signal sent from the application processor 190. The timing signal is a signal for setting an operation timing of the peripheral circuit 120, and is, for example, a clock signal, a start pulse signal, or a pulse-width control signal.

Note that FIG. 15 is just a functional block diagram; for example, the image processing circuit 420 does not necessarily consist of one circuit. Processing by the image processing circuit 420 and that by the filter circuit 422 may be executed by one processing circuit (e.g., an FPGA).

The application processor 190 reads image data from the memory device 191, processes the read image data, and sends the processed image data to the display controller 410. The display controller 410 performs filtering on the received image data using the filter circuit 422 and generates the LC image data and the EL image data. The display controller 410 transmits the processed LC image data to the source driver 123R and transmits the processed EL image data to the source driver 123E.

The display controller 410 includes the memory device 426R as a frame memory for storing the LC image data and the memory device 426E as a frame memory for storing the EL image data.

<<TXT Mode>>

The ER display system 400 has the same display modes as the ER display system 100. An operation example of the ER display system 400 in the TXT mode is described with reference to FIG. 16. In this example, the ER display system 400 displays the image 180 shown in FIG. 8. Note that in the image 180, the highlights 83 and 84 and the color picture 85 are color regions and the background 80 and the text 81 are black-and-white regions.

In the TXT mode, the color regions are displayed with light emitted by the EL element EE1 in the pixel array 111E while the pixel array 111R does not contribute to the display. The other regions (the above black-and-white regions) are displayed with light reflected by the LC element RE1 in the pixel array 111R while the pixel array 111E does not contribute to the display; the EL element EE1 does not emit light in this case. The display controller 410 processes the image 180 for achieving such hybrid display.

In the display controller 410, the filter circuit 422 performs filtering on the image 180 to generate two images 186E and 186R. The image 186R is the LC image data, and the image 186E is the EL image data. Gray-level data for the color regions of the image 180 is converted into gray-level data for black display in the image 186R. The filtering in the example of FIG. 16 corresponds to processing by which an image is separated into color regions and black-and-white regions. The details of an operation example of the filter circuit 422 are described later.

The image processing circuit 420 processes the images 186E and 186R to generate images 187E and 187R. Processing by the image processing circuit 420 includes gamma correction, dimming, toning, or the like. Parameters for the gamma correction, dimming, or the like can be set on the basis of data of environmental light (e.g., the illuminance or color temperature) obtained by the optical sensor 195.

Data of the image 187E and that of the image 187R are sent to the source driver 123E and the source driver 123R, respectively. The ER panel 110 displays an image 188 that combines the image 187E and the image 187R.

In the TXT mode, light emission from the EL element EE1 does not contribute to the display of the text 81 and the background 80. On the other hand, the highlights 83 and 84 are displayed only with light emission from the EL element EE1 while the LC element RE1 displays black for these regions, whereby the display of the highlights 83 and 84 can be emphasized. Similarly, the color picture 85 is displayed only with light emission from the EL element EEL Accordingly, the ER display system 400 can have high visibility.

In the TXT mode, since part or all of the EL elements EE1 can be in a non-light-emitting state, the ER display system 400 can have reduced power consumption.

Figure 16:
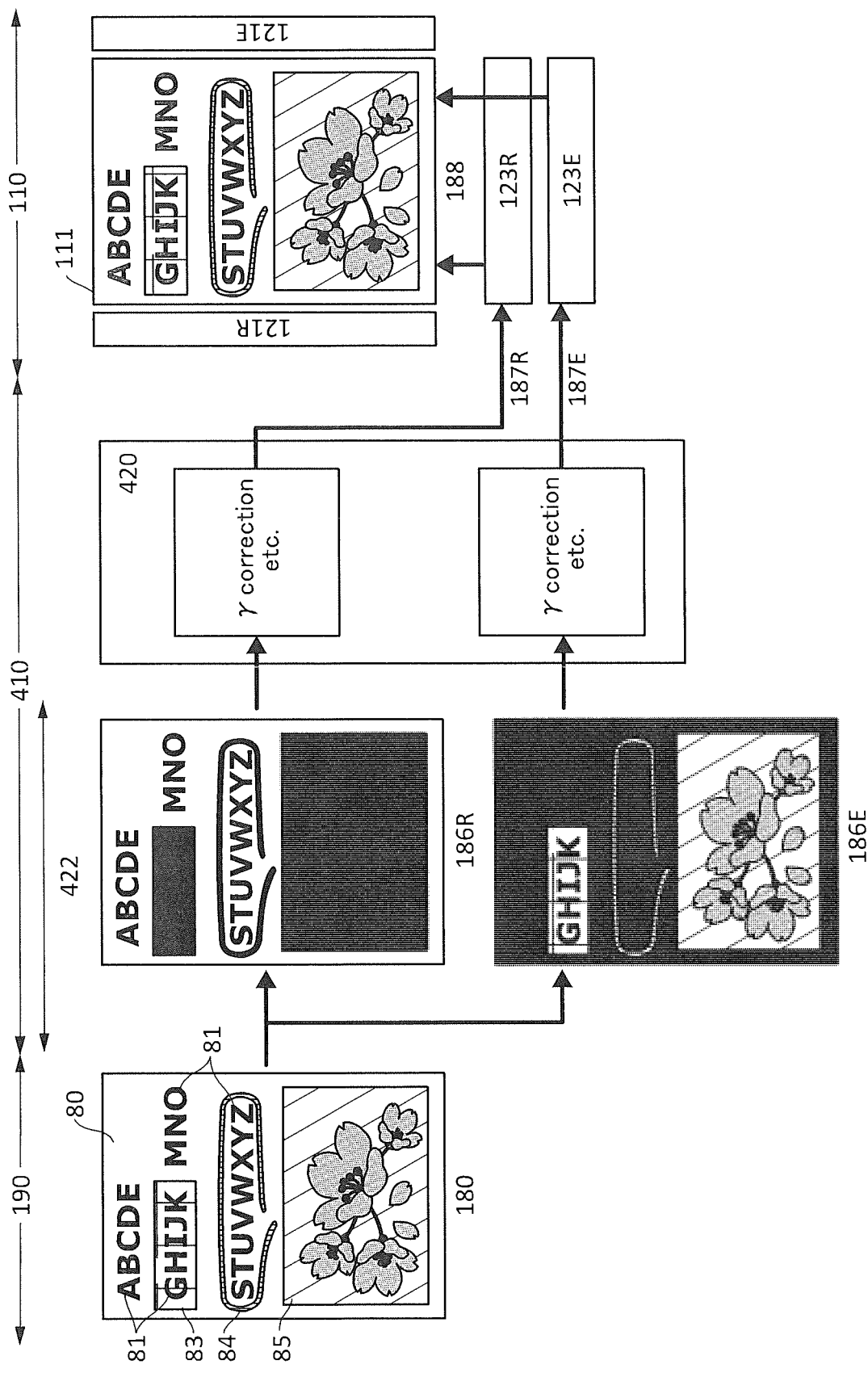
FIG. 16 illustrates a display mode (TXT mode) of an ER display system.

As shown in FIG. 16, the display controller 410 of the ER display system 400 generates the LC image data and the EL image data. Thus, even when the LC panel and the EL panel display different image data, a doubling of the image data amount sent from the application processor 190 to the display controller 410 can be avoided. Accordingly, the load borne by the application processor 190 in image data transmission is reduced, which leads to stable operation of the ER display system 400.

Operation Example 1 of Filter Circuit 422

Figure 17:
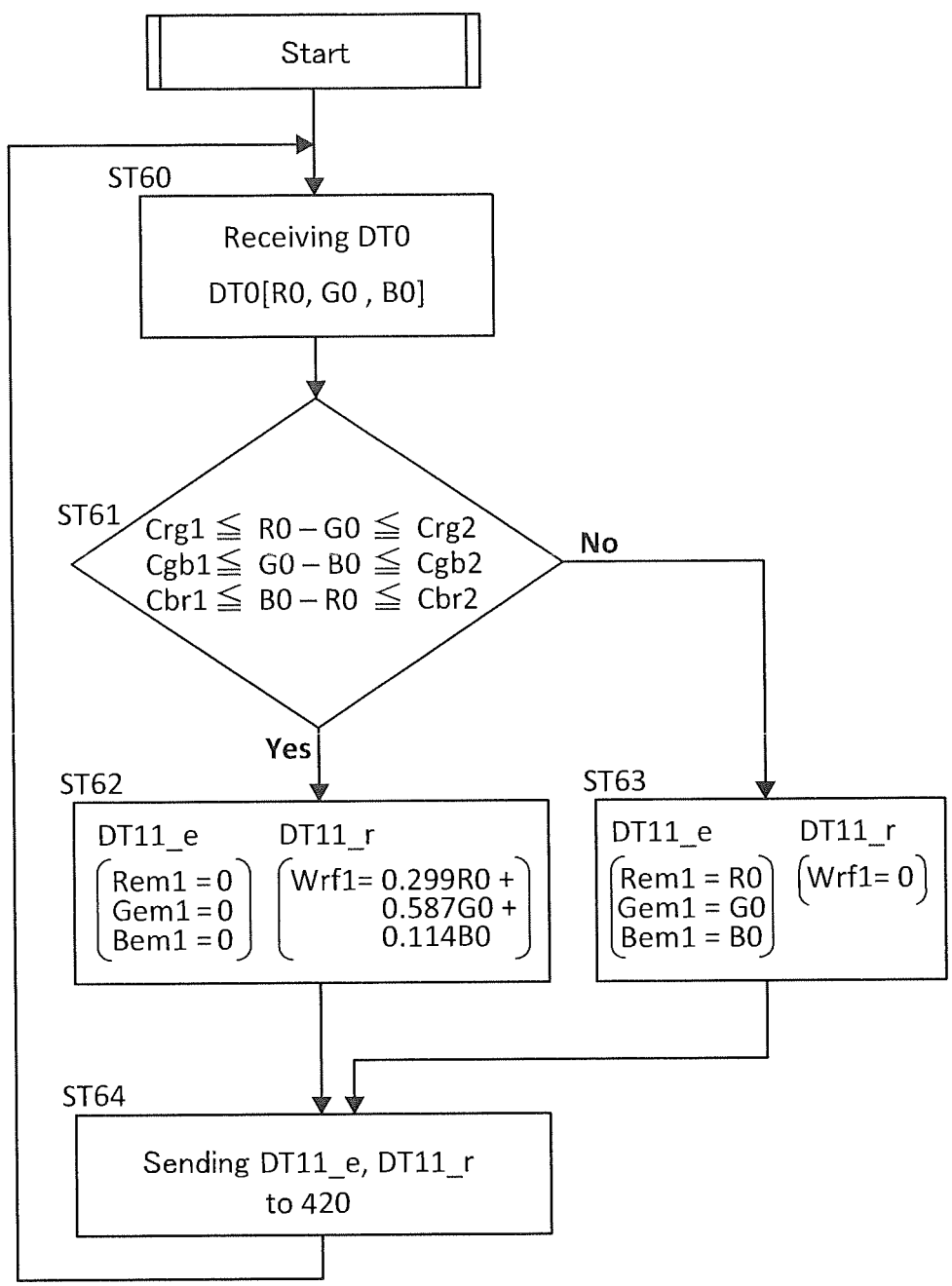
FIG. 17 is a flow chart showing an operation example of a filter circuit in a TXT mode.

An operation example of the filter circuit 422 in the TXT mode is described with reference to FIG. 17. Here, gray-level data has 8 bits (0-255).
(Step ST60)
The filter circuit 422 receives the data DT0[R0, G0, B0] generated by the application processor 190.
(Step ST61)
The filter circuit 422 determines whether an image in each pixel belongs to a color region or a black-and-white region. The step ST61 is a step for determining whether the data DT0 is color data or not. Specifically, the filter circuit 422 performs comparison operations of formulae (f-1) to (f-3) shown below. The parameters Crg1, Crg2, Cgb1, and the like in the formulae are set by a register of the display controller 410. The parameters Crg1, Cgb1, and Cbr1 may be the same or different. The parameters Crg2, Cgb2, and Cbr2 may be the same or different.

$$Crg1 \le R0-G0 \le Crg2 \tag{f-1}$$

$$Cgb1 \le G0-B0 \le Cgb2 \tag{f-2}$$

$$Cbr1 \le B0-R0 \le Cbr2 \tag{f-3}$$

In the case where all the comparison operations of the formulae (f-1) to (f-3) are true, the step ST62 is executed; in the other cases, the step ST63 is executed. In the step ST61, when any of differences between RGB data is out of the predetermined range, the data DT0 is determined as color data; when the differences are within the predetermined ranges, the data DT0 is determined as black-and-white data. Here, the black-and-white data means achromatic color data, and includes grayscale data in its category in addition to binary black-and-white data.

In the steps ST62 and ST63, the filter circuit 422 generates data DT11_e and DT11_r from the data DT0. The data DT11_e is image data for one pixel of the image 186E, and includes RGB data [Rem1, Gem1, Bem1]. The data DT11_r is image data for one pixel of the image 186R. The data DT11_r does not have the attributes of a color phase and saturation but only has luminance data (Wrf1) The luminance data is also 8-bit data.
(Step ST62)
In the step ST62, the data DT11_e[Rem1, Gem1, Bem1] for EL is generated by converting the data DT0 into black display data. Specifically, the filter circuit 422 generates the data DT11_e through calculations of formulae (f-4) to (f-6).

$$Rem1=0 \tag{f-4}$$

$$Gem1=0 \tag{f-5}$$

$$Bem1=0 \tag{f-6}$$

Here, the values of the RGB data of the data DT11_e are all "0"; however, the values are not limited thereto as long as the data DT11_e allows the subpixels 13R, 13G, and 13B to display black.

The data DT11_r[Wrf1] for LC is generated by converting the data DT0 into grayscale data. Specifically, the filter circuit 422 executes a conversion formula (f-7) shown below.

$$Wrf1=0.299R0+0.587G0+0.114B0 \tag{f-7}$$

For the formula (f-7), a formula defined by the ITU-R BT.601 standard, by which RGB data is converted into luminance data, is used; however, a formula by which RGB data is converted into grayscale data is not limited to the formula (f-7).
(Step ST63)
In the step ST63, the filter circuit 422 calculates conversion formulae (f-8) to (f-10) shown below to generate the data DT11_e from the data DT0. Here, the data DT0 is used as the data DT11_e without a change.

$$Rem1=0 \tag{f-8}$$

$$Gem1=0 \tag{f-9}$$

$$Bem1=0 \tag{f-10}$$

The filter circuit 422 calculates the following formula (f-11) to generate the data DT11_r. The data DT11_r is data with a luminance of "0" (black display data).

$$Wrf1=0 \tag{f-11}$$

(Step ST64)
The filter circuit 422 sends the data DT11_e and DT11_r to the image processing circuit 420. The filter circuit 422 repeats the steps ST60 to ST64 the same number of times as the number of pixels, thereby generating the data DT11_e and DT11_r of one frame.

The image processing circuit 420 processes the received data DT11_e and DT11_r to generate the data DT12_e [Rem2, Gem2, Bem2] and DT12_r[Wrf2]. The display controller 410 sends the data DT12_e to the source driver 123E and the data DT12_r to the source driver 123R.

The source driver 123E processes the data DT12_e [Rem1, Gem1, Bem1] to generate data signals to be written in the source lines SL2_R, SL2_G, and SL2_B. The source driver 123R processes the data DT12_r[Wrf2] to generate data signals to be written in the source lines SL1_W1, SL1_W2, and SL1_W3. The data signals for the source lines SL1_W1, SL1_W2, and SL1_W3 have the same gray-level data; however, the polarity of the data signal for the source line SL_W2 may be different from those of the data signals for the source lines SL1_W1 and SL1_W3 depending on the driving method of the pixel array 111R (e.g., gate line inversion driving, source line inversion driving, frame inversion driving, or dot inversion driving).

Figure 18:
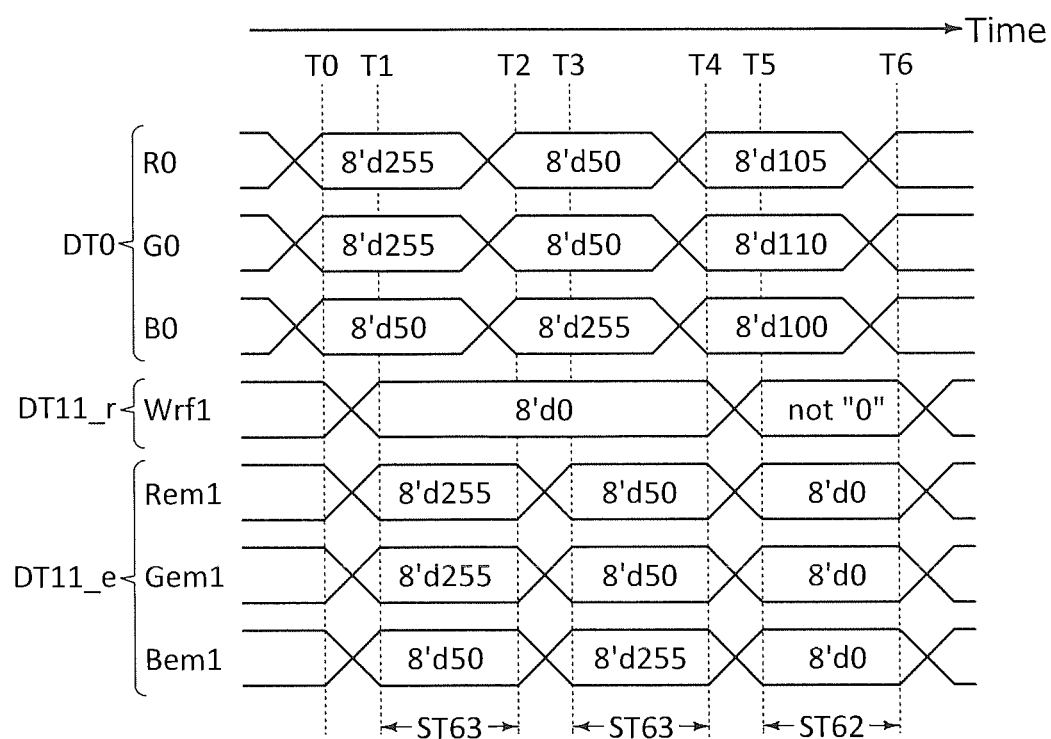
FIG. 18 is a timing chart showing an operation example of a filter circuit in a TXT mode.

A specific operation example of the filter circuit 422 is described with reference to FIG. 18. The parameter is set as follows.

$$Crg1=Cgb1=Cbr1=-15$$

$$Crg2=Cgb2=Cbr2=15$$

At a time T0, the filter circuit 422 receives the data DT0[8'd255, 8'd255, 8'd50]. In a period from the time T0 to a time T1, the filter circuit 422 executes the step ST61. Since R0−G0=255−255=0, G0−B0=255−50=205, and B0−R0=50−255=−205, the formula (f-1) is true and the formulae (f-2) and (f-3) are false.

Since the step ST61 is false, the filter circuit 422 executes the step ST63 in a period from the time T1 to a time T2. The following calculations are executed to generate the data DT11_*r* and DT11_*e*.

$Rem1=R0=8'd255$ $Gem1=G0=8'd255$ $Bem1=B0=8'd50$ $Wrf1=8'd0$

After a predetermined period from the time T1, the filter circuit 422 starts to send the generated data DT11_*r*[8'd0] and DT11_*e*[8'd255, 8'd255, 8'd50] to the image processing circuit 420 (step ST64).

At a time T2, the filter circuit 422 receives the data DT0[8'd50, 8'd50, 8'd255]. In a period from the time T2 to a time T3, the filter circuit 422 executes the step ST61. Since R0−G0=50−50=0, G0−B0=50−255=−205, and B0−R0=255−50=205, the formula (f-1) is true and the formulae (f-2) and (f-3) are false.

Thus, the filter circuit 422 executes the step ST63 in a period from the time T3 to a time T4. The following calculations are executed to generate the data DT11_*r* and DT11_*e*.

$Rem1=R0=8'd50$ $Gem1=G0=8'd50$ $Bem1=B0=8'd255$ $Wrf1=8'd0$

After a predetermined period from the time T3, the filter circuit 422 starts to send the generated data DT11_*r*[8'd0] and DT11_*e*[8'd50, 8'd50, 8'd255] to the image processing circuit 420 (step ST64).

At the time T4, the filter circuit 422 receives the data DT0[8'd105, 8'd110, 8'd100]. In a period from the time T4 to a time T5, the filter circuit 422 executes the step ST61. Since R0−G0=105−110=−5, G0−B0=110−100=10, and B0−R0=100−105=−5, the step ST61 is true.

In a period from the time T5 to a time T6, the filter circuit 422 executes the step ST62 to generate the data DT11_*r* and DT11_*e*. From the formula (f-7), Wrf1=0.299×105+0.587×110+0.114×100 is calculated to obtain the data DT11_*r* [8'd108]. From the formulae (f-4) to (f-6), the data DT11_*e* [8'd0, 8'd0, 8'd0] is obtained.

After a predetermined period from the time T5, the filter circuit 422 starts to send the generated data DT11_*r*[8'd108] and DT11_*e*[8'd0, 8'd0, 8'd0] to the image processing circuit 420 (step ST64).

Operation Example 2 of Filter Circuit 422

Figure 19:
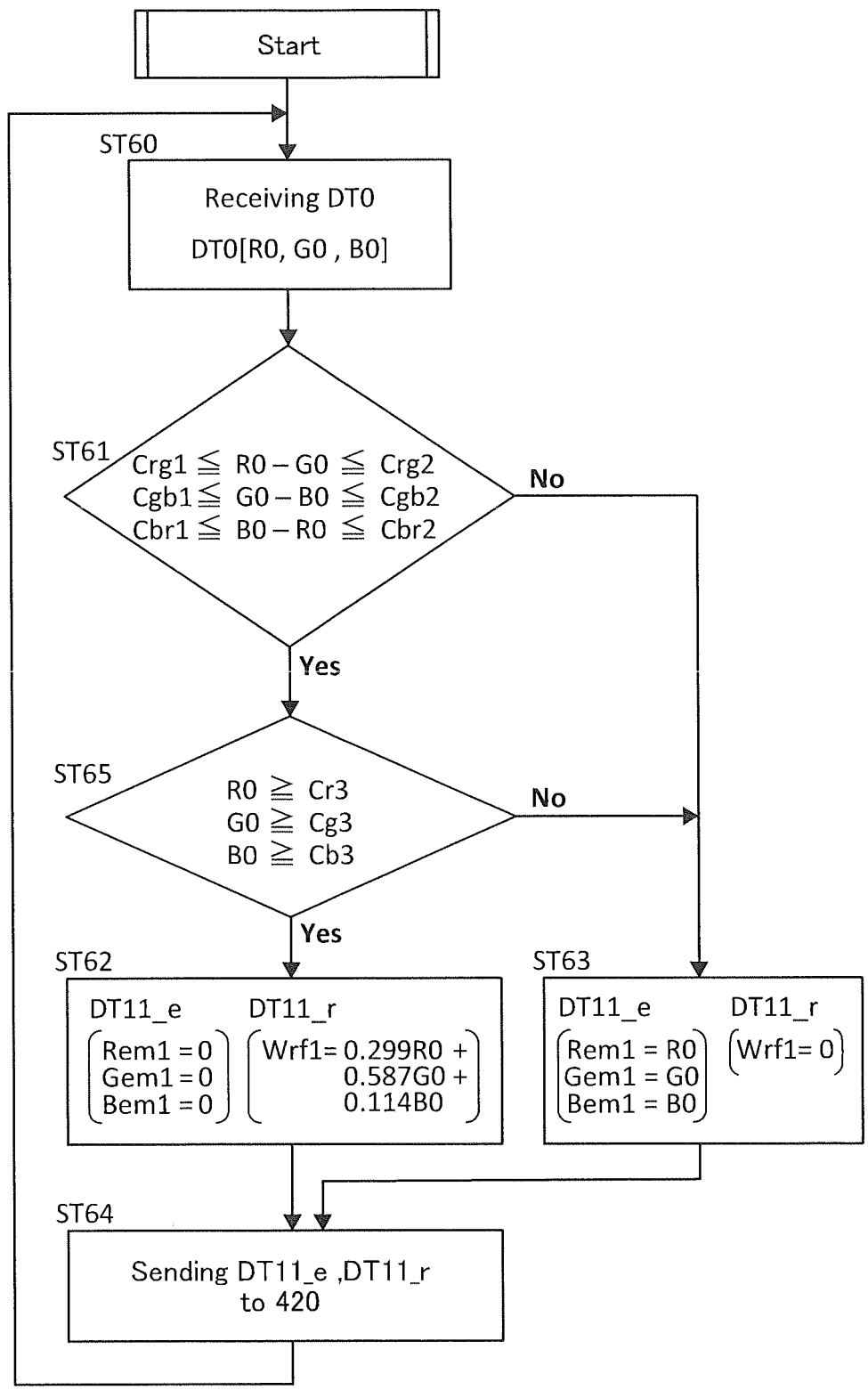
FIG. 19 is a flow chart showing an operation example of a filter circuit in a TXT mode.

Another operation example of the filter circuit 422 in the TXT mode is described with reference to FIG. 19. The operation flow chart in FIG. 19 is a modification example of that in FIG. 17, and additionally includes a step ST65. The steps ST61 and ST65 determine whether the data DT0 is color data.

(Step ST65)

When the step ST61 is true, the step ST65 is executed. The filter circuit 422 performs comparison operations of formulae (f-12) to (f-14) shown below. In the formulae, Cr3, Cg3, and Cb3 are a parameter used by the filter circuit 422 and set by the register of the display controller 410. Here, Cr3, Cg3, and Cb3 are threshold values in the filtering. The values Cr3, Cg3, and Cb3 may be the same or different.

$R0 \geq Cr3$ (f-12)

$G0 \geq Cg3$ (f-13)

$B0 \geq Cb3$ (f-14)

In the case where all the comparison operations of the formulae (f-12) to (f-14) are true, the step ST62 is executed; in the other cases, the step ST63 is executed. That is, when the formulae (f-1) to (f-3) and the formulae (f-12) to (f-14) are all true, the step ST62 is executed; in the other cases, the step ST63 is executed.

The data DT0 determined in the step ST65 is data that has been determined as grayscale data in the step ST61. Through execution of the step ST65, data in which all the RGB data are higher than or equal to the threshold values can be extracted. The data DT12_*r* displayed by the LC element RE1 is grayscale data extracted in the step ST65.

Figure 20:
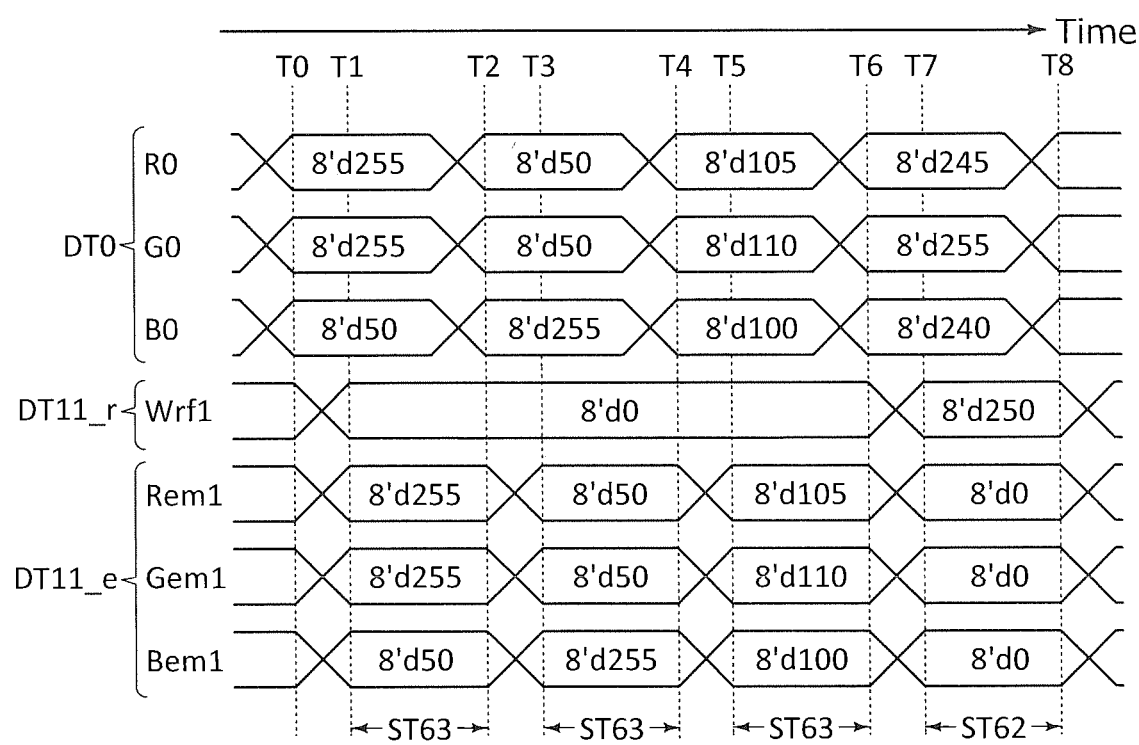
FIG. 20 is a timing chart showing an operation example of a filter circuit in a TXT mode.

A specific example of the operation example 2 is described with reference to FIG. 20. The parameters are set as follows.

$Crg1=Cgb1=Cbr1=-15$ $Crg2=Cgb2=Cbr2=15$ $Cr3=Cg3=Cb3=200$

In this case, white display data and high gray-level data close thereto are extracted from the grayscale data through the step ST65. When the data DT0 is such grayscale data, the data DT0 is displayed by the LC element RE1 in grayscale. In the other cases, the data DT0 is displayed by the EL element EE1 in color.

(Period T0-T2)

The filter circuit 422 receives the data DT0[8'd255, 8'd255, 8'd50]. Since the result of the comparison operations in the step ST61 is false, the filter circuit 422 executes the step ST63 to generate the data DT11_*r*[8'd0] and DT11_*e* [8'd255, 8'd255, 8'd50], and sends the generated data DT11_*r* and DT11_*e* to the image processing circuit 420.

(Period T2-T4)

The filter circuit 422 receives the data DT0[8'd50, 8'd50, 8'd255]. Since the result of the comparison operations in the step ST61 is false, the filter circuit 422 executes the step ST63 to generate the data DT11_*r*[8'd0] and DT11_*e*[8'd50, 8'd50, 8'd255], and sends the generated data DT11_*r* and DT11_*e* to the image processing circuit 420.

(Period T4-T6)

The filter circuit 422 receives the data DT0[8'd105, 8'd110, 8'd100]. The result in the step ST61 is true but that in the step ST65 is false; accordingly, the filter circuit 422 executes the step ST63 to generate the data DT11_*r*[8'd0] and DT11_*e*[8'd105, 8'd110, 8'd100], and sends the generated data DT11_*r* and DT11_*e* to the image processing circuit 420.

The data DT0[8'd105, 8'd110, 8'd100] is determined as grayscale data in the above operation example 1 while determined as color data in the operation example 2. The display method for this data DT0 is different between the operation examples 1 and 2.

In the operation example 2, when the data DT0 that satisfies all the conditions in the step ST61 has one or more of the RGB data smaller than the threshold values, the data DT0 is displayed by the EL element EE1 in color; in that case, the LC element RE1 does not contribute to the display. By optimizing the parameters of the filter circuit 422, grayscale data that is image data with an intermediate grayscale can be displayed only by the EL element EEL For example, the display quality of an image that contains a color image of a natural object or the like including many intermediate grayscales and a binary image including a text and a background can be improved.

(Period T6-T8)

The filter circuit 422 receives the data DT0[8'd245, 8'd255, 8'd240]. Since the result in the step ST61 is true and that in the step ST65 is also true, the filter circuit 422 executes the step ST62 to generate the data DT11_$r$[8'd250] and DT11_$e$[8'd0, 8'd0, 8'd0], and sends the generated data DT11_$r$ and DT11_$e$ to the image processing circuit 420.

<<ER Display System>>

Figure 21:
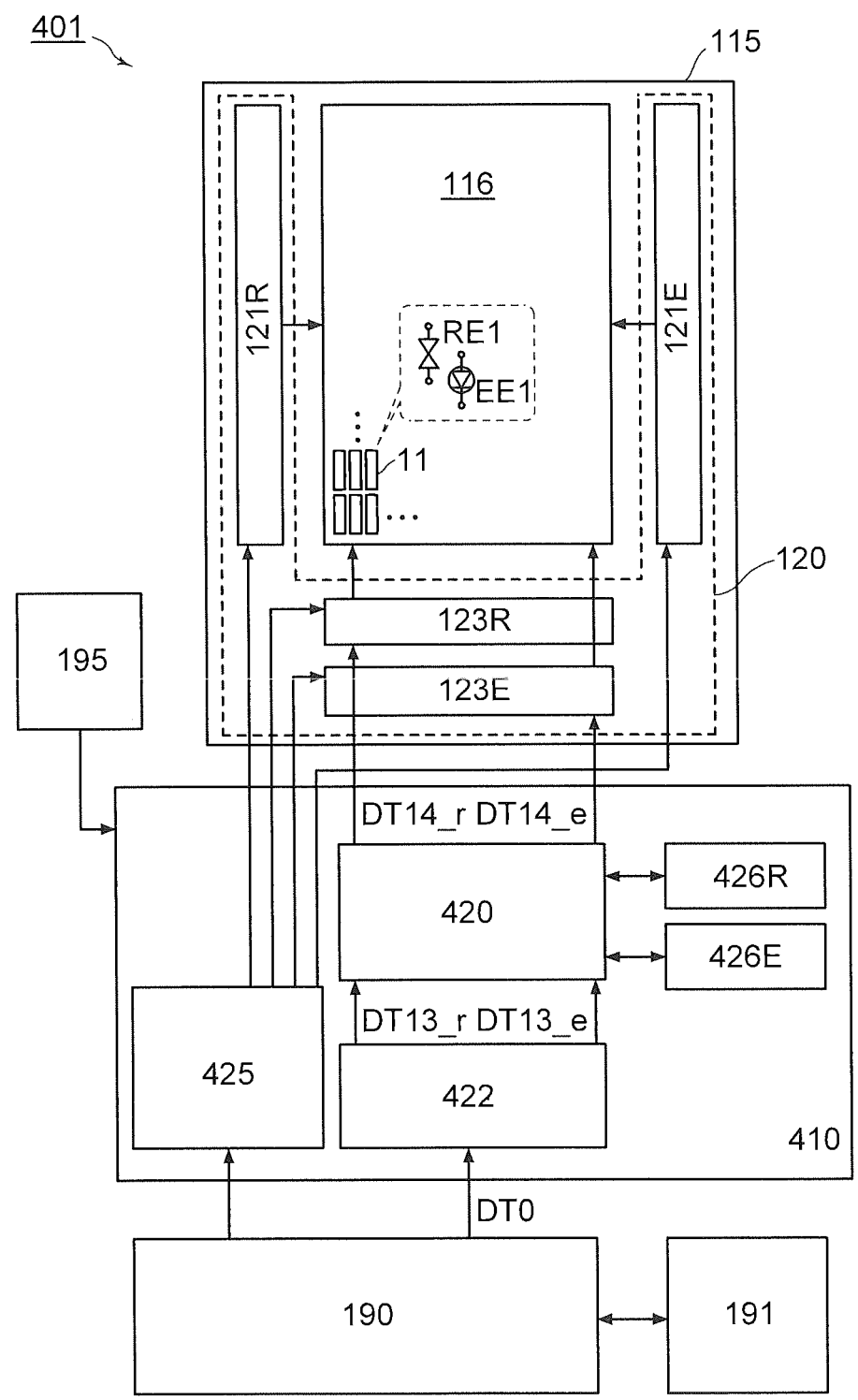
FIG. 21 is a functional block diagram illustrating a configuration example of an ER display system.

An ER display system 401 in FIG. 21 is a modification example of the ER display system 400, and includes the ER panel 115 in place of the ER panel 110. The filter circuit 422 processes the data DT0 sent from the application processor 190 to generate data DT13_$r$ and DT13_$e$. The image processing circuit 420 processes the data DT13_$r$ and DT13_$e$ to generate data DT14_$r$ and DT14_$e$.

Operation Example 3 of Filter Circuit 422

Figure 22:
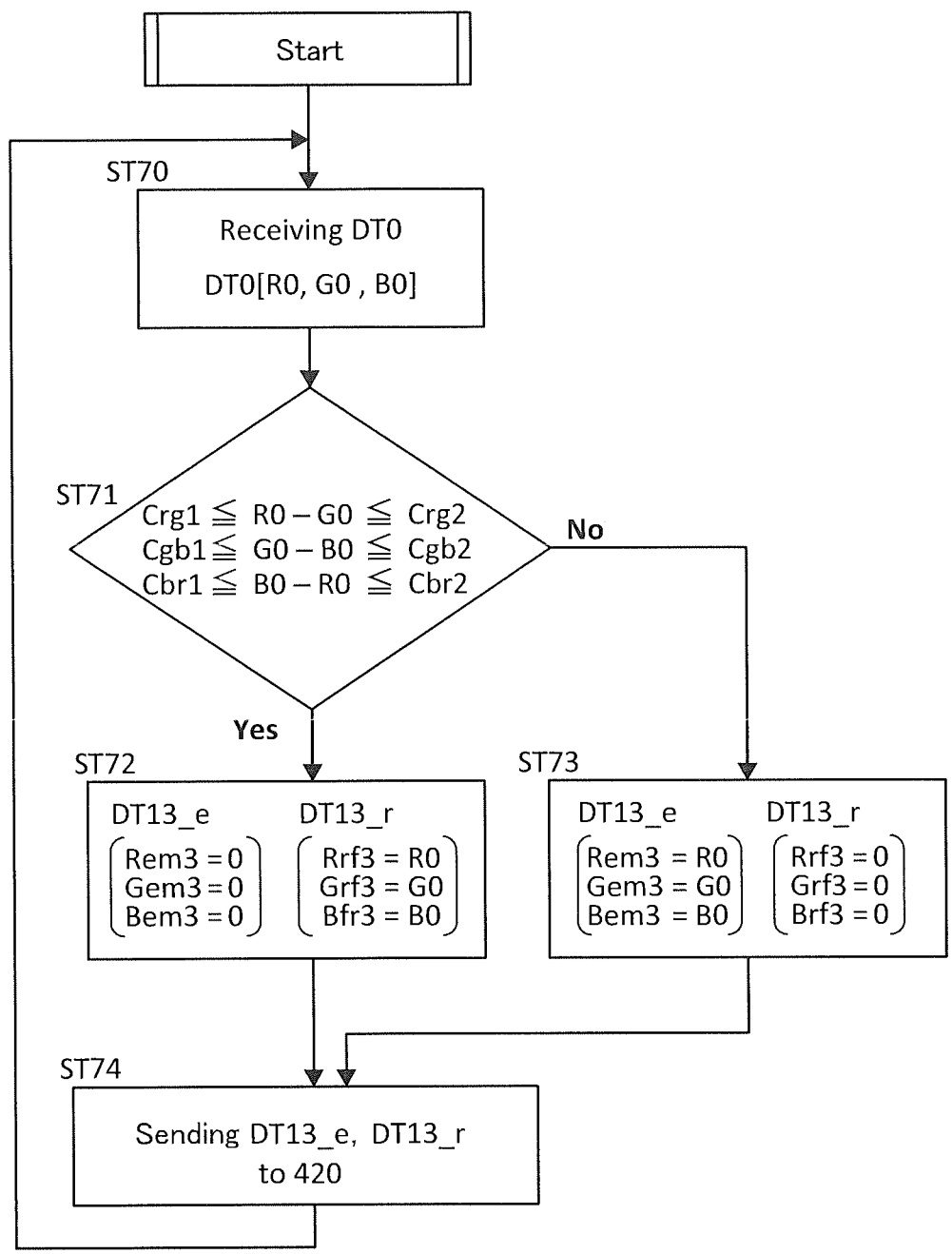
FIG. 22 is a flow chart showing an operation example of a filter circuit in a TXT mode.

An operation example of the filter circuit 422 in the TXT mode is described with reference to FIG. 22. Steps ST70 to ST74 in the operation flow of FIG. 22 correspond to the steps ST60 to ST64 in the operation example 1, respectively.

(Step ST70)

The step ST70 is similar to the step ST60. The filter circuit 422 receives the image data DT0[R0, G0, B0] generated by the application processor 190.

(Step ST71)

The step ST71 is similar to the step ST61. The filter circuit 422 performs comparison operations of formulae (f-21) to (f-23) shown below.

$$Crg1 \leq R0-G0 \leq Crg2 \quad \text{(f-21)}$$

$$Cgb1 \leq G0-B0 \leq Cgb2 \quad \text{(f-22)}$$

$$Cbr1 \leq B0-R0 \leq Cbr2 \quad \text{(f-23)}$$

In the case where all the comparison operations of the formulae (f-21) to (f-23) are true, the step ST72 is executed; in the other cases, the step ST73 is executed. In the steps ST72 and ST73, the filter circuit 422 generates data DT13_$e$ and DT13_$r$ from the data DT0. The data DT13_$e$ is image data for one pixel, and includes RGB data [Rem3, Gem3, Bem3]. The data DT13_$r$ is image data for one pixel, and includes RGB data [Rrf3, Grf3, Brf3].

(Step ST72)

In the step ST72, the data DT13_$e$[Rem3, Gem3, Bem3] for EL is generated by converting the data DT0 into black display data. Specifically, the filter circuit 422 generates the data DT13_$e$ through calculations of formulae (f-24) to (f-26).

$$Rem3=0 \quad \text{(f-24)}$$

$$Gem3=0 \quad \text{(f-25)}$$

$$Bem3=0 \quad \text{(f-26)}$$

Here, the values of the RGB data of the data DT13_$e$ are all "0"; however, the values of the RGB data are not limited thereto as long as the data DT13_$e$ allows the subpixels 13R, 13G, and 13B to display black.

The filter circuit 422 calculates conversion formulae (f-27) to (f-29) shown below to generate the data DT13_$r$ from the data DT0. Here, the data DT0 is used as the data DT13_$r$ without a change.

$$Rrf3=R0 \quad \text{(f-27)}$$

$$Grf3=G0 \quad \text{(f-28)}$$

$$Brf3=B0 \quad \text{(f-29)}$$

(Step ST73)

In the step ST73, the filter circuit 422 calculates conversion formulae (f-30) to (f-32) shown below to generate the data DT13_$e$ from the data DT0. Here, the data DT0 is used as the data DT13_$e$ without a change.

$$Rem3=R0 \quad \text{(f-30)}$$

$$Gem3=G0 \quad \text{(f-31)}$$

$$Bem3=B0 \quad \text{(f-32)}$$

The filter circuit 422 converts the data DT0 into black display data to generate the data DT13_$r$. Thus, the filter circuit 422 calculates formulae (f-33) to (f-35) shown below.

$$Rrf3=0 \quad \text{(f-33)}$$

$$Grf3=0 \quad \text{(f-34)}$$

$$Brf3=0 \quad \text{(f-35)}$$

Here, the values of the RGB data of the data DT13_$r$ are all "0"; however, the values of the RGB data are not limited thereto as long as the data DT13_$r$ allows the subpixels 12R, 12G, and 12B to display black.

(Step ST74)

The filter circuit 422 sends the data DT13_$e$ and DT13_$r$ to the image processing circuit 420. The filter circuit 422 repeats the steps ST70 to ST74 the same number of times as the number of pixels, thereby generating the data DT13_$e$ and DT13_$r$ of one frame.

The image processing circuit 420 processes the received data DT13_$e$ and DT13_$r$ to generate the data DT14_$e$ [Rem4, Gem4, Bem4] and DT14_$r$[Rrf4, Grf4, Brf4]. The display controller 410 sends the data DT14_$e$ to the source driver 123E and the data DT14_$r$ to the source driver 123R.

The source driver 123E processes the data DT14_$e$ [Rem4, Gem4, Bem4] to generate data signals to be written in the source lines SL2_R, SL2_G, and SL2_B. The source driver 123R processes the data DT14_$r$[Rrf4, Grf4, Brf4] to generate data signals to be written in source lines SL1_R, SL1_G, and SL1_B.

Figure 23:
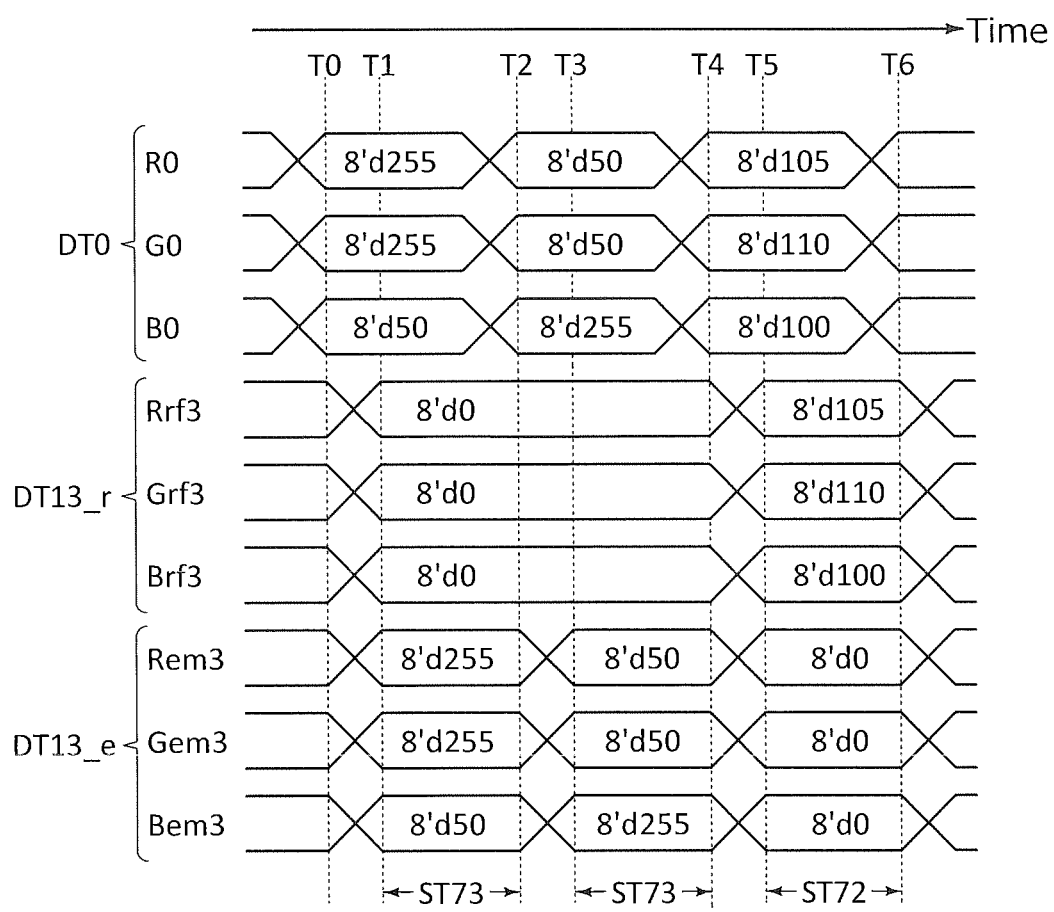
FIG. 23 is a timing chart showing an operation example of a filter circuit in a TXT mode.

A specific example of the operation example 3 is described with reference to FIG. 23. The parameters are set as follows.

$$Crg1=Cgb1=Cbr1=-15$$

$$Crg2=Cgb2=Cbr2=15$$

(Period T0-T2)

The filter circuit 422 receives the data DT0[8'd255, 8'd255, 8'd50]. Since the step ST71 is false, the filter circuit 422 executes the step ST73 to generate the data DT13_$r$ [8'd0, 8'd0, 8'd0] and DT13_$e$[8'd255, 8'd255, 8'd50]. The generated data DT13_$r$ and DT13_$e$ are sent to the image processing circuit 420.

(Period T2-T4)

The filter circuit 422 receives the data DT0[8'd150, 8'd50; 8'd255]. Since the step ST71 is false, the filter circuit 422 executes the step ST73 to generate the data DT13_$r$[8'd0, 8'd0, 8'd0] and DT13_e[8'd50, 8'd50, 8'd255]. The generated data DT13_r and DT13_e are sent to the image processing circuit 420.
(Period T4-T6)

The filter circuit 422 receives the data DT0[8'd105, 8'd110, 8'd100]. Since the step ST71 is true, the filter circuit 422 executes the step ST72 to generate the data DT13_r [8'd105, 8'd110, 8'd100] and DT13_e[8'd0, 8'd0, 8'd0]. The generated data DT13_r and DT13_e are sent to the image processing circuit 420.

Operation Example 4 of Filter Circuit 422

Figure 24:
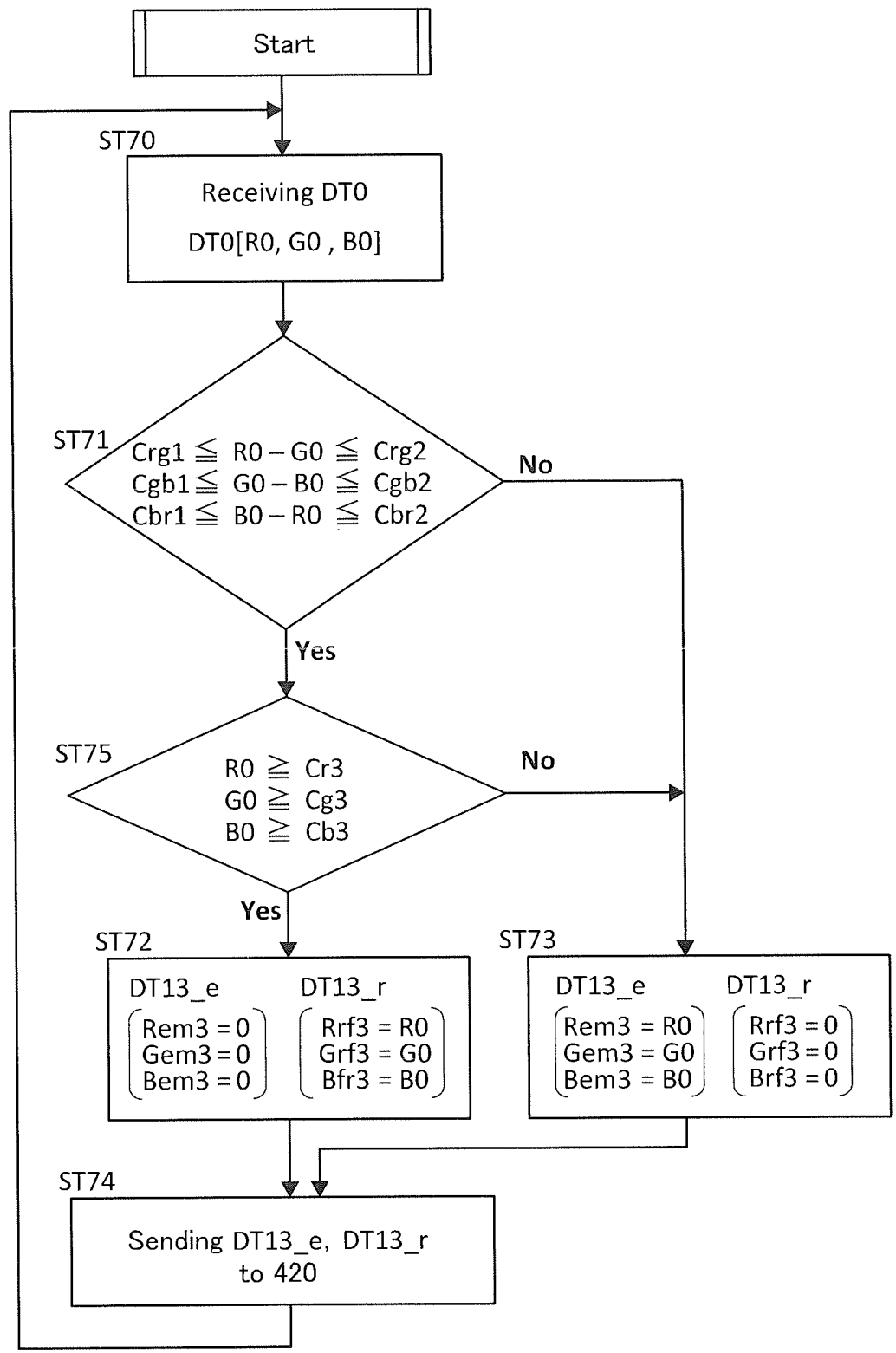
FIG. 24 is a flow chart showing an operation example of a filter circuit in a TXT mode.

Another operation example of the filter circuit 422 in the TXT mode is described with reference to FIG. 24. The operation flow chart in FIG. 24 is a modification example of that in FIG. 22, and additionally includes a step ST75. The steps ST71 and ST75 determine whether the data DT0 is color data.
(Step ST75)

When the step ST71 is true, the step ST75 is executed. The step ST75 is similar to the step ST65 of the operation example 2 (see FIG. 19). The filter circuit 422 performs comparison operations of formulae (f-36) to (f-38) shown below $$R0 \geq Cr3 \quad (f-36)$$

$$G0 \geq Cg3 \quad (f-37)$$

$$B0 \geq Cb3 \quad (f-38)$$

In the operation example 4, when all the formulae (f-21) to (f-23) and (f-36) to (f-38) are true, the step ST72 is executed; in the other cases, the step ST73 is executed.

Figure 25:
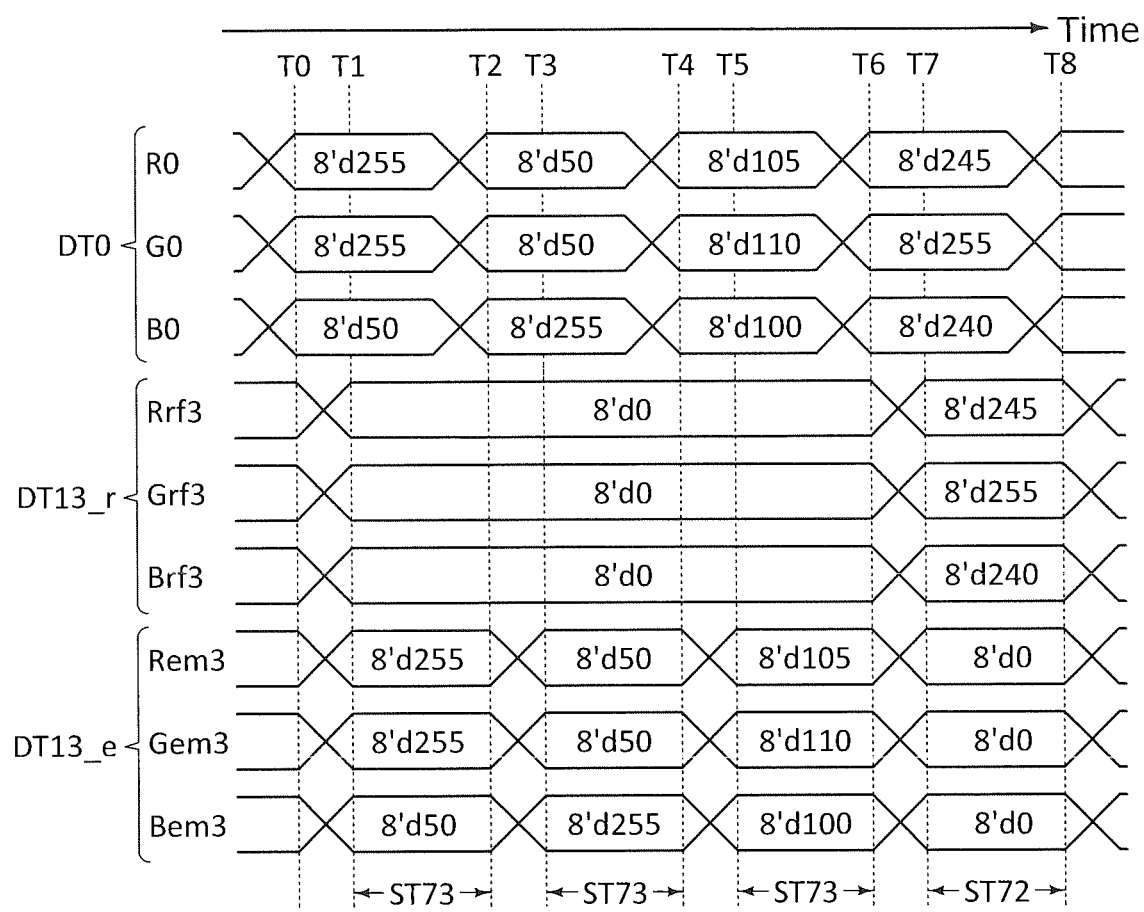
FIG. 25 is a timing chart showing an operation example of a filter circuit in a TXT mode.

A specific example of the operation example 4 is described with reference to FIG. 25. The parameters are set as follows.

$$Crg1 = Cgb1 = Cbr1 = -15$$

$$Crg2 = Cgb2 = Cbr2 = 15$$

$$Cr3 = Cg3 = Cb3 = 200$$

(Period T0-T2)

The filter circuit 422 receives the data DT0[8'd255, 8'd255, 8'd50]. Since the step ST71 is false, the filter circuit 422 executes the step ST73 to generate the data DT13_r [8'd0, 8'd0, 8'd0] and DT13_e[8'd255, 8'd255, 8'd50]. The generated data DT13_r and DT13_e are sent to the image processing circuit 420.
(Period T2-T4)

The filter circuit 422 receives the data DT0[8'd50, 8'd50, 8'd255]. Since the step ST71 is false, the filter circuit 422 executes the step ST73 to generate the data DT13_r[8'd0, 8'd0, 8'd0] and DT13_e[8'd50, 8'd50, 8'd255]. The generated data DT13_r and DT13_e are sent to the image processing circuit 420.
(Period T4-T6)

The filter circuit 422 receives the data DT0[8'd105, 8'd110, 8'd100]. Since the step ST71 is true and the step ST75 is false, the filter circuit 422 executes the step ST73 to generate the data DT13_r[8'd0, 8'd0, 8'd0] and DT13_e [8'd105, 8'd110, 8'd100]. The generated data DT13_r and DT13_e are sent to the image processing circuit 420.
(Period T6-T8)

The filter circuit 422 receives the data DT0[8'd245, 8'd255, 8'd240]. Since the step ST71 is true and the step ST75 is also true, the filter circuit 422 executes the step ST72 to generate the data DT13_r[8'd245, 8'd255, 8'd240] and DT13_e[8'd0, 8'd0, 8'd0]. The generated data DT13_r and DT13_e are sent to the image processing circuit 420.
<<HY Mode>>

In the HY mode, the luminance of the subpixels 13R, 13G, and 13B is changed in accordance with data (indicating the illuminance or color temperature of environmental light, for example) obtained by the optical sensor 195 and an interruption request based on, for example, an operation by a user. The parameter for dimming is set on the basis of the data obtained by the optical sensor 195 and the interruption request. The image processing circuit 420 performs dimming of the data DT13_e with the use of the set parameter.

(1) To display an image in a bright environment (e.g., outdoors in the sunny daytime), the EL element EE1 in the pixel array 116E does not emit light and only the pixel array 116R performs the display. (2) To display an image in a dark environment (e.g., outdoors in the night time or indoors without illumination), that is, in an environment in which the pixel array 116R cannot perform image display, only the pixel array 116E performs the display. (3) To display an image in an environment with the low illuminance of environmental light (e.g., indoors with illumination or outdoors in cloudy weather) or an environment in which high-quality display cannot be obtained only with light reflected by the LC element RE1, the EL element EE1 emits light and both the pixel arrays 116R and 116E perform the display.

As described above, the luminance of the subpixels 13R, 13G, and 13B can be adjusted in the HY mode in accordance with the brightness of a usage environment, whereby the ER display system 401 can have improved display quality and reduced power consumption. In addition, the IDS driving, which can reduce power consumption, is available in both the TXT mode and the HY mode of the ER display system 401.

In the ER display system in this embodiment, the host device does not need to generate the two kinds of image data (EL image data and LC image data). Accordingly, the load in sending image data from the host device to the display controller can be decreased, which reduces malfunction of the ER display system.

Embodiment 3

The display system in any of the above embodiments can include a touch sensor. In this embodiment, a display system including a touch sensor is described.
<<ER Display System 103>>

Figure 26:
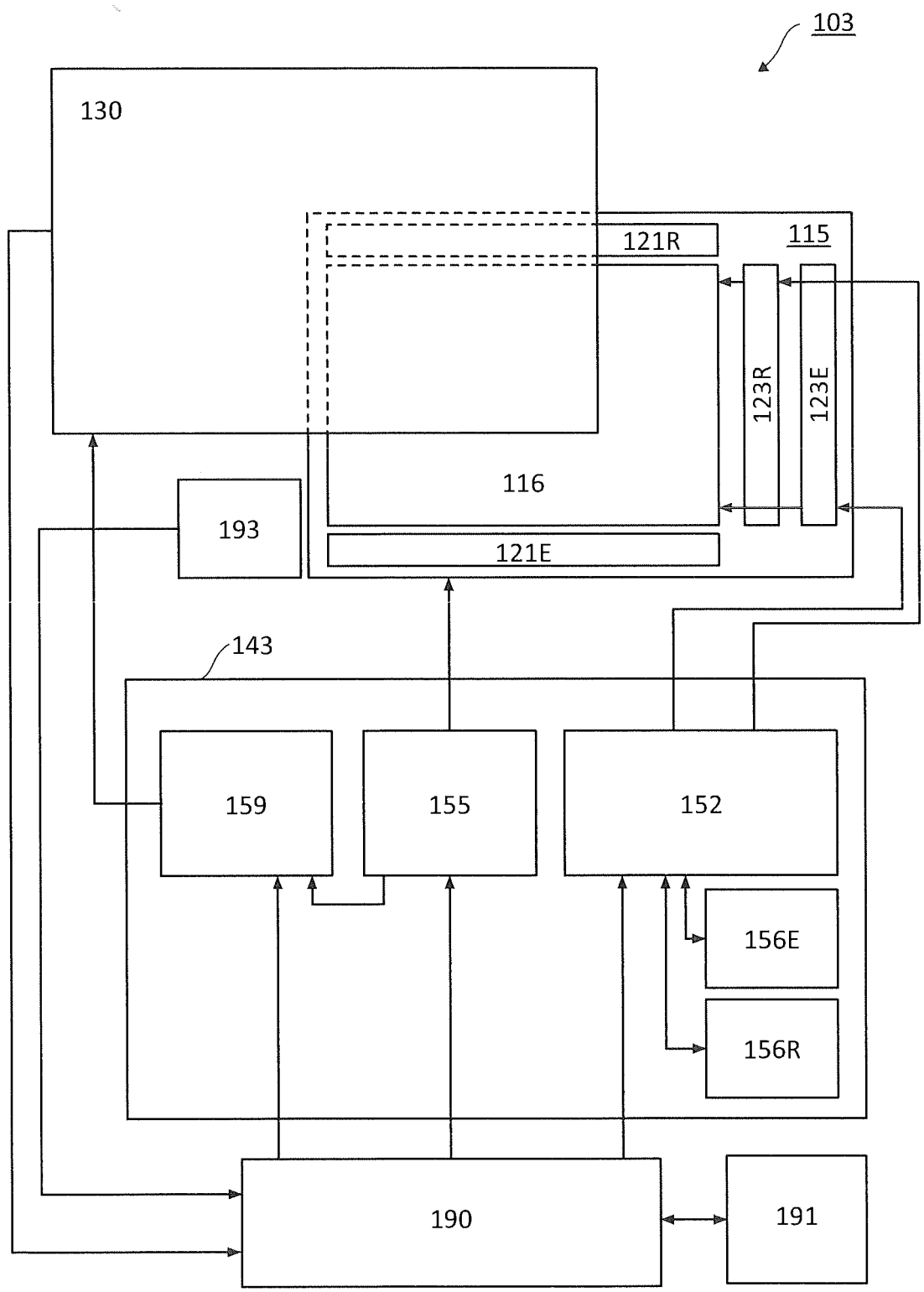
FIG. 26 is a functional block diagram illustrating a configuration example of an ER display system.

FIG. 26 shows a configuration example of an ER display system 103 that is based on the ER display system 101 and includes a touch sensor. The ER display system 103 includes the ER panel 115, a touch sensor 130, a display controller 143, the application processor 190, the memory device 191, and the sensor portion 193.

The display controller 143 includes the image processing portion 152, the timing controller 155, the memory devices 156E and 156R, and a touch sensor controller 159. A clock signal, a synchronization signal, or the like is sent from the application processor to the touch sensor controller 159. The touch sensor controller 159 generates a timing signal for driving the touch sensor 130.

The application processor 190 generates image data that reflects positional data or the like detected by the touch sensor 130.

Figure 27A:
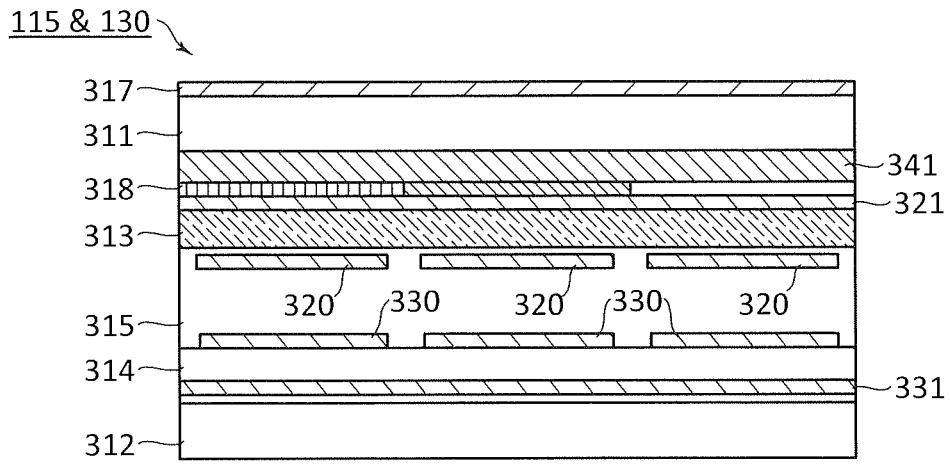
FIGS. 27A and 27B are cross-sectional views each illustrating a structural example of an ER panel.
Figure 27B:
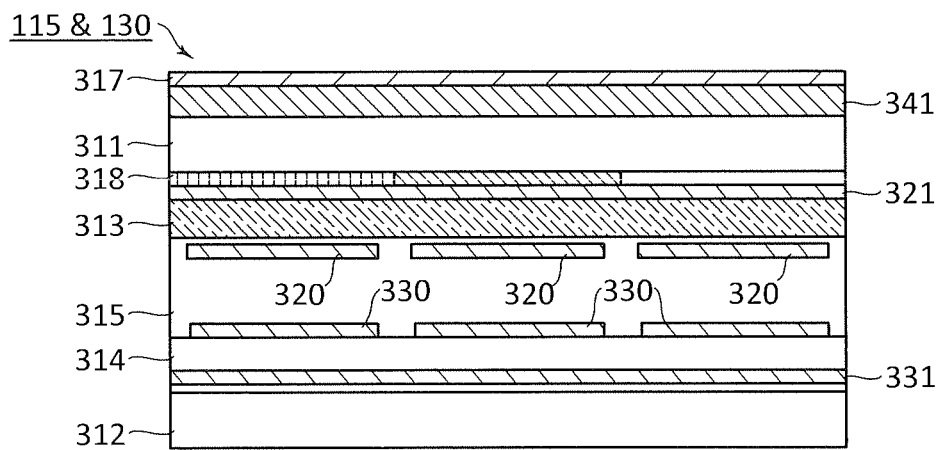

The structure of the touch sensor 130 is roughly classified into an out-cell (external) type and a built-in type. Examples of the structure of a built-in touch sensor are an on-cell type and an in-cell type. In the example of FIG. 27A, the touch sensor 130 is an in-cell touch sensor, and a sensor array 341 is provided on the LC layer 313 side of the substrate 311. FIG. 27B shows an example where the touch sensor 130 is an on-cell touch sensor, and the sensor array 341 is provided on the light extraction side of the substrate 311. The sensor array 341 preferably has a structure that does not block the light 301 to 303.

Figure 27C:
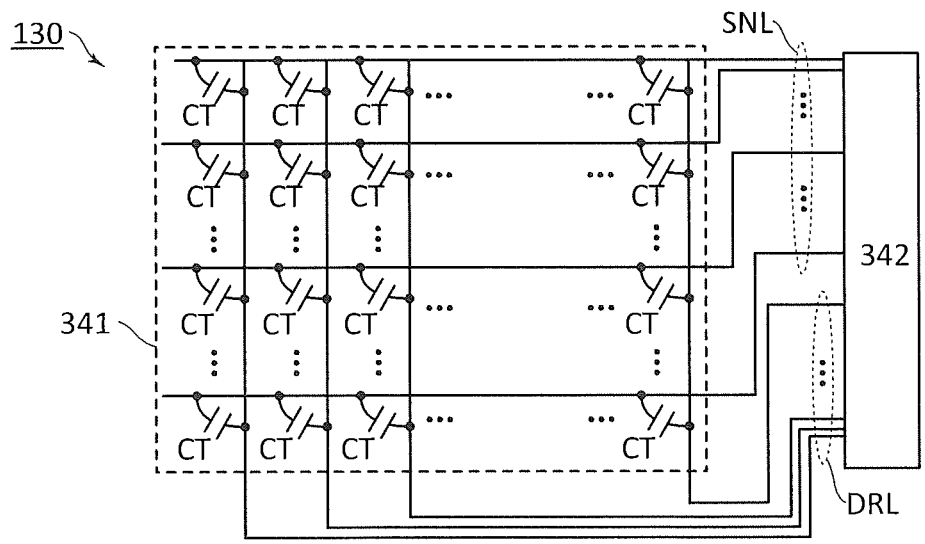
FIG. 27C illustrates a circuit configuration example of a sensor array.

FIG. 27C shows a structure example of the touch sensor 130. The touch sensor 130 in FIG. 27C is a mutual capacitive touch sensor, and includes the sensor array 341 and a touch sensor driver 342. The sensor array 341 includes a plurality of driving lines DRL and a plurality of sensing lines SNL. A capacitor CT is formed between one driving line DRL and one sensing line SNL. The touch sensor driver 342 detects a signal of the sensing line SNL during driving the driving line DRL. The signal of the sensing line SNL has data of the amount of a change in capacitance of the capacitor CT. By analyzing the signal of the sensing line SNL, data about whether touch operation is performed or not, touch position, and the like can be obtained.

Figure 28A:
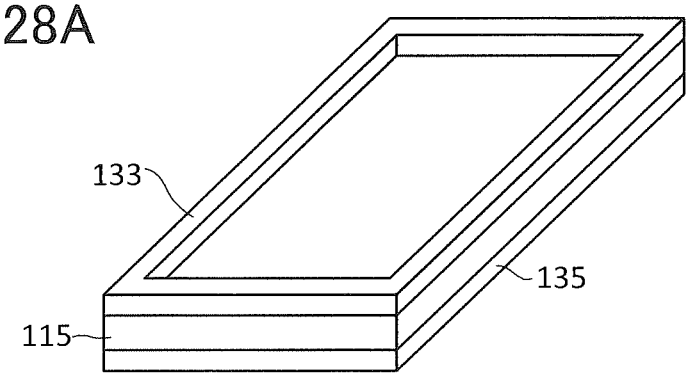
FIGS. 28A to 28C are perspective schematic diagrams illustrating a structural example of an ER panel.

FIG. 28A shows an example where the ER panel 115 is combined with an out-cell touch sensor. In the example of FIG. 28A, an optical touch sensor 133 is provided on the substrate 311 side (light extraction side) of the ER panel 115, and an electromagnetic induction touch sensor 135 is provided on the substrate 312 side.

Figure 28B:
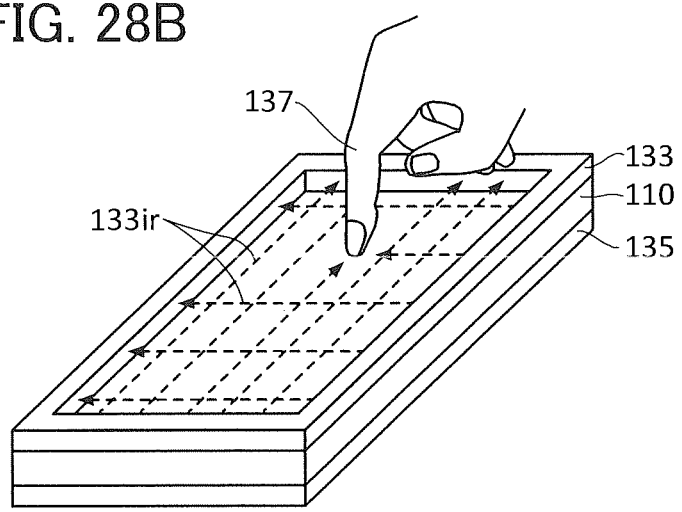

The optical touch sensor 133 includes an infrared LED that emits infrared light 133ir and a light-receiving element (such as an image sensor) that detects the infrared light 133ir. By detecting the signal of the light-receiving element, a position where the infrared light 133ir is blocked by a finger 137 can be detected (see FIG. 28B).

Figure 28C:
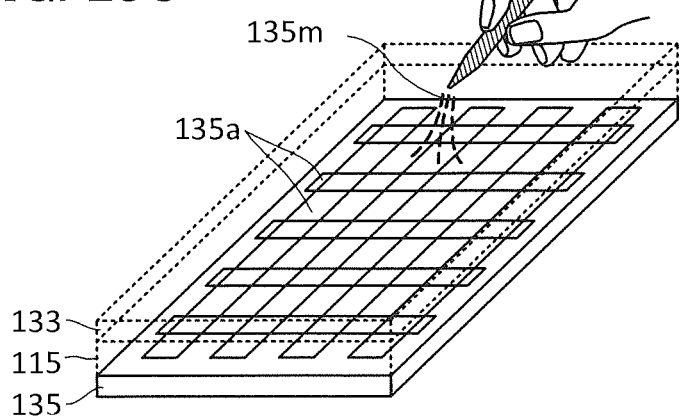

The electromagnetic induction touch sensor 135 includes a sensor coil 135a in a region overlapping with the pixel array 116. The input of a position is performed using an electronic pen 138. Magnetic flux 135m generated between the electronic pen 138 and the sensor coil 135a changes an induced current of the sensor coil 135a. By detecting the amount of the change, the position of the electronic pen 138, the writing pressure, and the like can be detected (see FIG. 28C).

The mutual capacitive touch sensor, the optical touch sensor, and the electromagnetic induction touch sensor are described above; however, the type of touch sensor is not limited thereto. A resistive touch sensor, a surface acoustic wave touch sensor, or the like may be used. One or more kinds of touch sensors can be incorporated in the display system.

<<ER Display System 403>>

Figure 29:
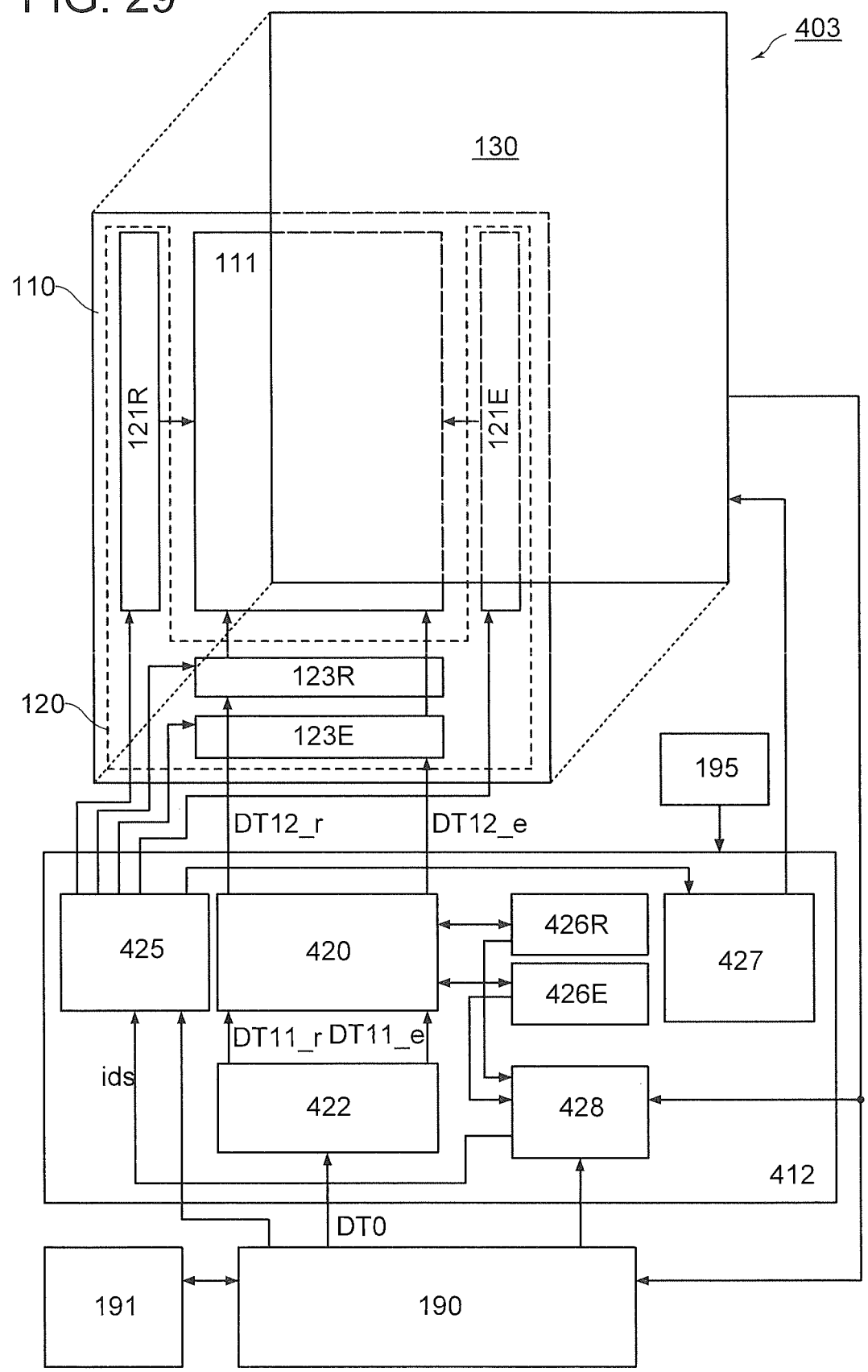
FIG. 29 is a functional block diagram illustrating a configuration example of an ER display system.

FIG. 29 shows an example of an ER display system including a touch sensor. An ER display system 403 in FIG. 29 is a modification example of the ER display system 400, and includes a display controller 412 in place of the display controller 410 and further includes the touch sensor 130.

The display controller 412 includes a touch sensor controller 427 and an IDS controller 428. The touch sensor controller 427 generates a timing signal for controlling the touch sensor 130. The application processor 190 generates image data that reflects positional data or the like detected by the touch sensor 130.

The IDS controller 428 generates a signal ids. For example, the IDS controller 428 may be constituted with a neural network (NN), and may predict a start timing and an end timing of the IDS driving. With the use of the IDS controller 428 having a learning function, switching between the IDS driving and the normal driving can be efficiently performed, whereby the total power consumption of the ER display system 403 can be efficiently reduced.

Output data of the touch sensor 130, consumption currents of the memory devices 426R and 426E, and output data of the application processor 190 (e.g., an attribute of a running application) are used as learning data of the IDS controller 428. The IDS controller 428 learns an optimal refresh rate of the ER panel 110 with the use of the above data.

Embodiment 4

<<Electronic Device>>

In this embodiment, an electronic device including the display system according to any of Embodiments 1 to 3 is described.

Figure 30A:
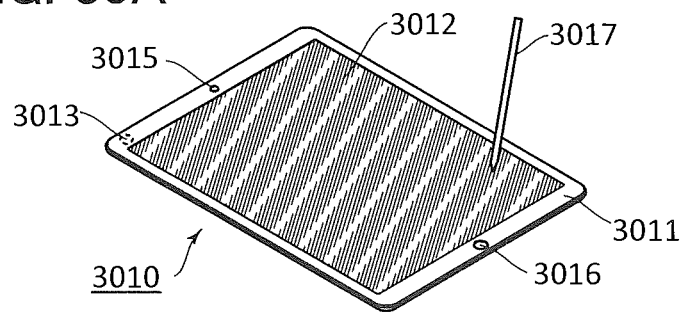
FIGS. 30A to 30D each illustrate a structural example of an electronic device.

FIG. 30A illustrates a structure example of a tablet information terminal. An information terminal 3010 shown in FIG. 30A includes a housing 3011, a display portion 3012, an optical sensor 3013, a camera 3015, and an operation button 3016. The information terminal 3010 has functions of a voice call, a video call with the use of the camera 3015, e-mailing, an appointment organizer, Internet communication, music reproduction, and the like.

The display portion 3012 includes the display system in which a touch sensor is incorporated. The information terminal 3010 can be operated when a stylus pen 3017 (or an electronic pen), a finger, or the like touches a screen of the information terminal 3010. The brightness, color tone, or the like of the display portion 3012 can be changed on the basis of data of environmental light detected by the optical sensor 3013. Display portions of electronic devices described below as examples have functions similar to those of the display portion 3012.

The information terminal 3010 that stores data of an electronic textbook can be used as a digital textbook reader.

Figure 30B:
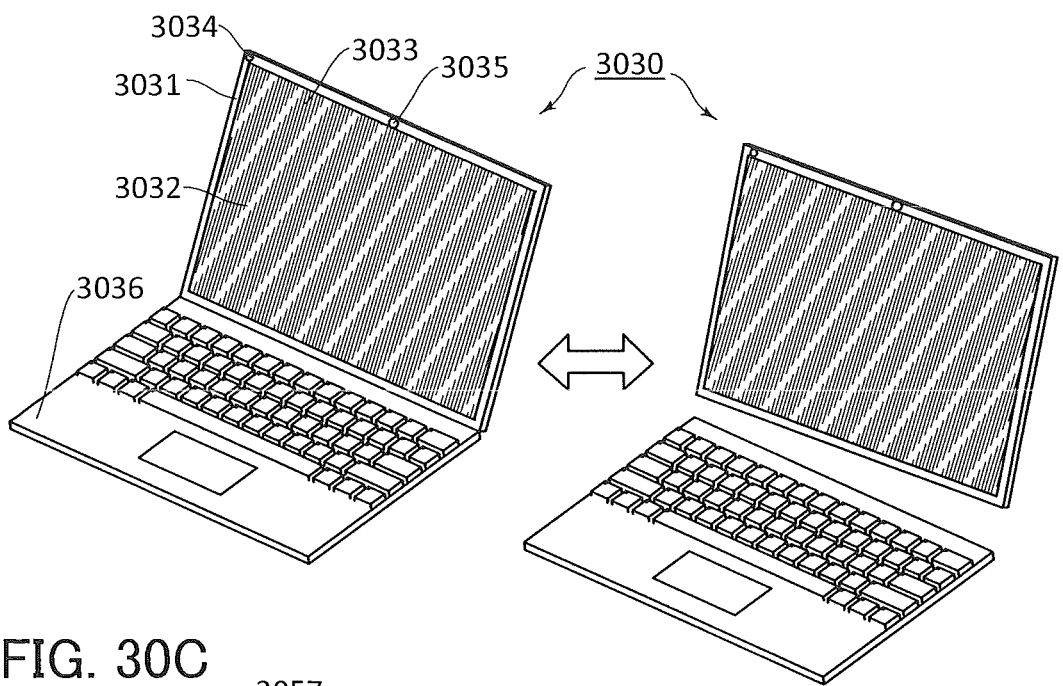

FIG. 30B illustrates a structure example of a personal computer (PC). A PC 3030 in FIG. 30B includes a housing 3031, a display portion 3032, an optical sensor 3034, a camera 3035, and a keyboard 3036. The keyboard 3036 can be attached to or detached from the housing 3031. When the keyboard 3036 is attached to the housing 3031, the PC 3030 can be used as a laptop PC. When the keyboard 3036 is detached from the housing 3031, the PC 3030 can be used as a tablet PC.

The PC 3030 that stores data of an electronic textbook can be used as a digital textbook reader.

Figure 30C:
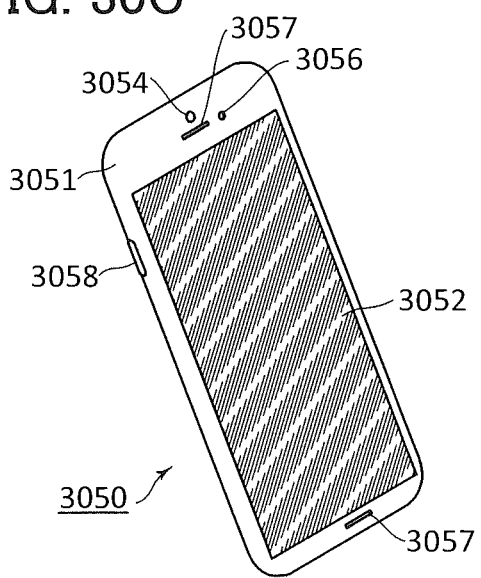

FIG. 30C illustrates a structure example of a smartphone. A smartphone 3050 shown in FIG. 30C includes a housing 3051, a display portion 3052, an optical sensor 3054, a microphone 3056, a speaker 3057, and an operation button 3058. A camera or the like is provided on the back side of the housing 3051. The smartphone 3050 has functions similar to those of the information terminal 3010 and the like.

Figure 30D:
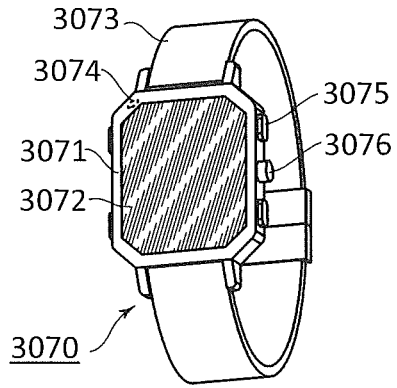

FIG. 30D illustrates a structure example of a wearable information terminal. An information terminal 3070 shown in FIG. 30D includes a housing 3071, a display portion 3072, a wristband 3073, an optical sensor 3074, an operation button 3075, and a winder 3076. The information terminal 3070 has functions similar to those of the information terminal 3010 and the like, and can be used as a smartwatch.

The wearable information terminal in FIG. 30D is of a wristwatch type. A wearable information terminal can be in any of various forms, such as glasses, goggles, a wristband, an armband, and a pendant.

Figure 31:
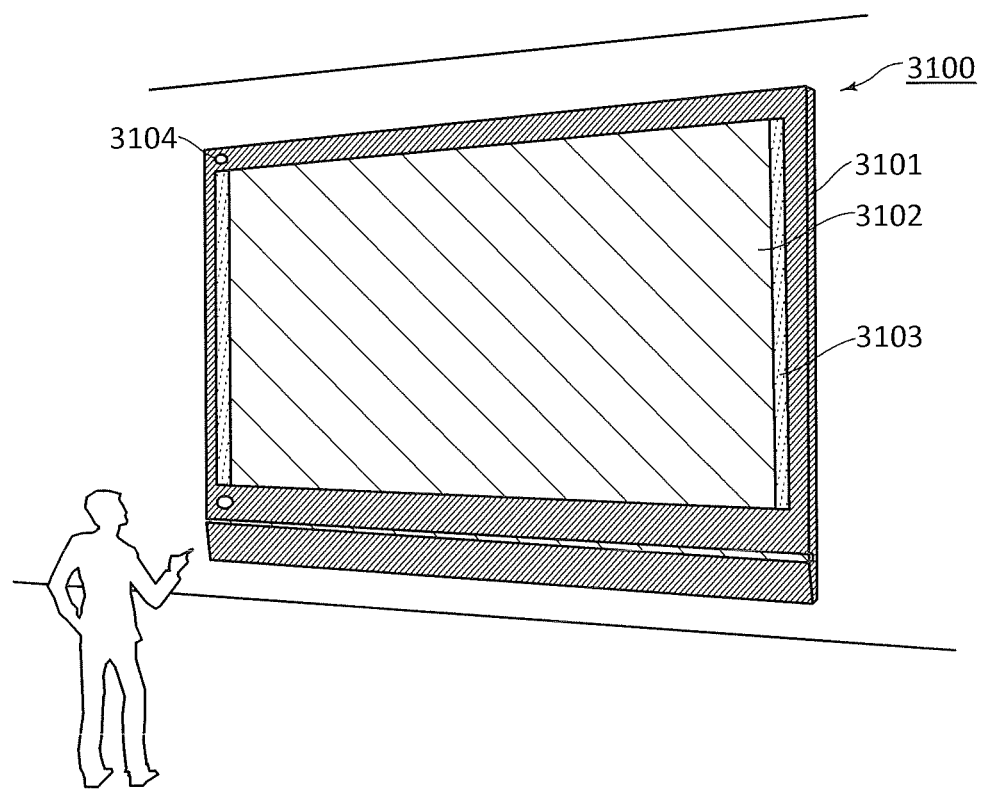
FIG. 31 illustrates a structural example of an electronic device.

FIG. 31 shows a structure example of a digital signage. A digital signage 3100 shown in FIG. 31 includes a housing 3101, a display portion 3102, a speaker 3103, and an optical sensor 3104. The display portion 3102 includes the ER display system of Embodiment 1. The digital signage 3100 can be used as, for example, a display system for displaying an information map in a station, an airport, an institution, or the like, or a display system for displaying a waiting list in a hospital, a bank, or the like.

The above-mentioned ER display systems can each take the TXT mode, and thus can each be suitably used in an information terminal (a digital textbook reader) storing electronic textbooks. In the TXT mode, a text of a textbook is displayed on a reflective display panel utilizing environmental light, and thus a user can read the textbook with the digital textbook reader as if reading a paper textbook, and the user is less tired even when looking at the screen for a long time.

The user can write various colored notes (e.g., a highlight, an underline, a strike-through, and a freehand diagrammatic view) in a black-and-white textbook, and thus the user can use the digital textbook reader in a learning environment similar to an environment in the case of using a paper textbook. The notes are displayed by the hybrid display of black display by the reflective display element and color display by the light-emitting display element. Accordingly, the notes can be displayed only with the light-emitting display element having high color reproducibility, and thus the notes can be emphasized with respect to the text in black-and-white display.

Embodiment 5

In this embodiment, a memory device is described. For example, a memory device in this embodiment can be used as the memory device of the ER display system.

In this specification and the like, a memory device whose data storage portion (e.g., a memory cell) includes an OS transistor is referred to as an OS memory. In this embodiment, DOSRAM (registered trademark) and NOSRAM (registered trademark) are described as examples of the OS memory.

DOSRAM is an acronym of Dynamic Oxide Semiconductor RAM, and denotes an RAM including a memory cell with one transistor (1T) and one capacitor (1C). NOSRAM is an acronym of Nonvolatile Oxide Semiconductor RAM, and denotes an RAM including a memory cell with a gain cell (2T or 3T).

<<DOSRAM 1400>>

A DOSRAM will be described below with reference to FIGS. 32A to 32C.

Figure 32A:
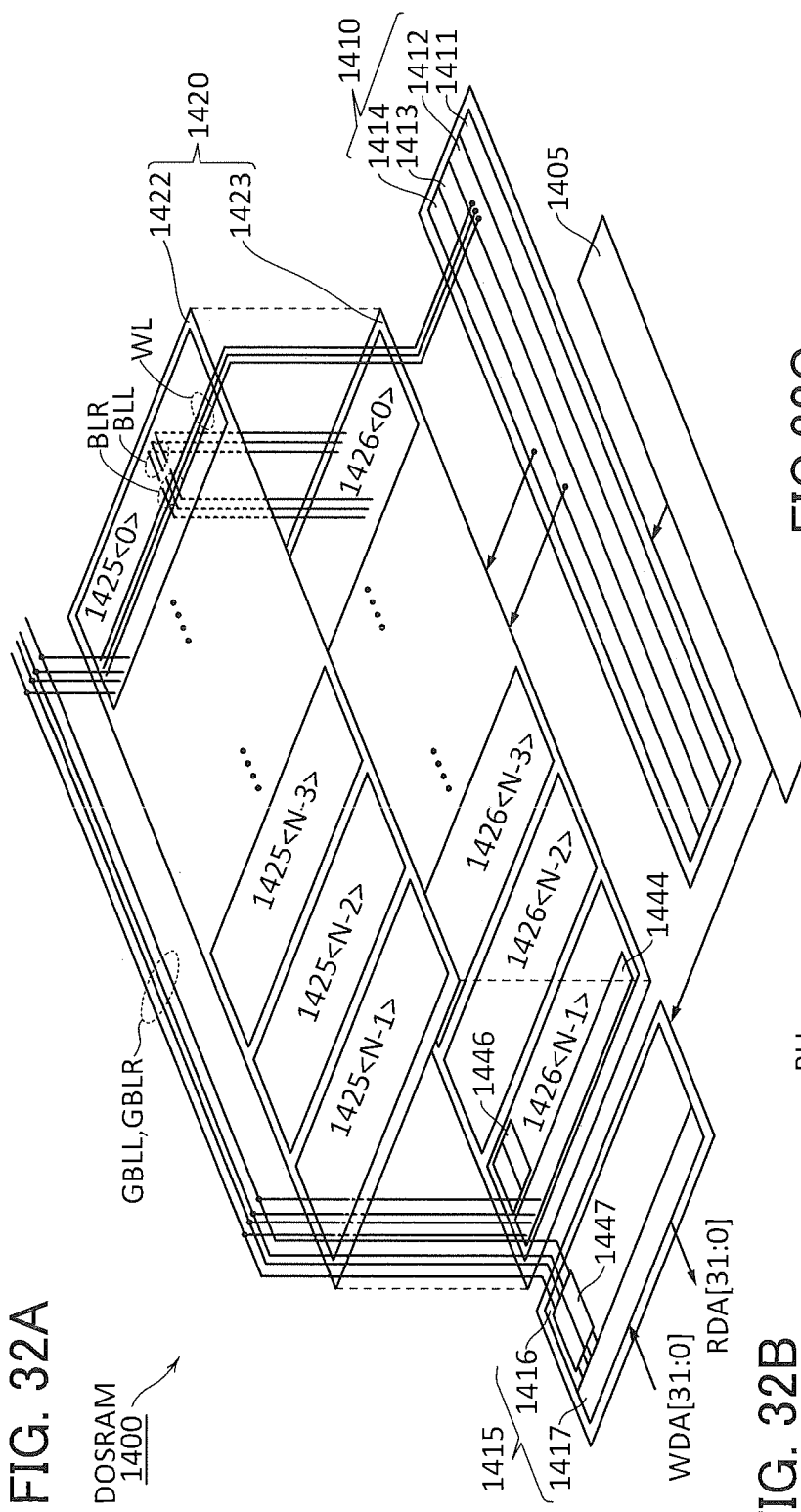
FIG. 32A is a functional block diagram illustrating a configuration example of a DOSRAM.

A DOSRAM 1400 illustrated in FIG. 32A includes a controller 1405, a row circuit 1410, a column circuit 1415, and an MC-SA array 1420. The row circuit 1410 includes a decoder 1411, a word line driver 1412, a column selector 1413, and a sense amplifier driver 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines.

The memory cell array 1422 includes N local memory cell arrays 1425<0> to 1425<N−1>, where N is an integer greater than or equal to 2. As illustrated in FIG. 32B, the local memory cell array 1425 includes a plurality of memory cells 1445, a plurality of word lines WL, and a plurality of bit lines BLL and BLR. In the example in FIG. 32B, the local memory cell array 1425 has an open bit-line architecture but may have a folded bit-line architecture instead.

Figure 32C:
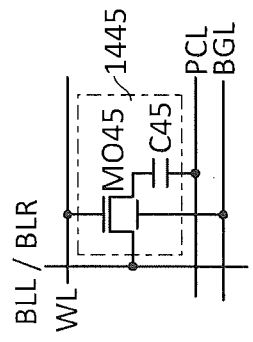
FIG. 32C illustrates a circuit configuration example of a memory cell.
Figure 32B:
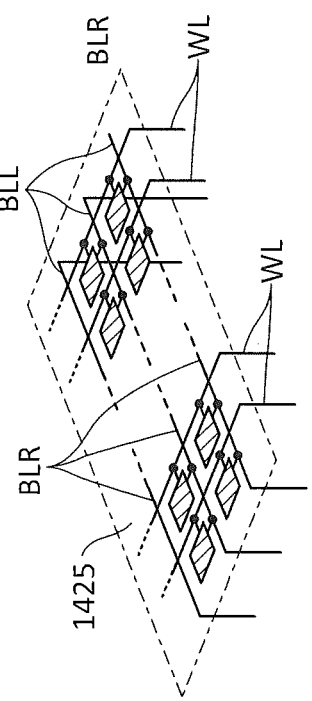
FIG. 32B illustrates a configuration example of a memory cell array.

The memory cell 1445 illustrated in FIG. 32C includes an OS transistor M045 and a capacitor C45. The OS transistor M045 has a function of controlling the charge and discharge of the capacitor C45. A gate of the OS transistor M045 is electrically connected to the word line WL, a back gate of the OS transistor M045 is electrically connected to a wiring BGL, a first terminal of the OS transistor M045 is electrically connected to the bit line BLL or BLR, and a second terminal of the OS transistor M045 is electrically connected to a first terminal of the capacitor C45. A second terminal of the capacitor C45 is electrically connected to a wiring PCL. The wirings PCL and BGL are each a power supply line for supplying a voltage.

The threshold voltage of the OS transistor M045 can be changed with a voltage applied to the wiring BGL. For example, a fixed voltage (e.g., negative constant voltage) may be applied to the wiring BGL; alternatively, the voltage applied to the wiring BGL may be changed depending on the operation of the DOSRAM 1400.

The back gate of the OS transistor M045 may be electrically connected to the gate, the source, or the drain of the OS transistor M045. Alternatively, the OS transistor M045 does not necessarily include the back gate.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference between the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the description hereinafter, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver 1412 generates a selection signal for selecting the word line WL of a row that is to be accessed.

The column selector 1413 and the sense amplifier driver 1414 are circuits for driving the sense amplifier array 1423. The column selector 1413 has a function of generating a selection signal for selecting the bit line of a column that is to be accessed. The selection signal from the column selector 1413 controls the switch array 1444 of each local sense amplifier array 1426. The control signal from the sense amplifier driver 1414 drives each of the plurality of local sense amplifier arrays 1426 independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference between the global bit line pair (GBLL, GBLR), and a function of retaining the voltage difference. Data are written to and read from the global bit line pair (GBLL, GBLR) by the input/output circuit 1417.

A write operation of the DOSRAM 1400 is briefly described. Data are written to the global bit line pair by the input/output circuit 1417. The data of the global bit line pair are retained by the global sense amplifier array 1416. By the switch array 1444 of the local sense amplifier array 1426 specified by the address signal, the data of the global bit line pair are written to the bit line pair of the column where data are to be written. The local sense amplifier array 1426 amplifies the written data, and then retains the amplified data. In the specified local memory cell array 1425, the word line WL of the row where data are to be written is selected by the row circuit 1410, and the data retained at the local sense amplifier array 1426 are written to the memory cell 1445 of the selected row.

A read operation of the DOSRAM 1400 is briefly described. One row of the local memory cell array 1425 is specified with the address signal. In the specified local memory cell array 1425, the word line WL of the row where data are to be read is selected, and data of the memory cell 1445 are written to the bit line. The local sense amplifier array 1426 detects a voltage difference between the bit line pair of each column as data, and retains the data. The switch array 1444 writes the data of a column specified by the address signal to the global bit line pair; the data are chosen from the data retained at the local sense amplifier array 1426. The global sense amplifier array 1416 detects and retains the data of the global bit line pair. The data retained at the global sense amplifier array 1416 are output to the input/output circuit 1417. Thus, the read operation is completed.

The DOSRAM 1400 has no limitations on the number of rewrites in principle and data can be read and written with low energy consumption, because data are rewritten by charging and discharging the capacitor C45. Simple circuit configuration of the memory cell 1445 allows a high memory capacity. Thus, the DOSRAM 1400 is suitable for a memory device in which large-volume data are rewritten frequently, e.g., a frame memory used for image processing.

The OS transistor M045 is an OS transistor. Since the off-state current of an OS transistor is extremely low, charge leakage from the capacitor C45 can be reduced. Thus, the retention time of the DOSRAM 1400 is much longer than that of a DRAM, leading to a reduction in refresh rate. That is, the DOSRAM 1400 allows a reduction in power needed for refresh operations.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced.

From the above, the use of the DOSRAM 1400 for a frame memory in the display controller or a main memory in the application processor allows a reduction in the power consumption of the ER display system.

<<NOSRAM>>

An NOSRAM is described with reference to FIG. 33, FIGS. 34A to 34D, and FIGS. 35A and 35B. Here, a multi-level NOSRAM in which one memory cell stores multi-level data is described.

Figure 33:
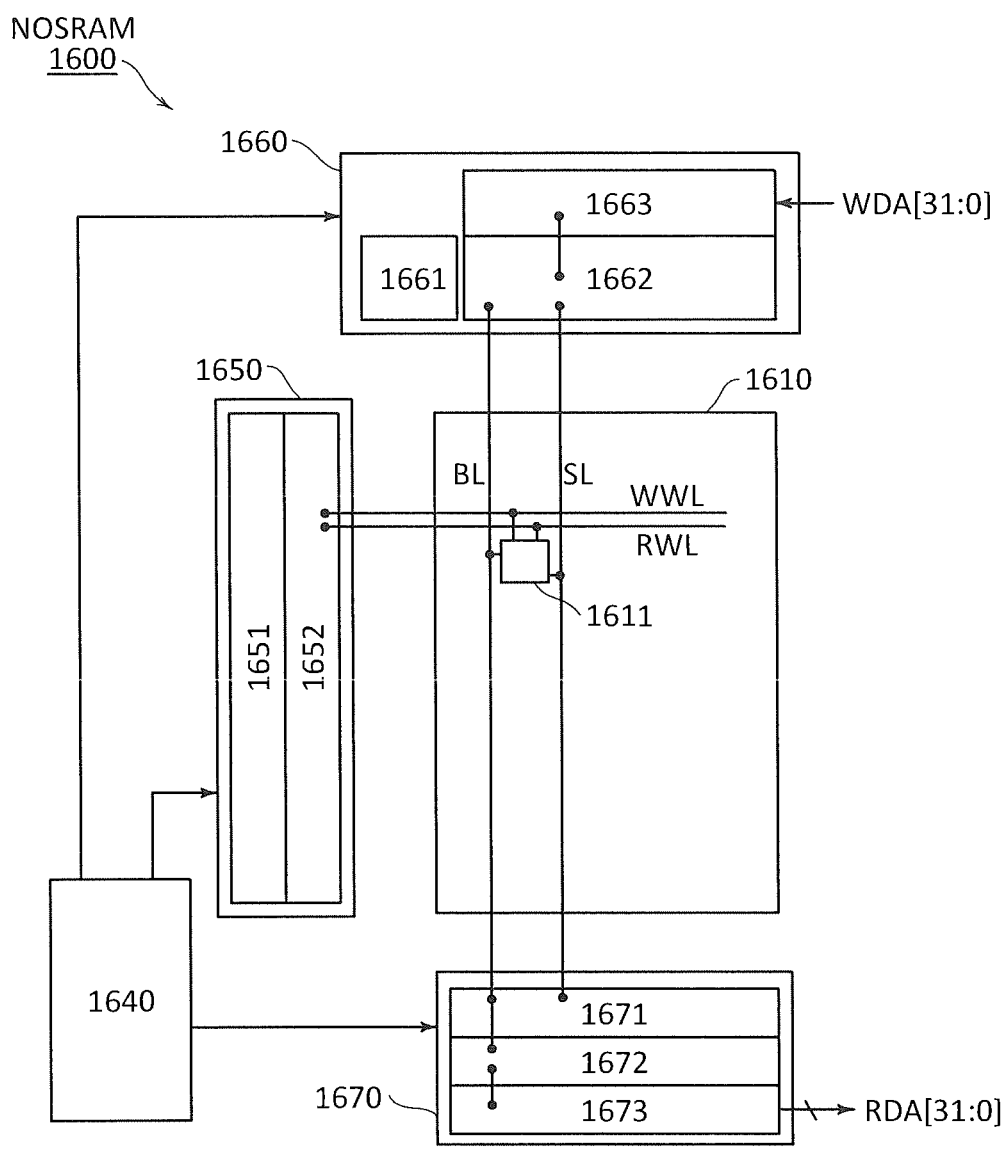
FIG. 33 is a functional block diagram illustrating a configuration example of a NOSRAM.

A NOSRAM 1600 shown in FIG. 33 includes a memory cell array 1610, a controller 1640, a row driver 1650, a column driver 1660, and an output driver 1670.

The memory cell array 1610 includes a plurality of memory cells 1611, a plurality of word lines WWL and RWL, bit lines BL, and source lines SL. The word line WWL is a writing word line, and the word line RWL is a reading word line. One memory cell 1611 of the NOSRAM 1600 stores a 3-bit (8-level) data.

The controller 1640 controls the NOSRAM 1600 as a whole; with the controller 1640, writing of data WDA[31:0] and reading of data RDA[31:0] are performed. The controller 1640 processes a command signal (e.g., a chip enable signal or a writing enable signal) from the outside and generates control signals for the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source line SL and the bit line BL. The column driver 1660 includes a column decoder 1661, a writing driver 1662, and a digital-analog converter (DAC) 1663.

The DAC 1663 converts 3-bit digital data into an analog voltage. The DAC 1663 converts the 32-bit data WDA[31:0] into analog voltages by three bits.

The writing driver 1662 has functions of, for example, precharging the source line SL, bringing the source line SL into an electrically floating state, selecting the source line SL, inputting a writing voltage generated in the DAC 1663 to the source line SL, precharging the bit line BL, and bringing the bit line BL into an electrically floating state.

The output driver 1670 includes a selector 1671, an analog-digital converter (ADC) 1672, and an output buffer 1673. The selector 1671 selects the source line SL to be accessed, and sends the voltage of the selected source line SL to the ADC 1672. The ADC 1672 has a function of converting an analog voltage to 3-bit digital data. The voltage of the source line SL is converted into 3-bit data in the ADC 1672, and the output buffer 1673 holds the data output from the ADC 1672.

<Memory Cell>

Figure 34A:
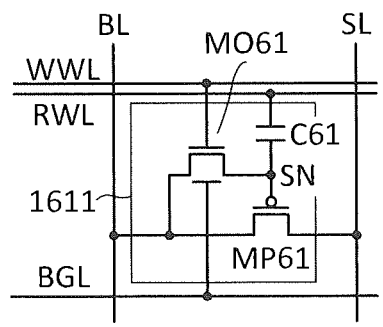
FIGS. 34A to 34D each illustrate a circuit configuration example of a memory cell.

FIG. 34A is a circuit diagram illustrating a configuration example of the memory cell 1611. The memory cell 1611 is a 2T gain cell type, and electrically connected to the word lines WWL and RWL, the bit line BL, the source line SL, and the wiring BGL. The memory cell 1611 includes a node SN, an OS transistor M061, a transistor MP61, and a capacitor C61. The OS transistor M061 is a writing transistor. The transistor MP61 is a reading transistor and is a p-channel Si transistor, for example. The capacitor C61 is a storage capacitor for holding the voltage of the node SN. The node SN is a node for storing data, and here corresponds to a gate of the transistor MP61.

Since the writing transistor of the memory cell 1611 is the OS transistor M061, the NOSRAM 1600 can hold data for a long time.

Figure 34B:
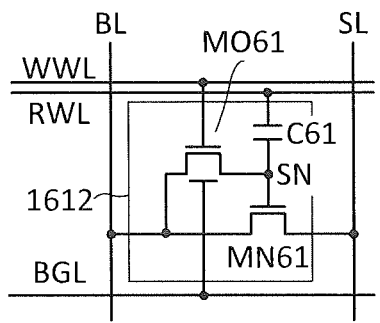
Figure 34C:
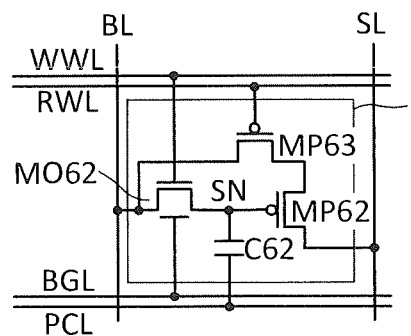
Figure 34D:
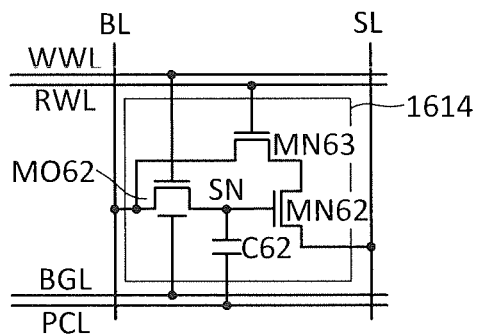

FIGS. 34B to 34D illustrate other configuration examples of the memory cell. A memory cell 1612 shown in FIG. 34B is a modification example of the memory cell 1611, and includes an n-channel transistor (MN61) as a reading transistor. The transistor MN61 may be an OS transistor or a Si transistor.

In each of the memory cells 1611 and 1612, the OS transistor M061 may be an OS transistor without a back gate.

A memory cell 1613 shown in FIG. 34C is a 3T gain cell, and electrically connected to the word lines WWL and RWL, the bit line BL, the source line SL, the wiring BGL, and the wiring PCL. The memory cell 1613 includes the node SN, an OS transistor M062, a transistor MP62, a transistor MP63, and a capacitor C62. The OS transistor M062 is a writing transistor. The transistor MP62 is a reading transistor, and the transistor MP63 is a selecting transistor. The transistors MP62 and MP63 are Si transistors.

A memory cell 1614 shown in FIG. 34D is a modification example of the memory cell 1613, and includes n-channel transistors (MN62 and MN63) as a reading transistor and a selecting transistor. Each of the transistors MN62 and MN63 may be an OS transistor or a Si transistor.

Each of the OS transistors in the memory cells 1611 to 1614 may have a back gate or no back gate.

<Writing Operation>

Figure 35A:
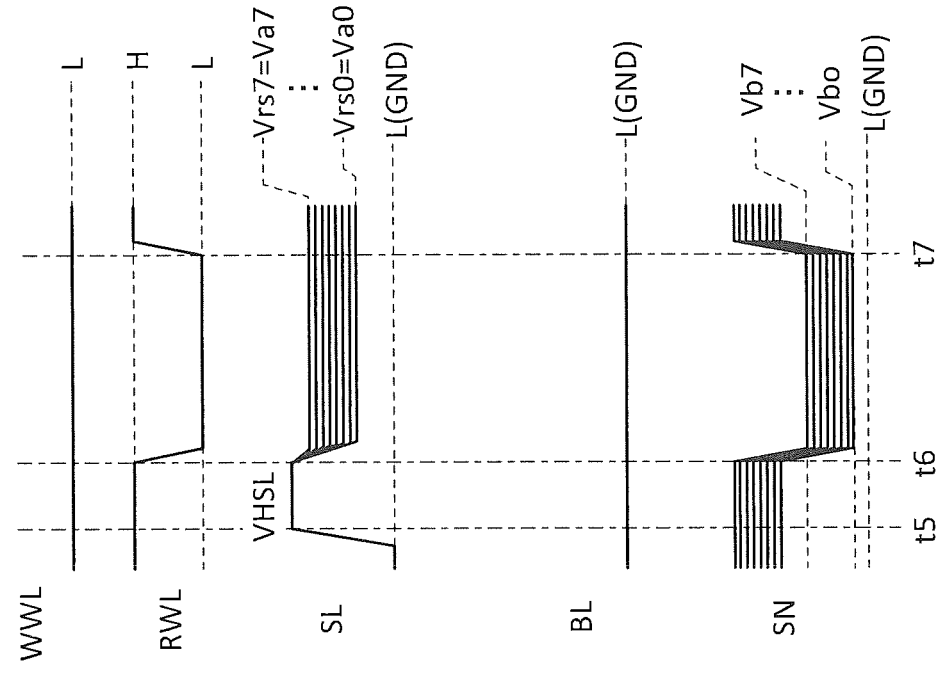
FIGS. 35A and 35B are each a timing chart showing an operation example of a NOSRAM.

FIG. 35A is a timing chart showing a writing operation example of the NOSRAM 1600. Times are denoted by t1, t2, and the like.

In a standby state, the word line RWL is at a high level ("H"), and the word line WWL, the source line SL, and the bit line BL are at a low level ("L"). Thus, in the memory cell 1611 in a non-selection state, the OS transistor M061 and the transistor MP61 are in an off state and the node SN is in an electrically floating state.

At the time t1, the row driver 1650 sets the word line WWL to "H" and the word line RWL to "L", whereby the OS transistor M061 and the transistor MP61 are turned on. The column driver 1660 precharges the bit line BL and the source line SL. Here, they are precharged to GND (a ground potential).

At the time t2, the column driver 1660 brings the bit line BL into an electrically floating state. A writing voltage (any of Va0-Va7) is input to the source line SL. The voltage (any of Va0-Va7) corresponds to 8-level data. When data of 3*d*′000 is written in the memory cell 1611, the writing voltage is Va0. When data of 3*d*′111 is written in the memory cell 1611, the writing voltage is Va1.

The voltage of the source line SL (writing voltage) is input to the bit line BL through the transistor MP61, and the voltage of the bit line BL is input to the node SN through the OS transistor M061.

A voltage (any of Vb0-Vb7) that is lower than the writing voltage (any of Va0-Va7) by the threshold voltage (VTP) of the transistor MP61 is input to the node SN. As described below, by inputting the writing voltage to the node SN through the transistor MP61, a voltage that does not depend on VTP can be read out from the node SN. Accordingly, the reliability of the NOSRAM 1600 can be improved.

At a time t3, the word line WWL is set to "L", whereby the OS transistor M061 is turned off. At a time t4, the word line RWL is set to "H", so that the memory cell 1611 becomes in a non-selection state. By setting the word line RWL to "H", the voltage of the node SN gets higher.

<Reading Operation>

Figure 35B:
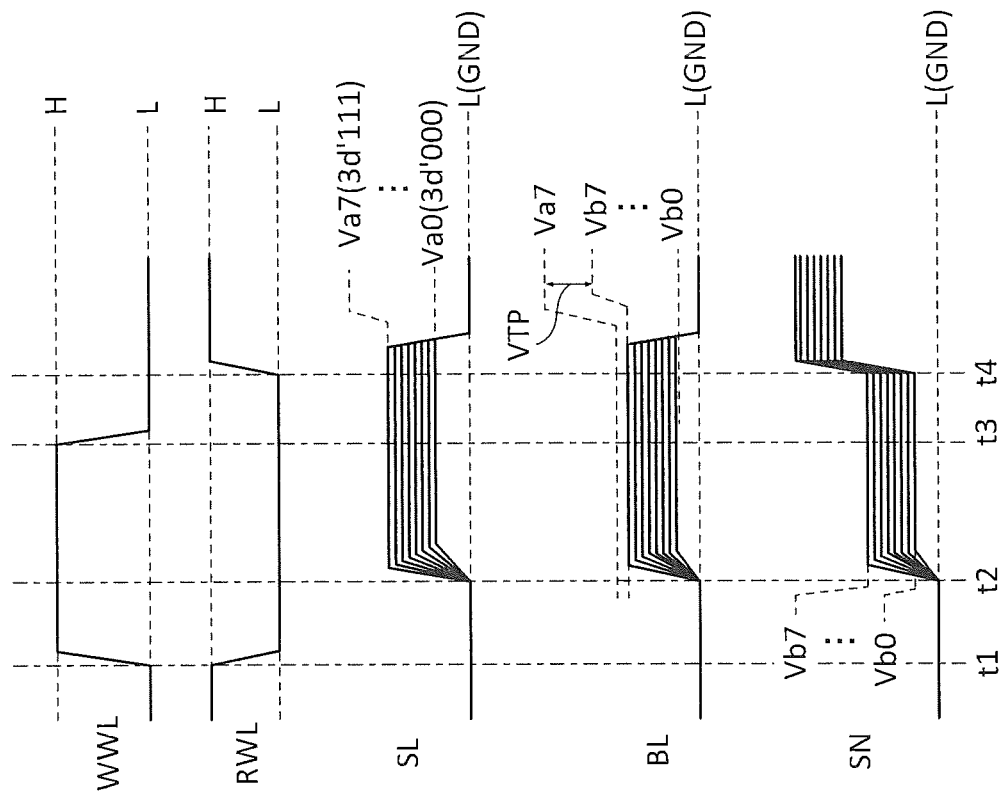

FIG. 35B is a timing chart showing a reading operation example. In the reading operation, the voltage of the node SN is written to the source line SL.

At a time t5, the column driver 1660 precharges the bit line BL to GND, and precharges the source line SL to VHSL.

At a time t6, the column driver 1660 brings the source line SL into an electrically floating state, and the row driver 1650 sets the word line RWL to "L" to turn on the transistor MP61. The voltage of the node SN becomes any of Vb0-Vb7, and a drain current flows in the transistor MP61. The voltage of the source line SL decreases by the drain current. When a voltage between the node SN and the source line SL becomes VTP, the drain current stops flowing and the voltage of the node SN stops decreasing. At that time, the voltage (any of Vrs0-Vrs7) of the source line SL is a voltage obtained by adding VTP to the voltage (any of Vb0-Vb7) of the node SN. For example, Vrs0=Vb0+VTP=(Va0−VTP)+VTP=Va0. That is, in the above writing operation, the voltage (any of Vrs0-Vrs7) read from the memory cell 1611 to the source line SL is not affected by the threshold voltage VTP of the transistor MP61.

At a time t7, the row driver 1650 sets the word line RWL to "H", whereby the memory cell 1611 is set in a holding state. After the time t7, the selector 1671 makes conduction between the source line SL and the ADC 1672, and the voltage of the source line SL is input to the ADC 1672. The ADC 1672 converts the voltage (any of Vrs0-Vrs7) of the source line SL to 3-bit data. The ADC 1672 combines 3-bit data generated from the voltages of the four source lines SL to generate 32-bit data, and outputs the data to the output buffer 1673. The 32-bit data output from the output buffer 1673 is RDA[31:0].

The NOSRAM 1600 has no limitations on the number of rewrites in principle and data can be read and written with low energy consumption, because data are rewritten by charging and discharging the capacitor C61. Furthermore, data can be retained for a long time, and thus a refresh rate can be reduced. From the above, the NOSRAM 1600 is suitable for a memory device in which large-volume data are rewritten frequently, e.g., a frame memory used for image processing.

When the NOSRAM 1600 is used as a frame memory of the display controller or a main memory of the application processor, the power consumption of the ER display system can be reduced.

Embodiment 6

In this embodiment, a semiconductor device including Si transistors and OS transistors is described. The structure of such a semiconductor device is described here using the NOSRAM 1600 in Embodiment 2 as an example.

<<Example of Cross-Sectional Structure of NOSRAM>>

Figure 36:
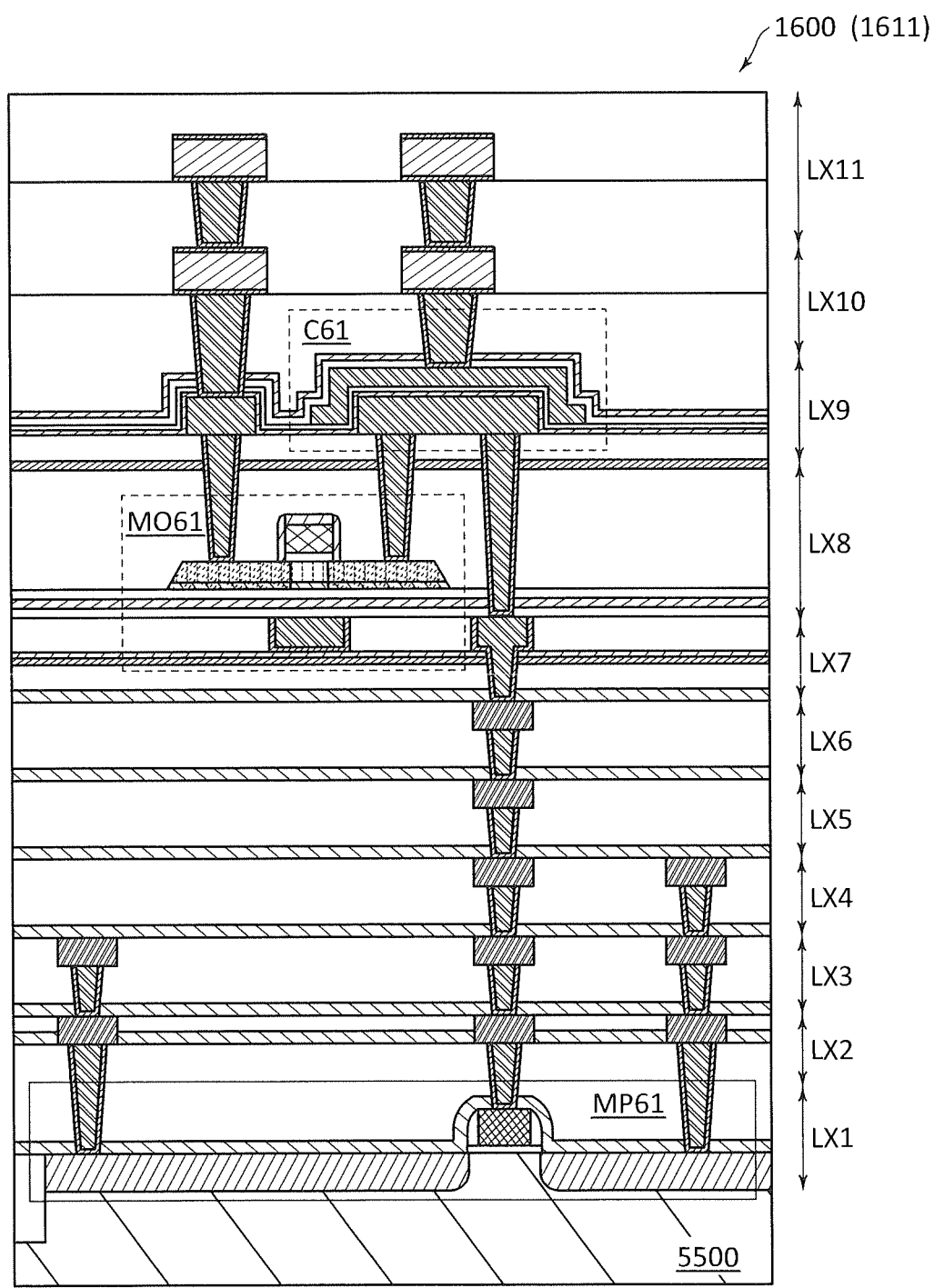
FIG. 36 illustrates an example of a cross-sectional structure of a NOSRAM.

The structure of the NOSRAM 1600 is described with reference to FIG. 36. FIG. 36 illustrates a cross-sectional structure of the memory cell 1611 as a typical example. The NOSRAM 1600 includes a single crystal silicon wafer 5500 and a stack of layers LX1 to LX11. Wirings, electrodes, plugs, and the like are provided in the layers LX1 to LX11.

In the layer LX1, a Si transistor included in the NOSRAM 1600, such as the transistor MP61, is provided. A channel formation region of the Si transistor is provided in the single crystal silicon wafer 5500.

The layer LX8 includes an OS transistor such as the transistor M061. A back gate electrode of the OS transistor is provided in the layer LX7. Here, the structure of the OS transistor is similar to that of an OS transistor 5004 to be described later (see FIG. 39B).

Figure 37:
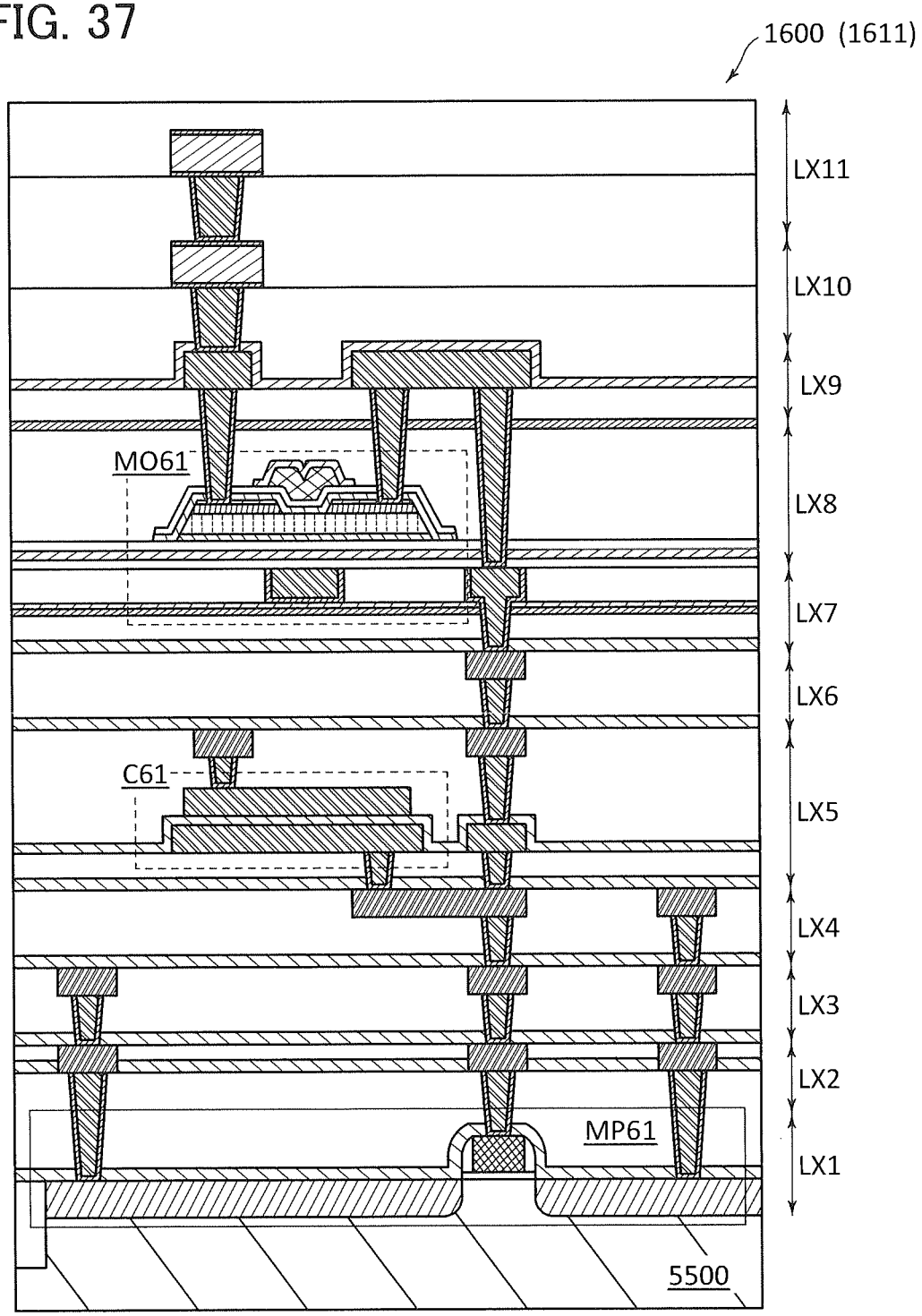
FIG. 37 illustrates an example of a cross-sectional structure of a NOSRAM.

The capacitor C61 is provided in the layer LX9. The capacitor C61 can be provided below the layer LX9, as shown in the example of FIG. 37. The capacitor C61 is provided in the layer LX5 in FIG. 37. The structure of an OS transistor provided in the layer LX8 in FIG. 37 is similar to that of an OS transistor 5002 to be described later (see FIG. 38B).

Note that FIG. 36 and FIG. 37 are cross-sectional views showing examples of the cross-sectional structure of the NOSRAM 1600, and are not cross-sectional views of the NOSRAM 1600 taken along a specific section line. Next, structural examples of the OS transistor will be described with reference to FIGS. 38A and 38B and FIGS. 39A and 39B.

OS Transistor Structural Example 1

Figure 38A:
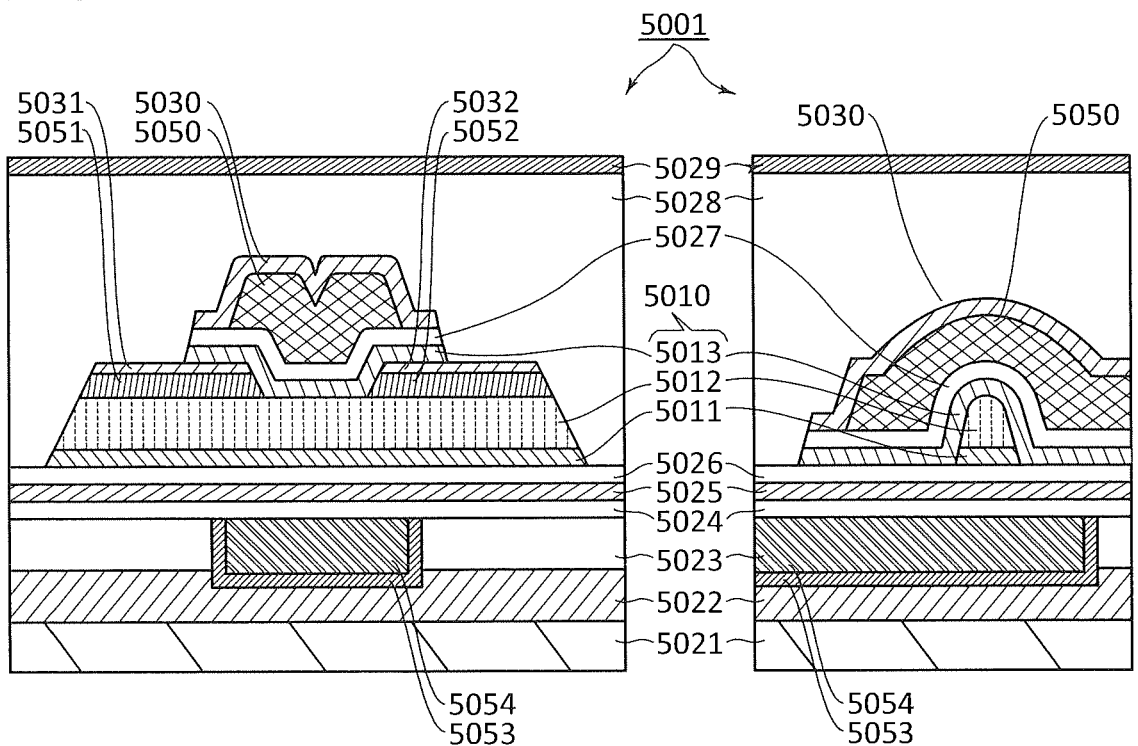
FIGS. 38A and 38B are each a cross-sectional view illustrating a structural example of an OS transistor.

FIG. 38A illustrates a structural example of an OS transistor. An OS transistor 5001 illustrated in FIG. 38A is a metal oxide transistor. A cross-sectional view of the OS transistor 5001 in the channel length direction is illustrated on the left side of FIG. 38A, and a cross-sectional view of the OS transistor 5001 in the channel width direction is illustrated on the right side of FIG. 38A.

The OS transistor 5001 is formed over an insulating surface. Here, the OS transistor 5001 is formed over an insulating layer 5021. The OS transistor 5001 is covered with insulating layers 5028 and 5029. The OS transistor 5001 includes insulating layers 5022 to 5027 and 5030 to 5032, metal oxide layers 5011 to 5013, and conductive layers 5050 to 5054.

Note that the insulating layers, the metal oxide layers, the conductive layers, and the like in the drawing may each have a single-layer structure or a stacked-layer structure. These layers can be formed by any of a variety of deposition methods such as a sputtering method, a molecular beam epitaxy (MBE) method, a pulsed laser ablation (PLA) method, a CVD method, and an atomic layer deposition (ALD) method. Examples of the CVD method include a plasma CVD method, a thermal CVD method, and a metal organic CVD method.

The metal oxide layers 5011 to 5013 are collectively referred to as an oxide layer 5010. As illustrated in FIG. 38A, the oxide layer 5010 includes a portion where the metal oxide layer 5011, the metal oxide layer 5012, and the metal oxide layer 5013 are stacked in that order. When the OS transistor 5001 is on, a channel is mainly formed in the metal oxide layer 5012 of the oxide layer 5010.

A gate electrode of the OS transistor 5001 is formed using the conductive layer 5050. A pair of electrodes that function as a source electrode and a drain electrode of the OS transistor 5001 is formed using the conductive layers 5051 and 5052. The conductive layers 5050 to 5052 are covered with the insulating layers 5030 to 5032 functioning as barrier layers, respectively. A back gate electrode of the OS transistor 5001 is formed using a stack of the conductive layers 5053 and 5054. The OS transistor 5001 does not necessarily include the back gate electrode. The same applies to the OS transistor 5002 to be described later.

A gate insulating layer on a gate (front gate) side is formed using the insulating layer 5027. A gate insulating layer on a back gate side is formed using a stack of the insulating layers 5024 to 5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 positioned therebetween.

Examples of a conductive material used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 5050 is a single layer of tantalum nitride or tungsten. Alternatively, in the case where the conductive layer 5050 has a two-layer structure or a three-layer structure, the following combinations can be used (the conductor written first is used for a layer on the insulating layer 5027 side): aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride.

The conductive layers 5051 and 5052 have the same layer structure. For example, in the case where the conductive layer 5051 is a single layer, any of metals such as aluminum, titanium, chromium, nickel, copper, yttrium, zirconium, molybdenum, silver, tantalum, and tungsten, or an alloy containing any of these metals as its main component may be used. In the case where the conductive layer 5051 has a two-layer structure or a three-layer structure, the following combinations can be used (the conductor written first is used for a layer on the insulating layer 5027 side): titanium and aluminum; tungsten and aluminum; tungsten and copper; a copper-magnesium-aluminum alloy and copper; titanium and copper; titanium or titanium nitride, aluminum or copper, and titanium or titanium nitride; and molybdenum or molybdenum nitride, aluminum or copper, and molybdenum or molybdenum nitride.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., a tungsten layer). With such a structure, the stack of the conductive layers 5053 and 5054 functions as a wiring and has a function of suppressing diffusion of hydrogen into the oxide layer 5010.

Examples of an insulating material used for the insulating layers 5021 to 5032 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5032 are each formed using a single-layer structure or a stacked-layer structure of these insulating materials. The layers used for the insulating layers 5021 to 5032 may include a plurality of insulating materials.

Note that in this specification and the like, an oxynitride refers to a compound that contains more oxygen than nitrogen, and a nitride oxide refers to a compound that contains more nitrogen than oxygen.

In the OS transistor 5001, the oxide layer 5010 is preferably surrounded by an insulating layer with oxygen and hydrogen barrier properties (hereinafter such an insulating layer is referred to as a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 may function as a barrier layer and at least one of the insulating layers 5021, 5022, and 5024 may function as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. Another barrier layer may be provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents the conductive layer 5050 from becoming oxidized. When the insulating layer 5030 has an oxygen barrier property, oxidation of the conductive layer 5050 due to oxygen released from the insulating layer 5028 or the like can be suppressed. For example, the insulating layer 5030 can be formed using a metal oxide such as aluminum oxide.

A structural example of the insulating layers 5021 to 5032 is described. In this example, each of the insulating layers 5021, 5022, 5025, and 5029 to 5032 functions as a barrier layer. The insulating layers 5026 to 5028 are oxide layers containing excess oxygen. The insulating layer 5021 is formed using silicon nitride. The insulating layer 5022 is formed using aluminum oxide. The insulating layer 5023 is formed using silicon oxynitride. The gate insulating layers (5024 to 5026) on the back gate side are formed using a stack of silicon oxide, aluminum oxide, and silicon oxide. The gate insulating layer (5027) on the front gate side is formed using silicon oxynitride. The interlayer insulating layer (5028) is formed using silicon oxide. The insulating layers 5029 to 5032 are formed using aluminum oxide.

FIG. 38A illustrates an example in which the oxide layer 5010 has a three-layer structure; however, one embodiment of the present invention is not limited thereto. For example, the oxide layer 5010 may have a two-layer structure without the metal oxide layer 5011 or 5013, or may be constituted by only one of the metal oxide layers 5011 to 5013. Alternatively, the oxide layer 5010 may be constituted by four or more metal oxide layers.

OS Transistor Structural Example 2

Figure 38B:
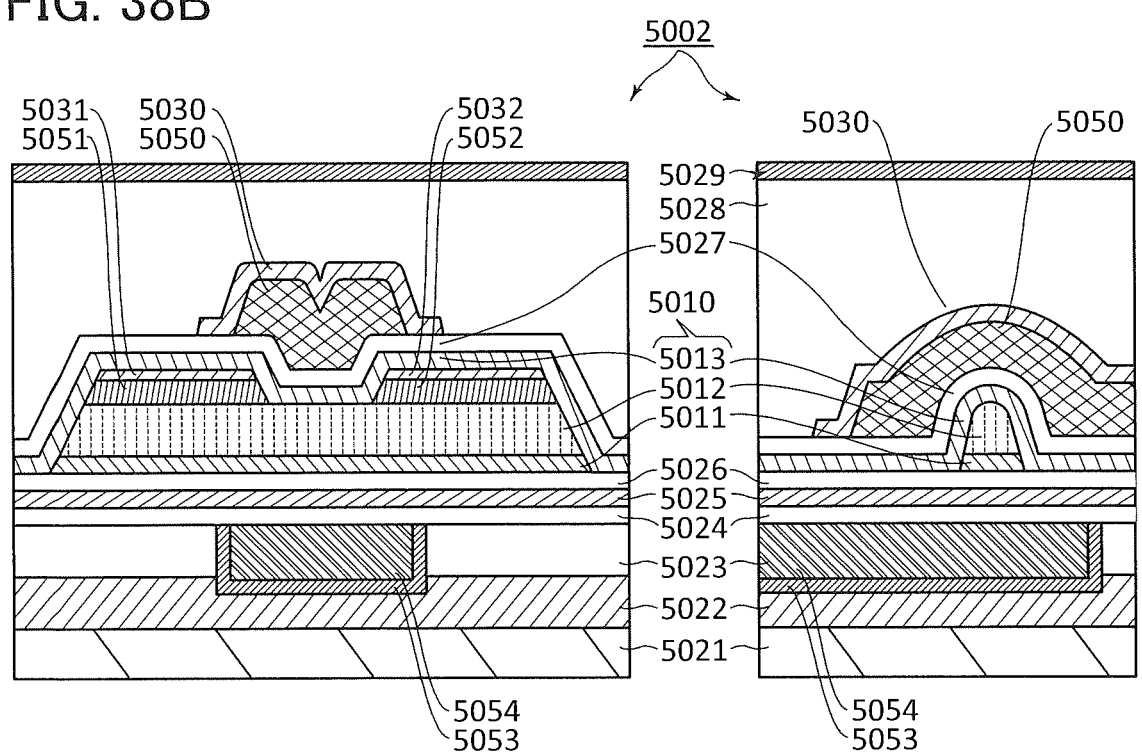

FIG. 38B illustrates a structural example of an OS transistor. The OS transistor 5002 in FIG. 38B is a modification example of the OS transistor 5001. A cross-sectional view of the OS transistor 5002 in the channel length direction is illustrated on the left side of FIG. 38B, and a cross-sectional view of the OS transistor 5002 in the channel width direction is illustrated on the right side of FIG. 38B.

In the OS transistor 5002, upper and side surfaces of a stack of the metal oxide layers 5011 and 5012 are covered with a stack of the metal oxide layer 5013 and the insulating layer 5027. Therefore, the insulating layers 5031 and 5032 are not necessarily provided in the OS transistor 5002.

OS Transistor Structural Example 3

Figure 39A:
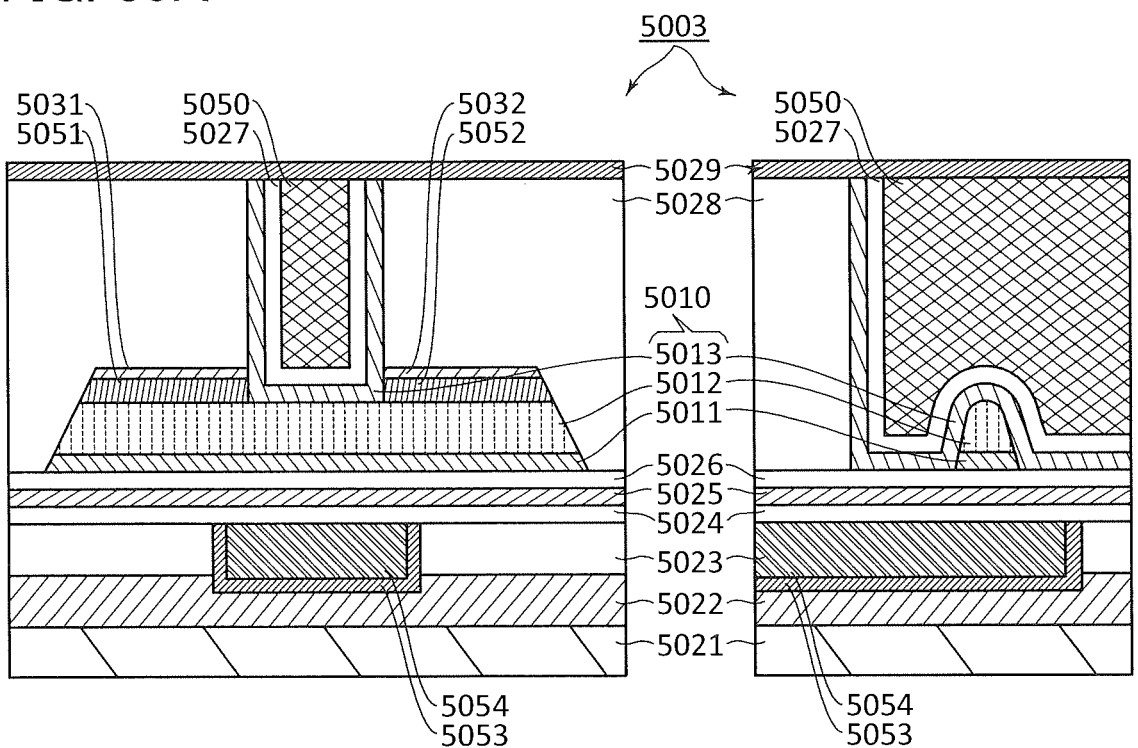
FIGS. 39A and 39B are each a cross-sectional view illustrating a structural example of an OS transistor.

FIG. 39A illustrates a structural example of an OS transistor. An OS transistor 5003 illustrated in FIG. 39A is a modification example of the OS transistor 5001 and differs therefrom mainly in the structure of the gate electrode. A cross-sectional view of the OS transistor 5003 in the channel length direction is illustrated on the left side of FIG. 39A, and a cross-sectional view of the OS transistor 5003 in the channel width direction is illustrated on the right side of FIG. 39A.

The metal oxide layer 5013, the insulating layer 5027, and the conductive layer 5050 are provided in an opening portion formed in the insulating layer 5028. In other words, a gate electrode is formed in a self-aligned manner by using the opening portion in the insulating layer 5028. Thus, in the OS transistor 5002, the gate electrode (5050) does not include a region that overlaps with the source electrode or the drain electrode (5051 or 5052) with the gate insulating layer (5017) positioned therebetween. Accordingly, gate-source parasitic capacitance and gate-drain parasitic capacitance can be reduced and frequency characteristics can be improved. Furthermore, the gate electrode width can be controlled by the opening portion in the insulating layer 5028; thus, it is easy to fabricate an OS transistor with a short channel length.

OS Transistor Structural Example 4

Figure 39B:
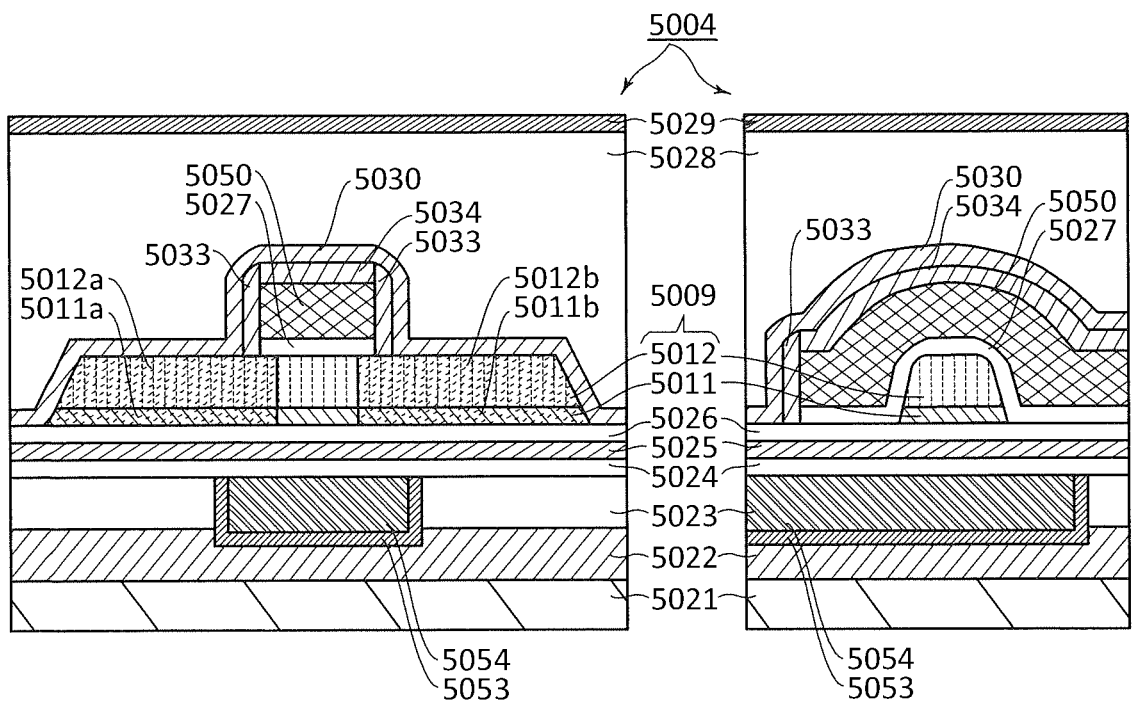

The OS transistor 5004 in FIG. 39B is different from the OS transistor 5001 in the structures of the gate electrode and the oxide layer.

The gate electrode (5050) of the OS transistor 5004 is covered with insulating layers 5033 and 5034.

The OS transistor 5004 includes an oxide layer 5009 formed of the metal oxide layers 5011 and 5012. Instead of the conductive layers 5051 and 5052, low-resistance regions 5011*a* and 5011*b* are provided in the metal oxide layer 5011, and low-resistance regions 5012*a* and 5012*b* are provided in the metal oxide layer 5012. By selectively adding impurity elements (e.g., hydrogen or nitrogen) to the oxide layer 5009, the low-resistance regions 5011*a*, 5011*b*, 5012*a*, and 5012*b* can be formed.

Adding impurity elements to the metal oxide layer causes formation of oxygen vacancies in the regions to which the impurity elements are added, and the impurity elements enter the oxygen vacancies. This increases the carrier density and thus decreases the resistance of the regions.

A channel formation region of the OS transistor preferably includes a cloud-aligned composite oxide semiconductor (CAC-OS).

The CAC-OS has a conducting function in a part of the material and has an insulating function in another part of the material; as a whole, the CAC-OS has a function of a semiconductor. In the case where the CAC-OS or a CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS includes components having different bandgaps. For example, the CAC-OS includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS is used in a channel formation region of a transistor, high current drive capability and high field-effect mobility of the OS transistor can be obtained.

A metal oxide semiconductor is classified into a single crystal metal oxide semiconductor and a non-single-crystal metal oxide semiconductor according to crystallinity. Examples of a non-single-crystal metal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and the like.

The channel formation region of the OS transistor preferably includes a metal oxide including a crystal part, such as a CAAC-OS or an nc-OS.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, a lattice arrangement is distorted so that formation of a crystal grain boundary is inhibited. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS is a metal oxide semiconductor having a structure between those of the nc-OS and the amorphous metal oxide semiconductor. The a-like OS has a void or a low-density region. The a-like OS has low crystallinity as compared with the nc-OS and the CAAC-OS.

In this specification and the like, a CAC refers to the function or material of a metal oxide semiconductor, and a CAAC refers to the crystal structure of a metal oxide semiconductor.

Embodiment 7

In this embodiment, a display panel is described.

<<ER Panel>>

Figure 40:
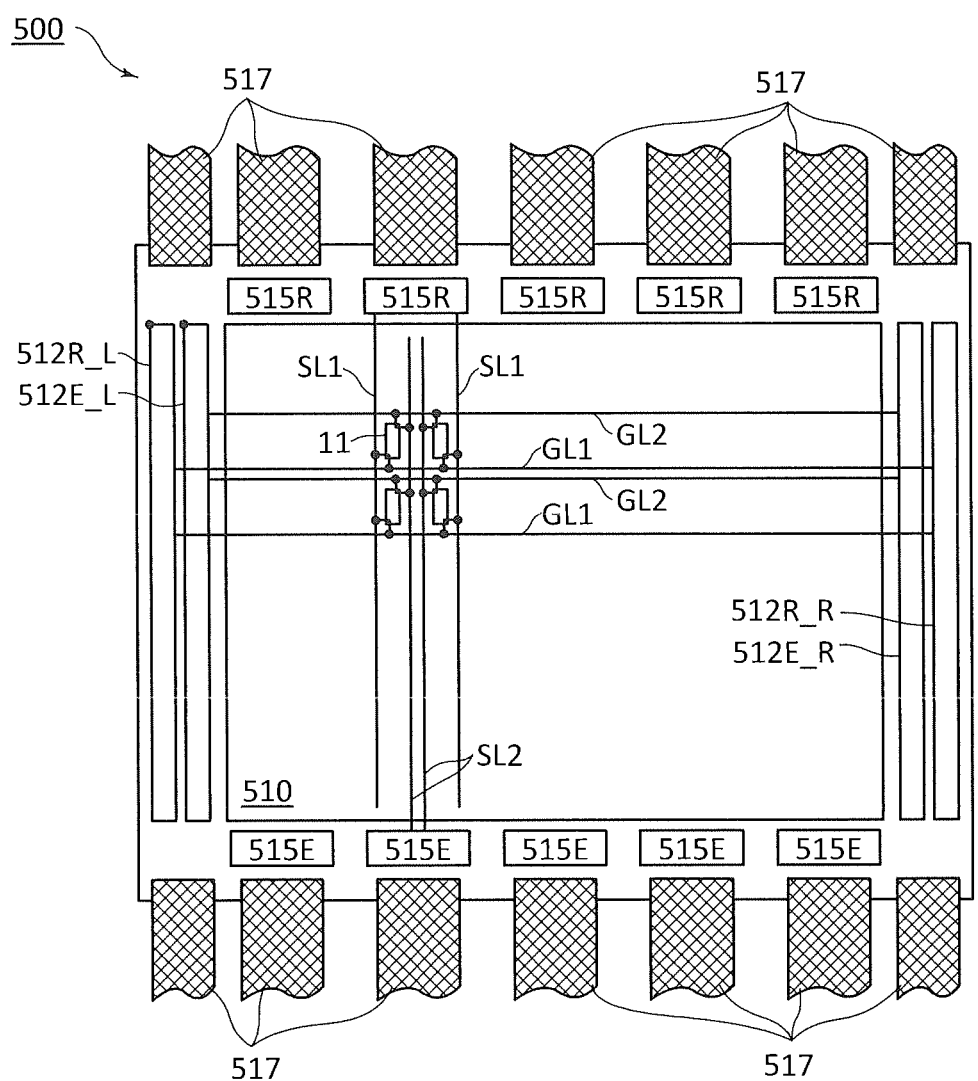
FIG. 40 illustrates a configuration example of an ER panel.

FIG. 40 illustrates a configuration example of an ER panel. An ER panel 500 shown in FIG. 40 includes a pixel array 510, gate drivers 512R_R, 512R_L, 512E_R, and 512E_L, source drivers IC515R and IC515E, and an FPC 517.

The pixel array 510 has a structure similar to that of the pixel array 111 (see FIGS. 2A and 2B). The pixel array 510 includes the plurality of subpixels 11, the plurality of gate lines GL1 and GL2, and the plurality of source lines SL1 and SL2. The transistors M1 to M3 in the subpixel 11 are OS transistors.

The gate drivers 512R_R and 512R_L drive the gate line GL1. Gate signals are input from both ends of the gate line GL1 at the same time by the gate drivers 512R_R and 512R_L. The gate drivers 512E_R and 512E_L drive the gate line GL2. Gate signals are input from both ends of the gate line GL2 at the same time by the gate drivers 512E_R and 512E_L.

For example, the gate driver 512R_R may drive the gate line GL1 in an odd-numbered row and the gate deriver 512R_L may drive the gate line GL1 in an even-numbered row. Alternatively, one of the gate drivers 512R_R and 512R_L may be provided. The gate drivers 512R_R, 512R_L, 512E_R, and 512E_L may be formed with driver ICs.

The source driver IC515R inputs a data signal to the source line SL1 and the source driver IC515E inputs a data signal to the source line SL2. Note that a source driver IC that can generate data signals for the source lines SL1 and SL2 may be used. The number of the source drivers IC515R and IC515E depends on the number of pixels in the pixel array 510. In the example of FIG. 40, the source drivers IC515R and IC515E are mounted by a chip on glass (COG) method; however, a mounting method is not limited thereto. The mounting method may be a chip on film (COF) method or the like.

In the example of FIG. 40, the gate drivers 512R_R, 512R_L, 512E_R, and 512E_L are mounted by a gate on array (GOA) method; however, the gate drivers 512R_R, 512R_L, 512E_R, and 512E_L may be formed with one or more gate driver ICs.

A timing signal and image data generated by the display controller are input to the ER panel 500 through the FPC 517. A voltage used for the ER panel 500 is input by the FPC 517.

Figure 41A:
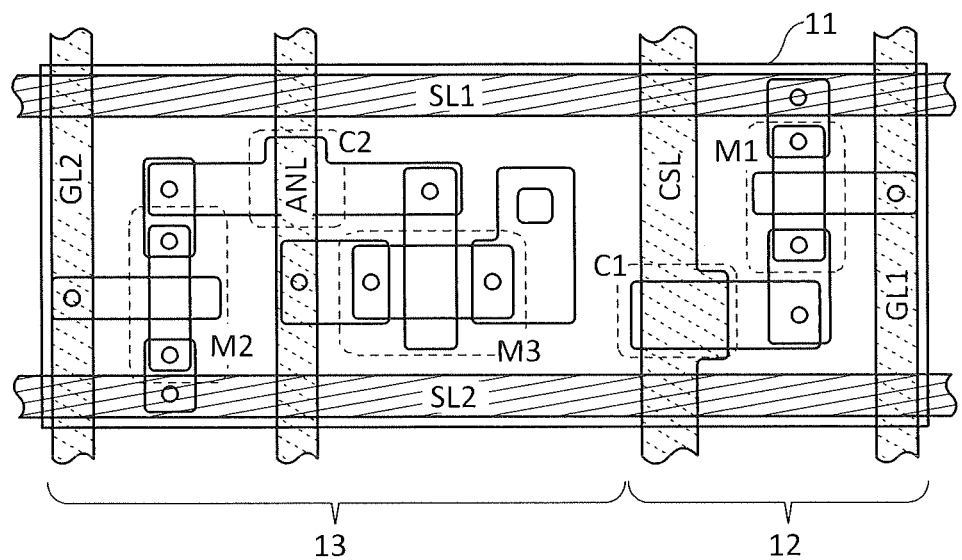
FIG. 41A is a plan view illustrating a layout example of a subpixel.

FIG. 41A illustrates a layout example of the subpixel 11. FIG. 41A shows some components formed in the transistor layer.

As described in Embodiment 1 (FIG. 3A), light for the LC element RE1 passes through the transistor layer twice, and light from the EL element EE1 passes through the transistor layer once. To increase the light extraction efficiencies of the LC element RE1 and the EL element EE1, a conductive layer, a semiconductor layer, and the like that are provided in the transistor layer are formed with light-transmitting materials.

Figure 41B:
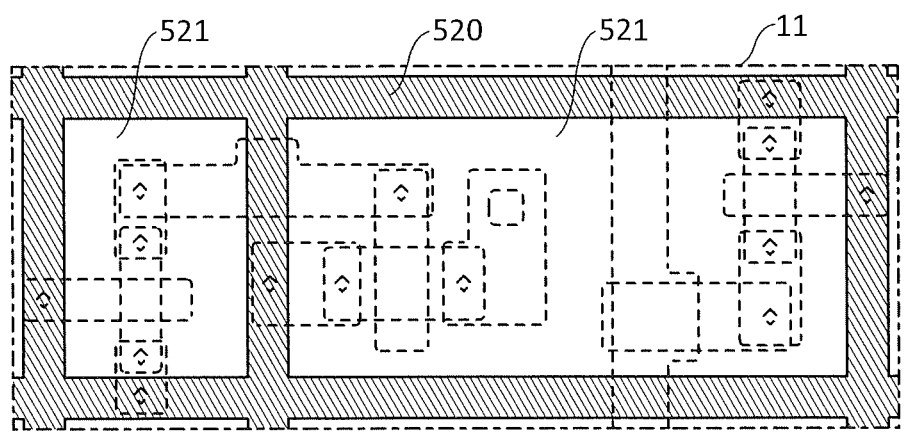
FIG. 41B illustrates a light-transmitting region and a light-blocking region of a subpixel.

FIG. 41B illustrates a light-transmitting region and a light-blocking region of the subpixel 11. The light-transmitting region transmits environmental light, light for the LC element RE1, and light from the EL element EEL The light-blocking region does not transmit these kinds of light. In FIG. 41B, a region shown by a hatching pattern is a light-blocking region 520, and the other region is a light-transmitting region 521. Thus, the higher the proportion (aperture ratio) of the light-transmitting region 521 to the area occupied by the subpixel 11 is, the higher the light extraction efficiencies of the LC element RE1 and the EL element EE1 are. As a result, effects such as a reduction in power consumption of the ER panel 500 and an improvement in display quality of the ER panel 500 can be obtained.

For example, when the conductive layer, the semiconductor layer, and the like that are provided in the transistor layer are formed with light-transmitting materials, the light-transmitting region 521 can be widened.

As a light-transmitting conductive material, a metal oxide such as indium oxide, indium tin oxide, indium zinc oxide, zinc oxide, or zinc oxide to which gallium is added can be used, for example. In particular, a conductive material with an energy gap of 2.5 eV or more is preferably used because it has high visible-light transmittance.

Since the above-described light-transmitting conductive materials are metal oxides, they have higher resistivity than a light-blocking conductive material such as copper or aluminum. To reduce signal decay, signal delay, and power consumption, the wiring resistances of bus lines such as the gate lines GL1 and GL2, the source lines SL1 and SL2, and the wirings ANL and CSL are preferably low. Thus, the bus lines are preferably formed with a light-blocking conductive material with low resistivity (such as a metal or a metal nitride). Some or all of the bus lines can be formed with a light-transmitting conductive material depending on the layouts, widths, and thicknesses of the bus lines, the area of the subpixel 11, and the like.

The conductive layers shown with the hatching patterns in FIG. 41A are formed with light-blocking conductive materials with low resistivity. The conductive layers and semiconductor layers without a hatching pattern are formed with light-transmitting materials (such as a metal oxide). When light-transmitting materials are used for the conductive layers and active layers in the subpixel 11, the aperture ratio can be, for example, 60% to 100%, or 80% to 100%.

Since the EL element EE1 and the LC element RE1 are stacked, the sum of the area of a light-emitting region in the EL element EE1 and the area of a reflection region reflecting environmental light in the LC element RE1 can be larger than or equal to the area of the subpixel 11. The light-emitting region and the reflection region are regions that contribute to image display. Thus, the aperture ratio of the subpixel 11 can be defined as the proportion of the total area of the light-emitting region and the reflection region to the area of the subpixel 11. According to this definition, the aperture ratio of the subpixel 11 can exceed 100%.

<Cross-Sectional Structure Example>

Figure 42:
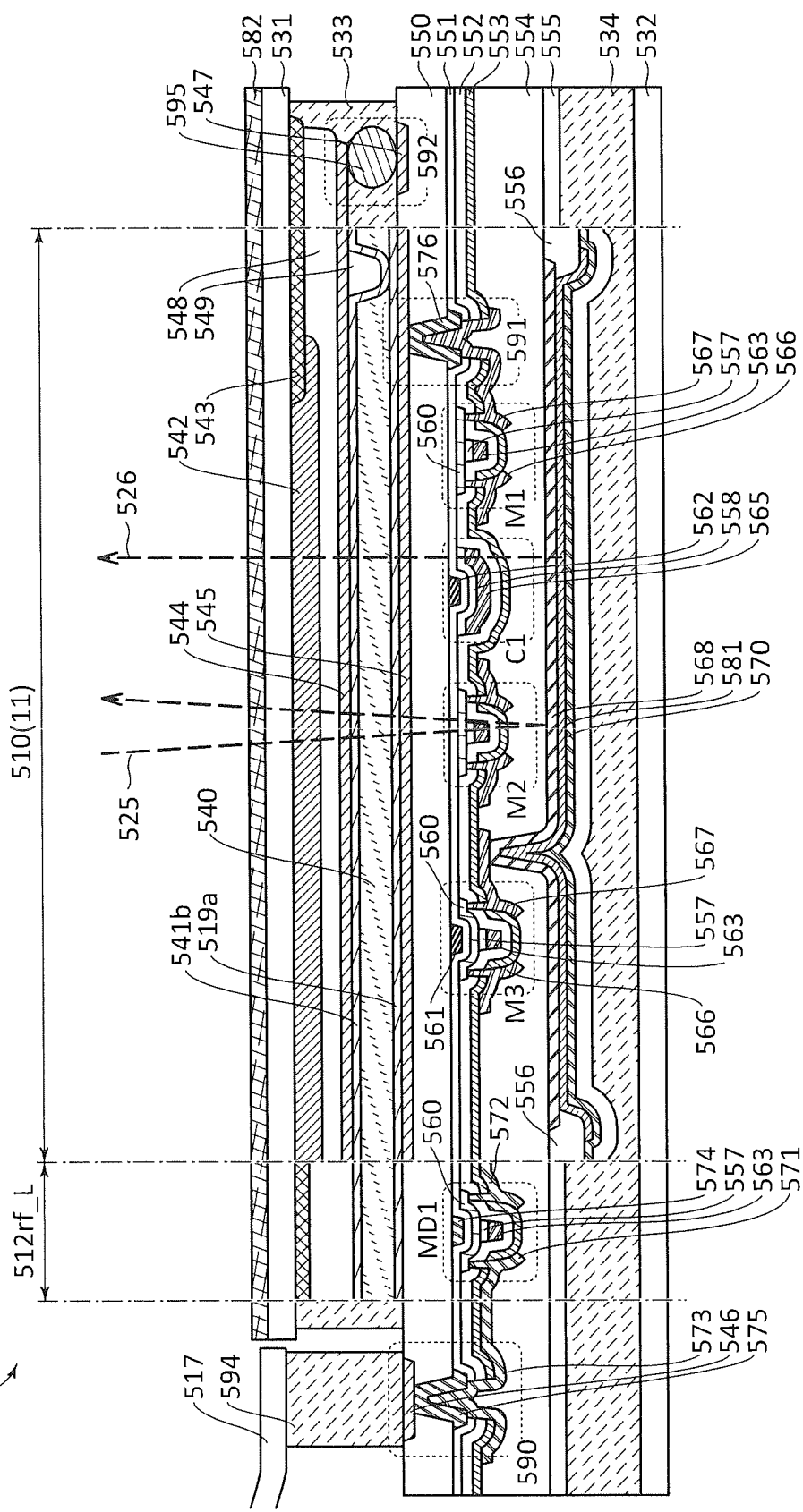
FIG. 42 illustrates an example of a cross-sectional structure of an ER panel.

FIG. 42 shows a cross-sectional structure example of the ER panel 500. The ER panel 500 includes substrates 531 and 532, an LC layer 540, conductive layers 544 to 547, insulating layers 548 to 558, a metal oxide layer 560, conductive layers 561 to 568 and 570 to 576, an EL layer 581, and the like. A plurality of layers obtained by processing the same film are shown with the same hatching pattern. Each of the layers may be a single film or a stacked-layer film.

The transistor layer including the transistors M1 to M3 and MD1, the capacitor C1, and the like is fixed to the substrates 531 and 532 with adhesive layers 533 and 534. The LC layer 540 is sealed between the substrates 531 and 532 with the adhesive layer 533. As the adhesive layers 533 and 534, a variety of curable adhesives such as a reactive curable adhesive, a thermosetting adhesive, an anaerobic adhesive, and a photo-curable adhesive such as an ultraviolet curable adhesive can be used.

An alignment film 541b, a color filter layer 542, a light-blocking layer 543, a conductive layer 544, and the insulating layers 548 and 549 are provided for the substrate 531.

As examples of a material that can be used for the color filter layer 542, a metal material, a resin material, and a resin material containing a pigment or dye can be given. Examples of a material that can be used for the light-blocking layer 543 include carbon black, titanium black, a metal, a metal oxide, and a composite oxide containing a solid solution of a plurality of metal oxides.

The insulating layer 548 functions as a planarization layer. The insulating layer 548 enables the conductive layer 544 to have an almost flat surface, resulting in a uniform thickness of the LC layer 540. The insulating layer 549 functions as a spacer for holding a cell gap of the LC element RE1. In the case where the irregular alignment in the LC layer 540 due to the insulating layer 549 affects display, the insulating layer 549 is preferably provided in the light-blocking region 520 in the subpixel 11.

An optical film 582 such as a polarizing film can be provided for a surface of the substrate 531 from which light is extracted. The optical film 582 is provided as appropriate. A functional member such as an antistatic film preventing the attachment of a foreign substance, a water repellent film suppressing the attachment of stain, a hard coat film suppressing generation of a scratch in use, or the like can be provided for the substrate 531.

The transistors M1 to M3 and MD1 and the capacitor C1 are provided over the insulating layer 550. The conductive layer 545 and an alignment film 541*a* are provided on the LC layer 540 side of the insulating layer 550. The transistor MD1 is provided in the gate driver 512R_L. Transistors having a similar structure are provided in other gate drivers.

The transistors M1 to M3 and MD1 and the capacitor C1 are covered with the insulating layers 553 and 554. The insulating layer 554 functions as a planarization layer. The insulating layer 553 functions as a barrier layer. A material through which impurities such as water or hydrogen do not easily diffuse is preferably used for at least one of the insulating layers that cover the transistor M1 and the like.

Examples of an insulating material that can be used for the insulating layers of the ER panel 500 include a resin material such as acrylic or an epoxy resin, and an inorganic insulating material such as silicon oxide, silicon oxynitride, silicon nitride oxide, silicon nitride, or aluminum oxide. An insulating material that can give an intended function or the like to a target insulating layer is selected.

The transistor M3 includes the metal oxide layer 560, the conductive layers 561 and 563 functioning as gate electrodes, the insulating layers 551 and 557 functioning as gate insulating layers, and the conductive layers 566 and 567 functioning as a source electrode and a drain electrode. The metal oxide layer 560 forms an active layer of the transistor M1, and includes a channel formation region and low-resistance regions functioning as a source region and a drain region.

Impurities are selectively added to the metal oxide layer 560, so that the low-resistance regions are formed. Examples of the impurities include phosphorus, arsenic, antimony, boron, aluminum, silicon, nitrogen, helium, neon, argon, krypton, xenon, indium, fluorine, chlorine, titanium, zinc, and carbon. As a method for adding the impurities, plasma treatment, ion implantation, ion doping, plasma immersion ion implantation, or the like can be used. The impurities are added to the metal oxide layer 560 with the conductive layer 563 used as a mask, so that the low-resistance regions can be formed in a self-aligned manner.

When the impurities are added to the metal oxide layer 560, a bond between a metal element and oxygen in the metal oxide layer 560 is cut, whereby an oxygen vacancy is formed. When hydrogen enters a region of the metal oxide layer 560 where the oxygen vacancy is formed, the hydrogen enters the oxygen vacancy site and a donor level is formed in the vicinity of the conduction band; accordingly, the conductivity in that region can be increased.

The transistors M1 and M2 have structures similar to that of the transistor M3, but do not include the insulating layer 551 (gate insulating layer) or the conductive layer 563 (gate electrode). The capacitor C1 is formed with the insulating layers 551 and 558 and the conductive layers 562 and 565. The insulating layers 557 and 558 are formed by processing the same insulating film.

The transistor MD1 includes the metal oxide layer 560, the conductive layers 563 and 574 functioning as gate electrodes, the insulating layers 551 and 557 functioning as gate insulating layers, and the conductive layers 571 and 572 functioning as a source electrode and a drain electrode. Transistors having a structure similar to that of the transistor MD1 are provided in other gate drivers. The transistor MD1, which is provided in the gate driver 512R_L, operates at a higher speed than the transistors M1 to M3. Therefore, the conductive layers 571, 572, and 574 are formed with light-blocking conductive materials (metal materials) with low resistivity. As the gate electrode of the transistor MD1, a light-blocking conductive layer with low resistivity may be provided in place of the conductive layer 563.

The EL element EE1 includes the conductive layers 568 and 570 and the EL layer 581. The conductive layer 571 functions as a light-transmitting pixel electrode, and is electrically connected to the conductive layer 567 of the transistor M3. The conductive layer 573 functions as a reflective common electrode. Here, the EL layer 581 emits light 526 of white. The light 526 passes through the color filter layer 542 to be converted into light of a display color of the subpixel 11.

The LC element RE1 includes the conductive layers 544, 545, and 570 and the LC layer 540. The conductive layer 544 functions as a light-transmitting common electrode, and the conductive layer 545 functions as a light-transmitting pixel electrode. Light 525 is transmitted through the LC layer 540, reflected by the conductive layer 570 (the common electrode of the EL element EE1), and extracted to the outside.

The FPC 517 and the source drivers IC515R and IC515E are electrically connected to a terminal portion 590. In the example of FIG. 42, the FPC 517 is electrically connected to the terminal portion 590.

A terminal for external connection is provided in the terminal portion 590. The conductive layers 546 and 575 form the terminal. A lead wiring formed in the transistor layer is electrically connected to the conductive layer 575. The lead wiring is formed with the conductive layer 573. The conductive layers 570 to 573 are obtained by processing the same conductive film. The conductive layer 546 is electrically connected to the FPC 517 through an anisotropic conductive layer 594. An anisotropic conductive paste may be used in place of the anisotropic conductive layer 594 to make conduction between the FPC 517 and the terminal.

A connection portion 591 makes connection between the transistor M1 and the pixel electrode (the conductive layer 545) of the LC element RE1. In the connection portion 591, the conductive layer 574 is provided. The conductive layer 545 and the conductive layer 567 of the transistor M1 are electrically connected to each other with the conductive layer 574.

A connection portion 592 makes connection between the common electrode (the conductive layer 544) and the lead wiring formed in the transistor layer. The connection portion 592 is also referred to as a common contact. The connection portion 592 is provided in a region of the adhesive layer 533, whereby the bezel of the ER panel 500 can be narrowed. In the connection portion 592, the conductive layer 547 functioning as a terminal is provided. The conductive layers 545 to 547 are obtained by processing the same conductive film. The conductive layer 544 is electrically connected to the lead wiring through a conductive spacer 595 and the conductive layer 547.

<<EL Panel>>

Structural examples of an EL panel will be described with reference to FIG. 43 and FIGS. 44A and 44B.

Figure 43:
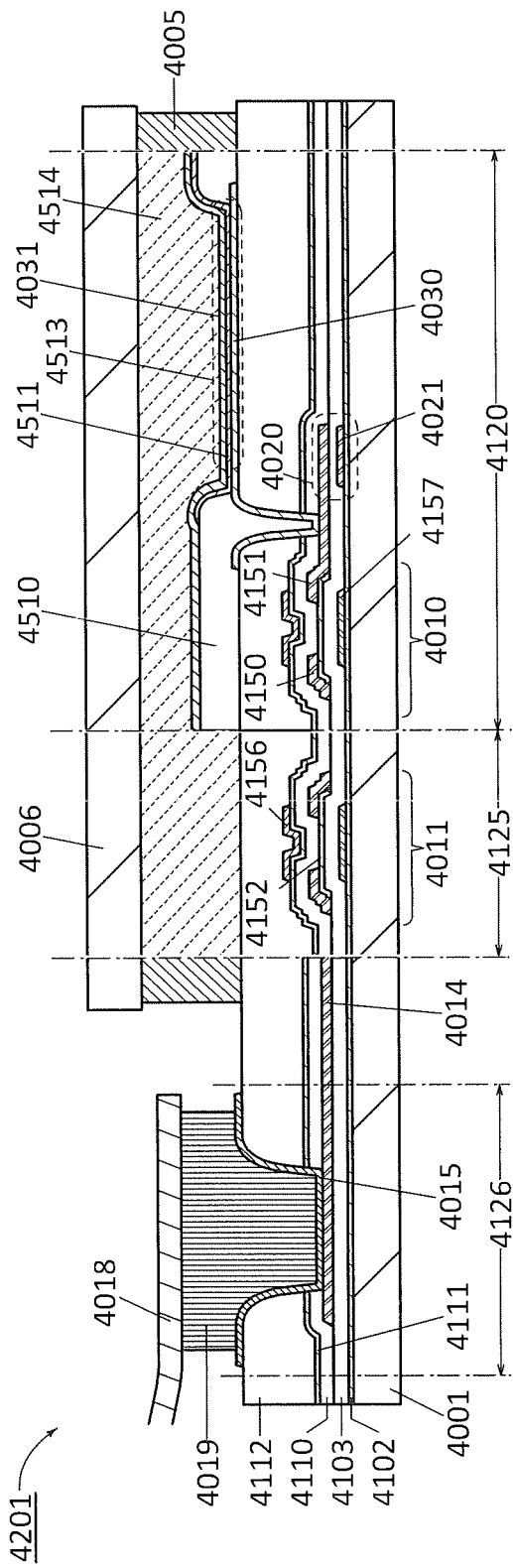
FIG. 43 is a cross-sectional view illustrating a structural example of an EL panel.

In an EL panel 4201 illustrated in FIG. 43, a substrate 4001 is a base substrate of an element substrate, and a substrate 4006 is a base substrate of a counter substrate.

The substrate 4001 is provided with a pixel array 4120, a gate driver circuit 4125, and a terminal portion 4126. In FIG. 43, a transistor 4010, a capacitor 4020, and an EL element 4513 included in the pixel array 4120 and a transistor 4011 included in the gate driver circuit 4125 are illustrated as an example. Over the substrate 4001, insulating layers 4102, 4103, 4110, 4111, and 4112 are provided.

The transistors 4010 and 4011 are provided over the insulating layer 4102. The transistors 4010 and 4011 each include conductive layers 4150 and 4151, a semiconductor layer 4152, and conductive layers 4156 and 4157. The conductive layers 4150 and 4151 form a source electrode and a drain electrode. The conductive layer 4156 forms a back gate electrode, and the conductive layer 4157 forms a gate electrode.

The capacitor 4020 includes a region where the conductive layer 4151 and a conductive layer 4021 overlap with each other with the insulating layer 4103 sandwiched therebetween.

The terminal portion 4126 is provided with conductive layers 4014 and 4015. The conductive layer 4015 is electrically connected to a terminal included in an FPC 4018 through an anisotropic conductive layer 4019. The conductive layer 4015 is electrically connected to the conductive layer 4014. The conductive layer 4014 forms a terminal, and the conductive layer 4015 forms a lead wiring.

The semiconductor layer 4152 includes a channel formation region. The semiconductor layer 4152 is, for example, a metal oxide layer or a silicon layer.

In the case where the semiconductor layer 4152 is a metal oxide layer, for example, the metal oxide layer preferably contains at least one of indium (In) and zinc (Zn). Typical examples of such a metal oxide include an In oxide, a Zn oxide, an In—Zn oxide, and an In-M-Zn oxide (the element M is Al, Ti, Ga, Y, Zr, La, Ce, Nd, or Hf).

In the case where the transistors 4010 and 4011 are OS transistors, the semiconductor layer 4152 is, for example, a metal oxide layer of one to three layers.

A conductive layer 4030 is provided over the insulating layer 4112. A partition wall 4510 is provided over the conductive layer 4030 and the insulating layer 4112. A light-emitting layer 4511 and a conductive layer 4031 are stacked over the partition wall 4510. The partition wall 4510 is formed using an organic insulating material or an inorganic insulating material. It is particularly preferable that the partition wall be formed using a photosensitive resin material to have an opening over the conductive layer 4030 so that a side surface of the opening is formed as an inclined surface with continuous curvature.

The EL element 4513 is formed of stacked layers of the conductive layer 4030, the light-emitting layer 4511, and the conductive layer 4031. The conductive layer 4030 is a pixel electrode, and the conductive layer 4031 is a common electrode. The light-emitting layer 4511 may be a single layer or stacked layers.

A protective layer may be formed over the conductive layer 4031 and the partition wall 4510 in order to prevent entry of oxygen, hydrogen, moisture, carbon dioxide, or the like into the EL element 4513. As the protective layer, a silicon nitride layer, a silicon nitride oxide layer, an aluminum oxide layer, an aluminum nitride layer, an aluminum oxynitride layer, an aluminum nitride oxide layer, a diamond like carbon (DLC) layer, or the like can be used.

The substrate 4006 is fixed to the substrate 4001 with a sealant 4005. A space sealed by the sealant 4005 between the substrate 4001 and the substrate 4006 is filled with a filler 4514. As the filler 4514, an ultraviolet curable resin or a thermosetting resin can be used as well as an inert gas such as nitrogen or argon; for example, polyvinyl chloride (PVC), acrylic, polyimide, epoxy, silicone, polyvinyl butyral (PVB), ethylene vinyl acetate (EVA), or the like can be used. A drying agent may be contained in the filler 4514. A glass material such as a glass frit, or a resin that is curable at room temperature such as a two-component-mixture-type resin, a light curable resin, a thermosetting resin, and the like can be used as the sealant 4005. A drying agent may be contained in the sealant 4005.

A color filter layer, a black matrix layer, a polarizing plate, a circularly polarizing plate (including an elliptically polarizing plate), a retardation plate (a quarter-wave plate or a half-wave plate), or the like may be provided as appropriate. These components may be provided on the substrate 4006 side if the EL panel 4201 is of a top-emission type, and provided on the substrate 4001 side if the EL panel 4201 is of a bottom-emission type.

Figure 44A:
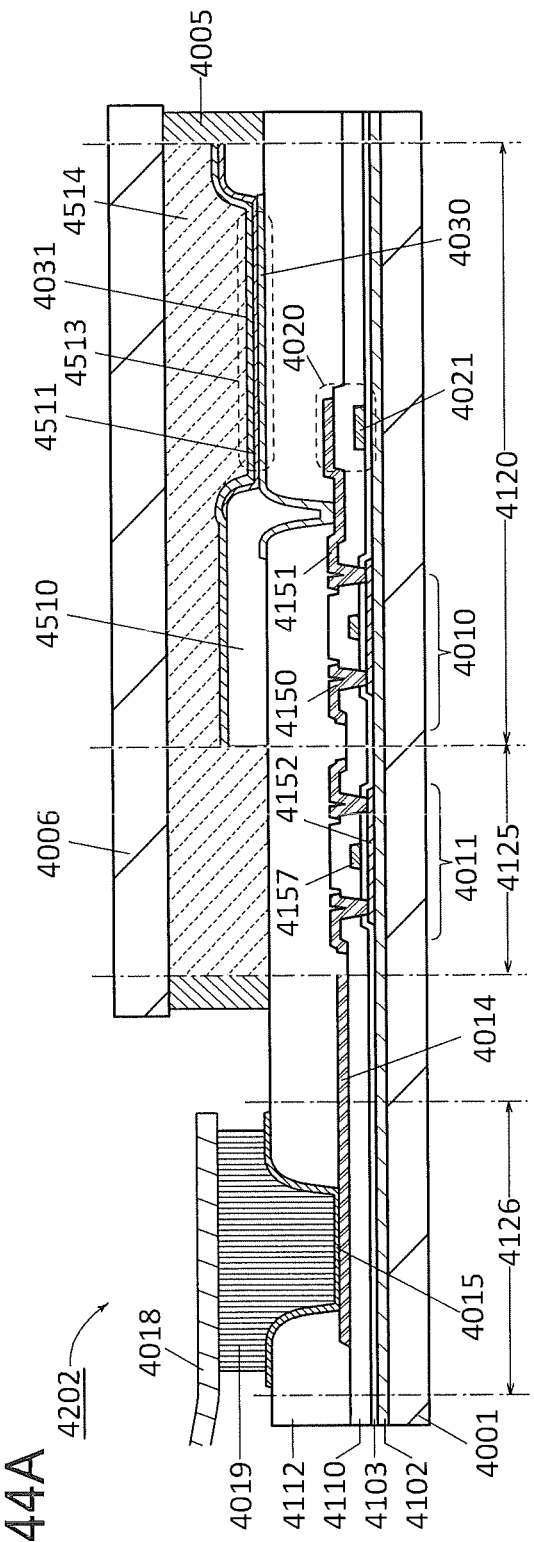
FIGS. 44A and 44B are cross-sectional views each illustrating a structural example of an EL panel.
Figure 44B:
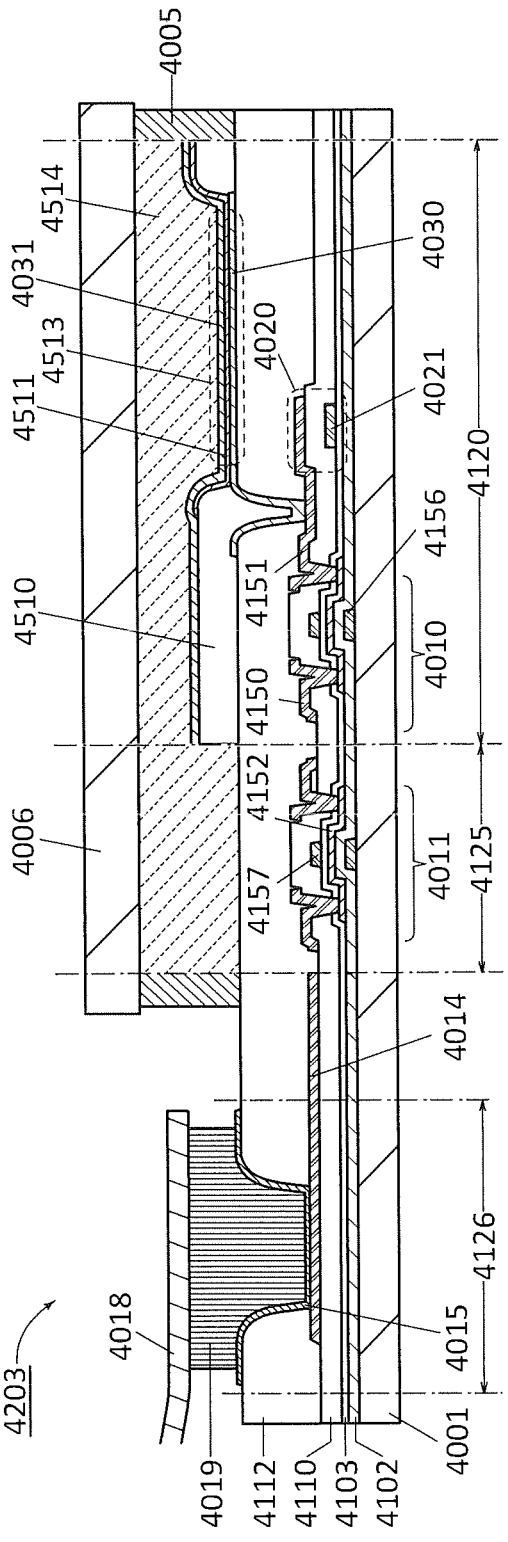

Other structural examples of the EL panel are illustrated in FIGS. 44A and 44B. An EL panel 4202 illustrated in FIG. 44A and an EL panel 4203 illustrated in FIG. 44B are different from the EL panel 4201 in transistor structure. The transistors 4010 and 4011 in the EL panel 4202 are of a top-gate type. The transistors 4010 and 4011 in the EL panel 4203 are of a top-gate type with a back gate electrode.

This application is based on Japanese Patent Application Serial No. 2017-022685 filed with Japan Patent Office on Feb. 10, 2017 and Japanese Patent Application Serial No. 2017-074759 filed with Japan Patent Office on Apr. 4, 2017, the entire contents of which are hereby incorporated by reference.

What is claimed is:

1. An operation method of a display panel, the operation method comprising:
   determining whether an image data sent from an outside being color data or grayscale data,
   making black display data as a first data and making a copy of the image data as a second data, when the image data is determined as the color data,
   making a copy of the image data as a third data and black display data as a fourth data, when the image data is determined as grayscale data, and
   sending one of a first combination of the first data and the second data and a second combination of the second data and the fourth data to a pixel array of the display panel.

2. The operation method according to claim 1,
   wherein the pixel array includes a pixel including a first subpixel including a reflective display element and a second subpixel including a light-emitting display element,
   wherein the first data and the third data are used for image display by the first subpixel, and
   wherein the second data and the fourth data are used for image display by the second subpixel.

3. The operation method according to claim 1,
   wherein the display panel includes a memory device including a memory cell,
   wherein the memory cell includes a capacitor and a transistor configured to control charge and discharge of the capacitor, and
   wherein a channel formation region of the transistor includes a metal oxide.

4. An operation method of a display panel, the operation method comprising:
   determining whether an image data sent from an outside being color data or grayscale data,
   making black display data as a first data and making a second data on the basis of data of environmental light input from the outside, when the image data is determined as the color data, making a copy of the image data as a third data and a fourth data on the basis of the data of environmental light input from the outside, when the image data is determined as grayscale data, and sending one of a first combination of the first data and the second data and a second combination of the second data and the fourth data to a pixel array of the display panel.

5. The operation method according to claim 4, wherein the pixel array includes a pixel including a first subpixel including a reflective display element and a second subpixel including a light-emitting display element, wherein the first data and the third data are used for image display by the first subpixel, and wherein the second data and the fourth data are used for image display by the second subpixel.

6. The operation method according to claim 4, wherein the display panel includes a memory device including a memory cell, wherein the memory cell includes a capacitor and a transistor configured to control charge and discharge of the capacitor, and wherein a channel formation region of the transistor includes a metal oxide.

\* \* \* \* \*